United States Patent
Baek et al.

(10) Patent No.: US 12,256,633 B2
(45) Date of Patent: Mar. 18, 2025

(54) ORGANIC ELECTROLUMINESCENCE DEVICE AND FUSED POLYCYCLIC COMPOUND FOR ORGANIC ELECTROLUMINESCENCE DEVICE

(71) Applicant: Samsung Display Co., Ltd., Yongin-si (KR)

(72) Inventors: Jang Yeol Baek, Yongin-si (KR); Soo-Byung Ko, Yongin-si (KR); Junha Park, Gwacheon-si (KR); Hankyu Pak, Suwon-si (KR); Mun-Ki Sim, Seoul (KR); Chanseok Oh, Seoul (KR); Hyoyoung Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 670 days.

(21) Appl. No.: 16/866,785

(22) Filed: May 5, 2020

(65) Prior Publication Data

US 2020/0381634 A1  Dec. 3, 2020

(30) Foreign Application Priority Data

Jun. 3, 2019 (KR) .................. 10-2019-0065164

(51) Int. Cl.
*H10K 85/40* (2023.01)
*C07F 7/08* (2006.01)
(Continued)

(52) U.S. Cl.
CPC .......... *H10K 85/40* (2023.02); *C07F 7/0816* (2013.01); *C09K 11/06* (2013.01);
(Continued)

(58) Field of Classification Search
None
See application file for complete search history.

(56) References Cited

U.S. PATENT DOCUMENTS 5,645,948 A  7/1997 Shi et al.
8,436,344 B2  5/2013 Seo et al.
(Continued)

FOREIGN PATENT DOCUMENTS

CN  107501311 A  12/2017
CN  107619418 A  1/2018
(Continued)

OTHER PUBLICATIONS

C.W. Tang, et al., "Organic electroluminescent diodes," Applied Physics Letter, vol. 51, No. 12, 913-915, Sep. 21, 1987.
(Continued)

*Primary Examiner* — Jeffrey D Washville
(74) *Attorney, Agent, or Firm* — Lewis Roca Rothgerber Christie LLP

(57) ABSTRACT

An organic electroluminescence device of an embodiment includes oppositely disposed first electrode and second electrode, and a plurality of organic layers disposed between the first electrode and the second electrode, wherein at least
(Continued)

one from among the organic layers includes a fused polycyclic compound represented by Formula 1 below, thereby showing improved emission efficiency.

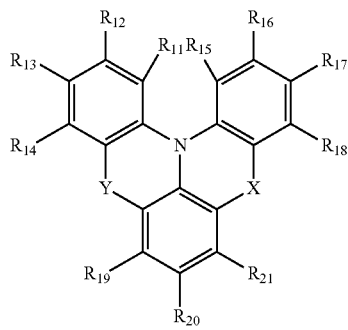

[Formula 1]

20 Claims, 2 Drawing Sheets

(51) Int. Cl.
    C09K 11/06 (2006.01)
    H10K 50/11 (2023.01)
    H10K 101/10 (2023.01)
(52) U.S. Cl.
    CPC ...... C09K 2211/1007 (2013.01); H10K 50/11 (2023.02); H10K 2101/10 (2023.02)

(56) References Cited

U.S. PATENT DOCUMENTS

| | | | |
|---|---|---|---|
| 9,065,060 | B2 | 6/2015 | Hong et al. |
| 9,502,672 | B2 | 11/2016 | Lin et al. |
| 9,708,262 | B2 | 7/2017 | Parham et al. |
| 10,333,085 | B2 | 6/2019 | Nakano et al. |
| 10,374,166 | B2 | 8/2019 | Hatakeyama et al. |
| 11,845,768 | B2 | 12/2023 | Hong et al. |
| 2004/0053069 | A1 | 3/2004 | Sotoyama et al. |
| 2015/0236274 | A1 | 8/2015 | Hatakeyama et al. |
| 2017/0018710 | A1 | 1/2017 | Mujica-Fernaud et al. |
| 2018/0069182 | A1 | 3/2018 | Takuji |
| 2018/0094000 | A1 | 4/2018 | Hatakeyama et al. |
| 2018/0097181 | A1 | 4/2018 | Fuchiwaki |
| 2018/0114907 | A1 | 4/2018 | Takada et al. |
| 2018/0148462 | A1 | 5/2018 | Fuchiwaki |
| 2018/0301629 | A1 | 10/2018 | Hatakeyama et al. |
| 2018/0331290 | A1 | 11/2018 | Miyake et al. |
| 2019/0058124 | A1 | 2/2019 | Hatakeyama et al. |
| 2019/0207112 | A1 | 7/2019 | Hatakeyama et al. |
| 2019/0256538 | A1 | 8/2019 | Hatakeyama et al. |
| 2020/0013961 | A1 | 1/2020 | Kim et al. |
| 2020/0058885 | A1 | 2/2020 | Hong et al. |
| 2020/0203651 | A1 | 6/2020 | Duan et al. |
| 2020/0203652 | A1 | 6/2020 | Duan et al. |
| 2020/0223873 | A1 | 7/2020 | Thobes et al. |
| 2020/0231604 | A1 | 7/2020 | Joly |
| 2020/0411771 | A1 | 12/2020 | Joo |
| 2022/0017545 | A1* | 1/2022 | Han ............ H10K 85/657 |
| 2023/0092585 | A1* | 3/2023 | Kim ............ H10K 85/615 257/40 |

FOREIGN PATENT DOCUMENTS

| | | |
|---|---|---|
| CN | 109411634 B | 12/2019 |
| CN | 111574544 A | 8/2020 |
| CN | 112585145 A | 3/2021 |
| CN | 113227108 A | 8/2021 |
| JP | 3915256 B2 | 5/2007 |
| JP | 4060669 B2 | 3/2008 |
| JP | 2012-234873 A | 11/2012 |
| JP | 5724588 B2 | 5/2015 |
| JP | 5935199 B2 | 6/2016 |
| JP | 2016-219487 A | 12/2016 |
| JP | 6526793 B2 | 6/2019 |
| JP | 6703149 B2 | 6/2020 |
| KR | 10-0525408 B1 | 11/2005 |
| KR | 10-2006-0051622 A | 5/2006 |
| KR | 10-2010-0048447 A | 5/2010 |
| KR | 10-2012-0129922 A | 11/2012 |
| KR | 10-1233379 B1 | 2/2013 |
| KR | 10-2013-0058027 A | 6/2013 |
| KR | 10-2013-0143494 A | 12/2013 |
| KR | 10-2014-0015202 A | 2/2014 |
| KR | 10-1546215 B1 | 8/2015 |
| KR | 10-2016-0073914 A | 6/2016 |
| KR | 10-2016-0082067 A | 7/2016 |
| KR | 10-2016-0119683 A | 10/2016 |
| KR | 10-2017-0096039 A | 8/2017 |
| KR | 10-2017-0122296 A | 11/2017 |
| KR | 10-2017-0130435 A | 11/2017 |
| KR | 10-1854886 B1 | 5/2018 |
| KR | 10-2018-0062561 A | 6/2018 |
| KR | 10-1868505 B1 | 6/2018 |
| KR | 10-2018-0108604 A | 10/2018 |
| KR | 10-2053324 B1 | 12/2019 |
| WO | WO 2010/050778 A1 | 5/2010 |
| WO | WO 2012/099376 A2 | 7/2012 |
| WO | WO 2015/102118 A1 | 7/2015 |
| WO | WO 2015/131976 A1 | 9/2015 |
| WO | WO 2016/152418 A1 | 9/2016 |
| WO | WO 2016/152544 A1 | 9/2016 |
| WO | WO 2017/188111 A1 | 11/2017 |
| WO | WO 2018/020366 A1 | 2/2018 |
| WO | WO 2018/047639 A1 | 3/2018 |
| WO | 2018/186670 A1 | 10/2018 |
| WO | 2018/203666 A1 | 11/2018 |
| WO | 2019/052939 A1 | 3/2019 |
| WO | WO 2019/198698 A1 | 10/2019 |
| WO | 2020/135790 A1 | 7/2020 |
| WO | WO 2020/151499 A1 | 7/2020 |

OTHER PUBLICATIONS

Chihaya Adachi, et al., "Confinement of charge carriers and molecular excitons within 5-nm-thick emitter layer in organic electroluminescent devices with a double heterostructure," Applied Physics Letter, 57 (6), 531-533, Aug. 6, 1990.
H. Murata, et al., "Non-dispersive and air-stable electron transport in an amorphous organic semiconductor," Chemical Physics Letters 339, 161-166, May 11, 2001.
Youichi Sakamoto, et al., "Synthesis, Characterization, and Electron-Transport Property of Perfluorinated Phenylene Dendrimers," J. Am. Chem. Soc. vol. 122, No. 8, 1832-1833, (2000).
Machine English translation of WO 2020/151499 (Jul. 2020).
U.S. Office Action dated Feb. 15, 2023, issued in U.S. Appl. No. 16/810,626 (21 pages).
U.S. Final Office Action dated Oct. 26, 2022, issued in U.S. Appl. No. 16/553,787 (24 pages).
Takashi Karatsu et al. "Blue electroluminescence of silyl substituted anthracene derivatives", Org. Electronics 2007, vol. 8, p. 357-366 (Year: 2007).
Jae-Wook Kang et al. "Si lane- and triazine-containing hole and exciton blocking material for high-efficiency phosphorescent organic light emitting diodes", J. Mater. Chem. 2007, vol. 17, p. 3714-3719 (Year: 2007).
Ming-Han Tsai et al. "Highly Efficient Organic Blue Electrophosphorescent Devices Based on 3,6-Bis(triphenylsilyl)carbazole as the Host Material", Adv. Mater. 2006, vol. 18, p. 1216-1220 (Year: 2006).
U.S. Restriction Requirement dated Mar. 4, 2022, issued in U.S. Appl. No. 16/553,787 (7 pages).

(56) References Cited

OTHER PUBLICATIONS

U.S. Office Action dated May 27, 2022, issued in U.S. Appl. No. 16/553,787 (40 pages).
Takuji Hatakeyama et al. "Ultrapure Blue Thermally Activated Delayed Fluorescence Molecules: Efficient HOMO-LU MO Separation by the Multiple Resonance Effect", Adv. Mater. 2016, vol. 28, p. 2777-2781 (Year: 2016).
U.S. Final Office Action dated Jul. 25, 2023, issued in U.S. Appl. No. 16/810,626 (16 pages).
U.S. Office Action dated Aug. 16, 2023, issued in U.S. Appl. No. 16/553,787 (45 pages).
US Office Action dated Apr. 29, 2024, issued in U.S. Appl. No. 16/810,626 (15 pages).
English translation of JP 2016/219487 A, Mayuka Kabasawa, Dec. 22, 2016 (Year: 2016).
English translation of JP 2012/234873 A, Mayuka Hikime, Nov. 29, 2012 (Year: 2012).
Soichiro Nakatsuka et al., "Divergent Synthesis of Heteroatom-Centered 4,8, 12-Triazatriangulenes," Angew. Chem. Int. Ed. 2017, vol. 56, p. 5087-5090 (Year: 2017).
Chinese Office action dated Nov. 16, 2023 issued in Chinese Patent Application No. 202010116120.3, 7 pages.
US Final Office Action dated Jan. 18, 2024, issued in U.S. Appl. No. 16/553,787 (40 pages).
US Office Action dated Jun. 17, 2024, issued in U.S. Appl. No. 16/553,787 (39 pages).
Kohei Matsui et al., "One-Shot Multiple Borylation toward BN-Doped Nanographenes", Journal of the American Chemical Society, 2018, 4 pages, vol. 140.
Tadashi Nozaki et al., "Synthesis of Mononitro-, Monoamino- and Monohalo-p-terphenyls, and their Solubility and Specific Gravity", Nitro-, Amino- and Halo-p-terphenyls, Nov. 1962, pp. 1783-1787, vol. 35, No. 11.
Joan Simo Padial et al., "Stabilization of 2,6-Diarylanilinum Cation by Through-Space Cation-$\pi$ Interactions", The Journal of Organic Chemistry, Aug. 24, 2017, pp. 9418-9424, vol. 82.
In Seob Parket al., "High-Performance Dibenzoheteraborin-Based Thermally Activated Delayed Fluorescence Emitters: Molecular Architectonics for Concurrently Achieving Narrowband Emission and Efficient Triplet-Singlet Spin Conversion", Advanced Functional Materials, Jun. 2018, pp. 1-12, vol. 28, 1802031.
Chinese Office Action dated Jan. 7, 2025, issued in corresponding Chinese Patent Application No. 202010445865.4 (10 pages).

\* cited by examiner

ORGANIC ELECTROLUMINESCENCE DEVICE AND FUSED POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2019-00651641, filed on Jun. 3, 2019, the entire content of which is hereby incorporated by reference.

BACKGROUND

1. Field

The present disclosure herein relates to an organic electroluminescence device and a fused polycyclic compound utilized therein, and more particularly, to a fused polycyclic compound utilized as a light-emitting material and an organic electroluminescence device including the same.

2. Description of the Related Art

Recently, the development of an organic electroluminescence display device as an image display device is being actively conducted. Different from a liquid crystal display device, the organic electroluminescence display device is a so-called self-luminescent display device in which holes and electrons injected from a first electrode and a second electrode recombine in an emission layer, and a light-emitting material (including an organic compound) in the emission layer emits light to attain a display (e.g., an image).

In the application of an organic electroluminescence device to a display device, the decrease of the driving voltage, and the increase of the emission efficiency and the life (e.g., lifespan) of the organic electroluminescence device are required, and developments on materials for an organic electroluminescence device stably attaining (e.g., meeting) the requirements are being continuously pursued.

Particularly, recently, in order to accomplish an organic electroluminescence device with high efficiency, techniques on phosphorescence emission (which utilizes energy in a triplet state) or delayed fluorescence emission (which utilizes the phenomenon of singlet exciton generation by the collision of triplet excitons (triplet-triplet annihilation, TTA)) are being developed, and development on a material for thermally activated delayed fluorescence (TADF) utilizing delayed fluorescence phenomenon is being conducted.

SUMMARY

An aspect according to embodiments of the present disclosure is directed toward providing an organic electroluminescence device having improved emission efficiency.

Another aspect according to embodiments of the present disclosure is directed toward providing a fused polycyclic compound capable of improving the emission efficiency of an organic electroluminescence device.

According to an embodiment of the inventive concept, an organic electroluminescence device includes a first electrode; a second electrode opposite to the first electrode; and a plurality of organic layers between the first electrode and the second electrode, wherein at least one organic layer from among the plurality of organic layers includes a fused polycyclic compound represented by the following Formula 1. And the first electrode and the second electrode are each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, or a compound of two or more selected from them, a mixture of two or more selected from them, or oxides thereof.

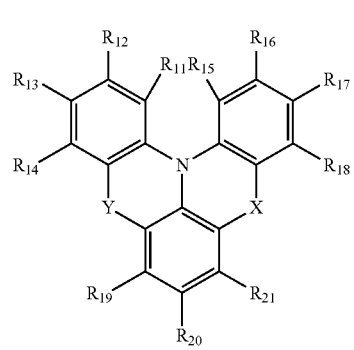

Formula 1

In Formula 1, one selected from X and Y is $BR_a$ or $P(=O)R_b$, and an other one selected from X and Y is $SiR_cR_d$, and $R_a$ to $R_d$ are each independently a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_a$ to $R_d$ may (optionally) be combined with an adjacent group to form a ring. $R_{11}$ to $R_{21}$ are each independently a hydrogen atom, a deuterium atom, a halogen atom, a boron group, a phosphine oxide group, a cyano group, a substituted or unsubstituted amine group, a substituted or unsubstituted silyl group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{11}$ to $R_{21}$ may (optionally) be combined with an adjacent group to form a ring.

In an embodiment, the plurality of organic layers may include a hole transport region on the first electrode; an emission layer on the hole transport region; and an electron transport region on the emission layer, and the emission layer may include the fused polycyclic compound represented by Formula 1.

In an embodiment, the emission layer may be to emit delayed fluorescence.

In an embodiment, the emission layer may be a delayed fluorescence emission layer including a host and a dopant, and the dopant may include the fused polycyclic compound represented by Formula 1.

In an embodiment, the emission layer may include a host having a first lowest triplet excitation energy level; a first dopant having a second lowest triplet excitation energy level lower than the first lowest triplet excitation energy level; and a second dopant having a third lowest triplet excitation energy level lower than the second lowest triplet excitation energy level, and the first dopant may include the fused polycyclic compound represented by Formula 1.

In an embodiment, the first dopant may be a delayed fluorescence dopant, and the second dopant may be a fluorescence dopant.

In an embodiment, the fused polycyclic compound represented by Formula 1 may be represented by any one from among the following Formula 1-1 to Formula 1-3:

Formula 1-1

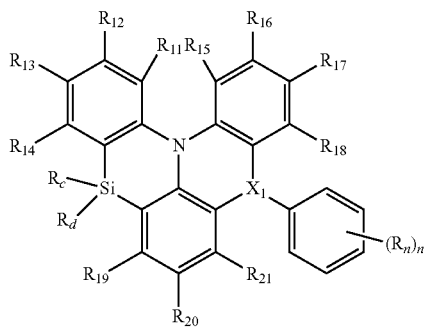

Formula 1-2

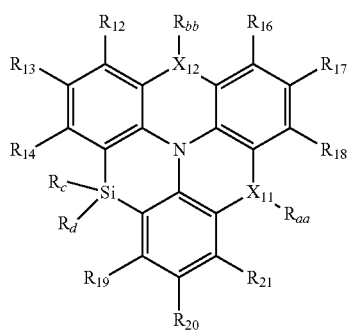

Formula 1-3

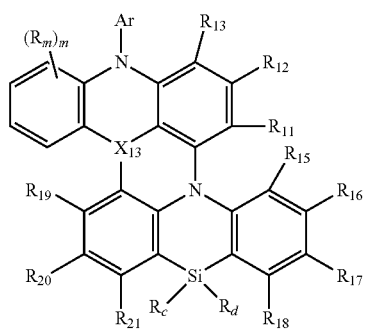

In Formula 1-1 to Formula 1-3, $R_1$ to $R_{21}$, $R_c$, and $R_d$ are the same as respectively defined in connection with Formula 1, and $X_1$, $X_{11}$, $X_{12}$, and $X_{13}$ are each independently B or P(=O). $R_n$ and $R_m$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_n$ and $R_m$ may (optionally) be combined with an adjacent group to form a ring, n is an integer of 0 to 5, and m is an integer of 0 to 4. $R_{aa}$ and $R_{bb}$ are each independently a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{aa}$ and $R_{bb}$ may (optionally) be combined with an adjacent group to form a ring, and Ar is a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring.

In an embodiment, $X_1$ in Formula 1-1 may be P(=O), and n may be 0.

In an embodiment, $X_{11}$ and $X_{12}$ in Formula 1-2 may be the same.

In an embodiment, in Formula 1-2, in case where $X_{11}$ and $X_{12}$ are each B, $R_{aa}$ and $R_{bb}$ may each independently be a substituted or unsubstituted phenyl group, and in case where $X_{11}$ and $X_{12}$ are each P(=O), $R_{aa}$ and $R_{bb}$ may each independently be an unsubstituted phenyl group.

In an embodiment, $R_c$ and $R_d$ may each independently be an unsubstituted phenyl group.

According to an embodiment of the inventive concept, a fused polycyclic compound represented by Formula 1 above is provided.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
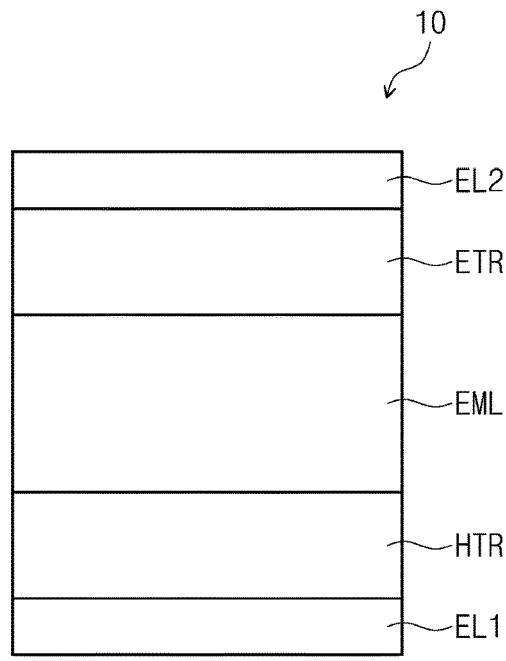
FIG. 1 is a cross-sectional view schematically illustrating an organic electroluminescence device according to an embodiment of the inventive concept.

The inventive concept may have various suitable modifications and may be embodied in different forms, and example embodiments will be explained in more detail with reference to the accompany drawings. The inventive concept may, however, be embodied in different forms and should not be construed as limited to the embodiments set forth herein. Rather, all modifications, equivalents, and substituents which are included in the spirit and technical scope of the inventive concept should be included in the inventive concept.

It will be understood that when an element is referred to as being "on", "connected to" or "coupled to" another element, it can be directly on, connected or coupled to the other element or intervening elements may be present.

Like reference numerals refer to like elements throughout. In addition, in the drawings, the thickness, the ratio, and the dimensions of constituent elements are exaggerated for effective explanation of technical contents.

The term "and/or" includes one or more combinations which may be defined by relevant elements.

It will be understood that, although the terms first, second, etc., may be used herein to describe various elements, these elements should not be limited by these terms. These terms are only used to distinguish one element from another element. Thus, a first element could be termed a second element without departing from the teachings of the present disclosure. Similarly, a second element could be termed a first element. As used herein, the singular forms are intended to include the plural forms as well, unless the context clearly indicates otherwise.

In addition, the terms "below", "beneath", "on" and "above" are used for explaining the relation of elements shown in the drawings. The terms are relative concepts and are explained on the basis of the direction shown in the drawings.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprise" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

Hereinafter, the organic electroluminescence device according to an embodiment of the inventive concept will be explained in more detail with reference to the attached drawings.

FIGS. 1 to 4 are cross-sectional views schematically showing organic electroluminescence devices according to exemplary embodiments of the inventive concept. Referring to FIGS. 1 to 4, in an organic electroluminescence device 10 according to an embodiment, a first electrode EL1 and a second electrode EL2 are oppositely disposed, and between the first electrode EL1 and the second electrode EL2, a plurality of organic layers may be disposed. The plurality of the organic layers may include a hole transport region HTR, an emission layer EML and an electron transport region ETR. That is, the organic electroluminescence device 10 of an embodiment may include a first electrode EL1, a hole transport region HTR, an emission layer EML, an electron transport region ETR, and a second electrode, laminated one by one (e.g., in the stated order). On the second electrode EL2, a capping layer CPL may be further disposed.

The organic electroluminescence device 10 of an embodiment may include a fused polycyclic compound of an embodiment, which will be explained in more detail later, in at least one organic layer from among the plurality of the organic layers disposed between the first electrode EL1 and the second electrode EL2. For example, the organic electroluminescence device 10 of an embodiment may include a fused polycyclic compound of an embodiment, which will be explained in more detail later, in the emission layer EML disposed between the first electrode EL1 and the second electrode EL2. However, an embodiment of the inventive concept is not limited thereto, and the organic electroluminescence device 10 of an embodiment may include a fused polycyclic compound of an embodiment, which will be explained in more detail later, in at least one organic layer included in the hole transport region HTR and the electron transport region ETR, which are from among the plurality of the organic layers disposed between the first electrode EL1 and the second electrode EL2 in addition to the emission layer EML, or include a fused polycyclic compound of an embodiment, which will be explained in more detail later, in the capping layer CPL disposed on the second electrode EL2.

Figure 2:
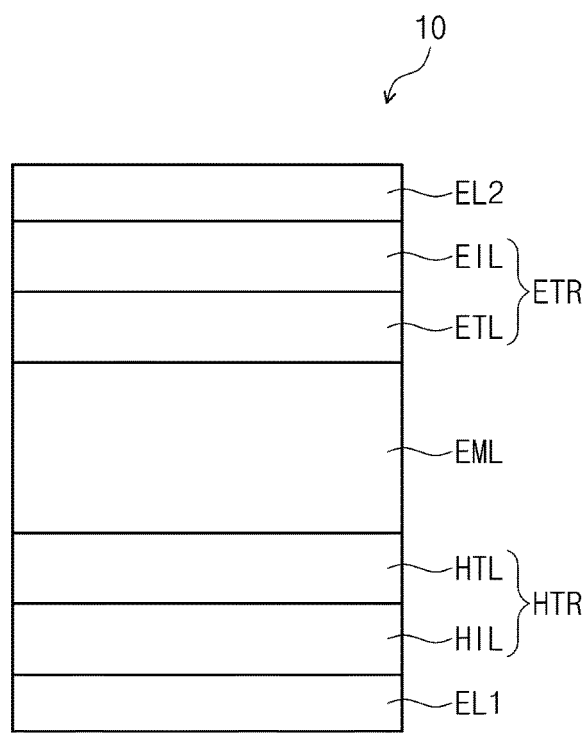
FIG. 2 is a cross-sectional view schematically illustrating an organic electroluminescence device according to an embodiment of the inventive concept.
Figure 3:
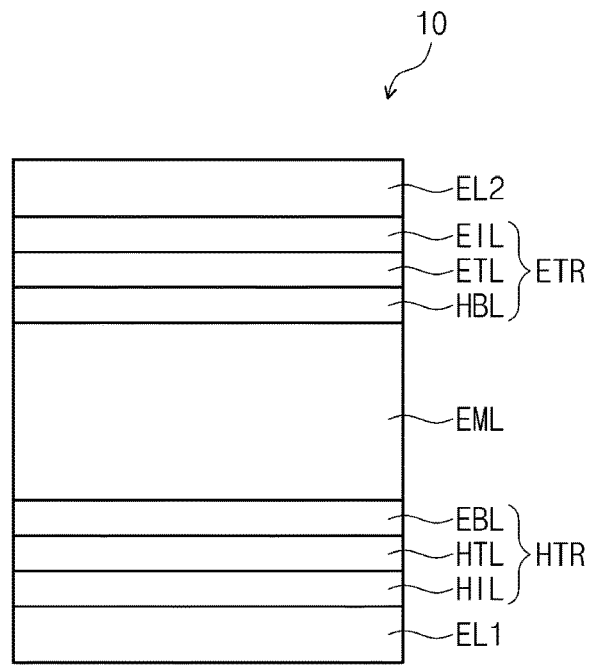
FIG. 3 is a cross-sectional view schematically illustrating an organic electroluminescence device according to an embodiment of the inventive concept.
Figure 4:
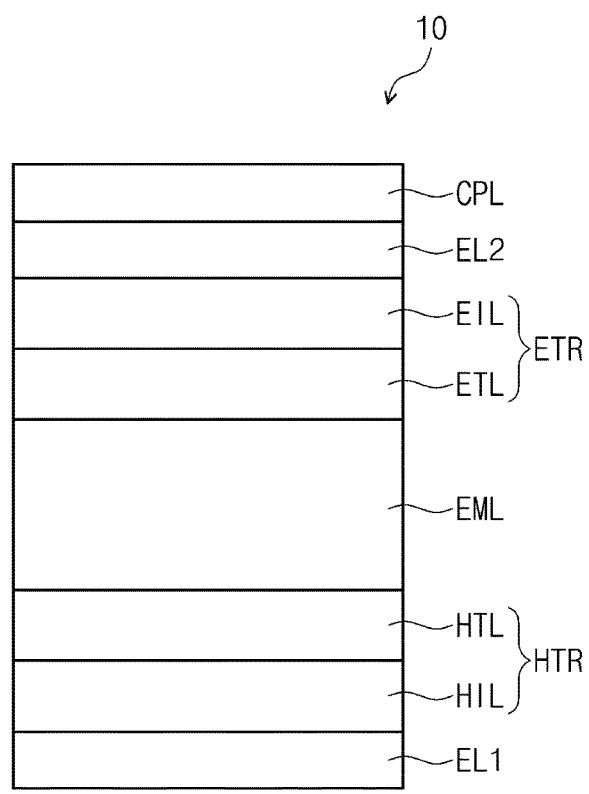
FIG. 4 is a cross-sectional view schematically illustrating an organic electroluminescence device according to an embodiment of the inventive concept.

Meanwhile, when compared with FIG. 1, FIG. 2 shows the cross-sectional view of an organic electroluminescence device 10 of an embodiment, wherein a hole transport region HTR includes a hole injection layer HIL and a hole transport layer HTL, and an electron transport region ETR includes an electron injection layer EIL and an electron transport layer ETL. In addition, when compared with FIG. 1, FIG. 3 shows the cross-sectional view of an organic electroluminescence device 10 of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. When compared with FIG. 1, FIG. 4 shows the cross-sectional view of an organic electroluminescence device 10 of an embodiment including a capping layer CPL disposed on the second electrode EL2.

Hereinafter, in explaining the organic electroluminescence device 10 of an embodiment, the emission layer EML is explained to include a fused polycyclic compound according to an embodiment, which will be explained in more detail later, but an embodiment of the inventive concept is not limited thereto. The fused polycyclic compound according to an embodiment, which will be explained in more detail later, may be included in a hole transport region HTR, an electron transport region ETR, or a capping layer CPL.

The first electrode EL1 has conductivity. The first electrode EU may be formed utilizing a metal alloy and/or a conductive compound. The first electrode EU may be an anode. The first electrode EL1 may be a pixel electrode. The first electrode EL1 may be a transmissive electrode, a transflective electrode, or a reflective electrode. If the first electrode EU is the transmissive electrode, the first electrode EL1 may be formed utilizing a transparent metal oxide such as indium tin oxide (ITO), indium zinc oxide (IZO), zinc oxide (ZnO), and/or indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a structure including a plurality of layers including a reflective layer or a transflective layer formed utilizing the above materials, and a transmissive conductive layer formed utilizing ITO, IZO, ZnO, and/or ITZO. For example, the first electrode EL1 may include a three-layer structure of ITO/Ag/ITO. However, an embodiment of the inventive concept is not limited thereto. The thickness of the first electrode EL1 may be from about 1,000 Å to about 10,000 Å, for example, from about 1,000 Å to about 3,000 Å.

The hole transport region HTR is provided on the first electrode EL1. The hole transport region HTR may include a hole injection layer HIL, a hole transport layer HTL, a hole buffer layer, and/or an electron blocking layer EBL. The thickness of the hole transport region HTR may be from about 50 Å to about 1,500 Å.

The hole transport region HTR may have a single layer formed utilizing a single material, a single layer formed utilizing a plurality of different materials, or a multilayer structure including a plurality of layers formed utilizing a plurality of different materials.

For example, the hole transport region HTR may have the structure of a single layer of a hole injection layer HIL, or a hole transport layer HTL, and may have a structure of a single layer formed utilizing a hole injection material and a hole transport material. Alternatively, the hole transport region HTR may have a structure of a single layer formed utilizing a plurality of different materials, or a structure laminated from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, but the present disclosure is not limited thereto.

The hole transport region HTR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound (such as copper phthalocyanine), N,N'-diphenyl-N,N'-bis-[4-(phenyl-m-tolyl-amino)-phenyl]-phenyl-4,4'-diamine (DNTPD), 4,4',4"-[tris(3-methylphenyl)phenylamino]triphenylamine (m-MTDATA), 4,4',4"-tris(N,N-diphenylamino)triphenylamine (TDATA), 4,4',4"-tris{N,-2-naphthyl)-N-phenylamine}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), N,N'-di(1-naphthyl)-N,N"-diphenyl-(1,1"-biphenyl)-4,4"-diamine (NPD), triphenylamine-containing polyetherketone (TPAPEK), 4-isopropyl-4'-methyldiphenyliodonium [tetrakis(pentafluorophenyl)borate], and/or dipyrazino[2,3-f:2',3'-h]quinoxaline-2,3,6,7,10,11-hexacarbonitrile (HAT-CN).

The hole transport layer HTL may include, for example, carbazole derivatives (such as N-phenyl carbazole and polyvinyl carbazole), fluorene-based derivatives, N,N'-bis(3-methylphenyl)-N,N'-diphenyl-[1,1-biphenyl]-4,4'-diamine (TPD), triphenylamine-based derivatives (such as 4,4',4"-tris(N-carbazolyl)triphenylamine (TCTA)), N,N'-di(1-naphthalenyl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 1,3-bis(N-carbazolyl)benzene (mCP), 9-(4-tert-butylphenyl)-3,6-bis(triphenylsilyl)-9H-carbazole (CzSi), etc.

The thickness of the hole transport region HTR may be from about 100 Å to about 10,000 Å, for example, from about 100 Å to about 5,000 Å. The thickness of the hole injection region HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL and the electron blocking layer EBL satisfy the above-described ranges, satisfactory hole transport properties may be achieved without substantial increase of a driving voltage.

The hole transport region HTR may further include a charge generating material in addition to the above-described materials to increase conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, but the present disclosure is not limited thereto. For example, non-limiting examples of the p-dopant may include quinone derivatives (such as tetracyanoquinodimethane (TCNQ) and/or 2,3,5,6-tetrafluoro-7,7',8,8'-tetracyanoquinodimethane (F4-TCNQ)), and/or metal oxides (such as tungsten oxide, and/or molybdenum oxide), but the present disclosure is not limited thereto.

As described above, the hole transport region HTR may further include a hole buffer layer and/or an electron blocking layer EBL in addition to the hole injection layer HIL and the hole transport layer HTL. The hole buffer layer may compensate an optical resonance distance according to the wavelength of light emitted from an emission layer EML and may increase light emission efficiency. Materials which may be included in a hole transport region HTR may be utilized as materials included in a hole buffer layer. The electron blocking layer EBL is a layer playing the role of preventing or substantially preventing the electron injection from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed utilizing a single material, a single layer formed utilizing a plurality of different materials, or a multilayer structure having a plurality of layers formed utilizing a plurality of different materials.

In the organic electroluminescence device 10 of an embodiment, the emission layer EML may include the fused polycyclic compound of an embodiment.

In the description, the term "substituted or unsubstituted" refers to an unsubstituted group or a group substituted with at least one substituent selected from the group consisting of a deuterium atom, a halogen atom, a cyano group, a nitro group, an amino group, a silyl group, an oxy group, a thiol group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the exemplified substituents may be substituted or unsubstituted. For example, a biphenyl group may be interpreted as an aryl group or a phenyl group substituted with a phenyl group.

In the description, the term "forming a ring via the combination with an adjacent group" may refer to forming a substituted or unsubstituted hydrocarbon ring, or a substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The ring formed by the combination with an adjacent group may be a monocyclic ring or a polycyclic ring. In addition, the ring formed via the combination with an adjacent group may be combined with another ring to form a spiro structure.

In the description, the term "adjacent group" may refer to a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, the two methyl groups may be interpreted as "adjacent groups" to each other, and in 1,1-diethylcyclopentene, the two ethyl groups may be interpreted as "adjacent groups" to each other.

In the description, the halogen atom may be a fluorine atom, a chlorine atom, a bromine atom and/or an iodine atom.

In the description, the alkyl may be a linear, branched or cyclic alkyl. The carbon number of the alkyl may be 1 to 50, 1 to 30, 1 to 20, 1 to 10, or 1 to 6.

Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-heneicosyl, n-docosyl, n-tricosyl, n-tetracosyl, n-pentacosyl, n-hexacosyl, n-heptacosyl, n-octacosyl, n-nonacosyl, n-triacontyl, etc., but the present disclosure is not limited thereto.

In the description, the hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocyclic or polycyclic.

In the description, the hydrocarbon ring may be an optional functional group or substituent derived from an aliphatic hydrocarbon ring, or an optional functional group or substituent derived from an aromatic hydrocarbon ring. The carbon number of the hydrocarbon ring to form a ring may be 5 to 60.

In the description, the heterocyclic group may be an optional functional group or substituent, which is derived from a heterocycle including at least one heteroatom as a ring-forming element. The carbon number of the heterocyclic group to form a ring may be 2 to 60.

In the description, the aryl group refers to an optional functional group or substituent derived from an aromatic hydrocarbon ring. The aryl group may be a monocyclic aryl group or a polycyclic aryl group. The carbon number to form a ring in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., but the present disclosure is not limited thereto.

In the description, the fluorenyl group may be substituted, and two substituents may be combined with each other to form a spiro structure. Examples of a substituted fluorenyl group are as follows. However, an embodiment of the inventive concept is not limited thereto.

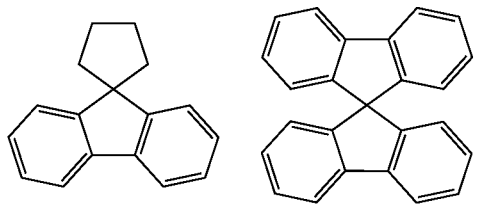

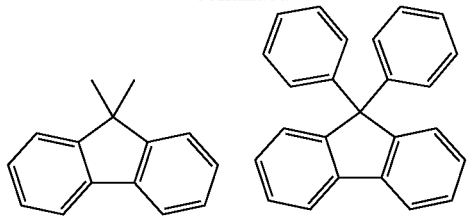

In the description, the heteroaryl may be one including one or more selected from B, O, N, P, Si and S as heteroatoms. If the heteroaryl includes two or more heteroatoms, two or more heteroatoms may be the same or different. The heteroaryl may be monocyclic heteroaryl or polycyclic heteroaryl. The carbon number to form a ring of the heteroaryl may be 2 to 30, 2 to 20, or 2 to 10. Examples of the heteroaryl may include thiophenyl, furanyl, pyrrolyl, imidazolyl, thiazolyl, oxazolyl, oxadiazolyl, triazolyl, pyridinyl, bipyridinyl, pyrimidinyl, triazinyl, acridyl, pyridazinyl, pyrazinyl, quinolinyl, quinazolinyl, quinoxalinyl, phenoxazinyl, phthalazinyl, pyrido pyrimidinyl, pyrido pyrazinyl, pyrazino pyrazinyl, isoquinolinyl, indolyl, carbazolyl, N-arylcarbazolyl, N-heteroarylcarbazolyl, N-alkylcarbazolyl, benzoxazolyl, benzoimidazolyl, benzothiazolyl, benzocarbazolyl, benzothiophenyl, dibenzothiophenyl, thienothiophenyl, benzofuranyl, phenanthrolinyl, isooxazolyl, thiadiazolyl, phenothiazinyl, dibenzosilolyl, dibenzofuranyl, etc., but the present disclosure is not limited thereto.

In the description, the silyl group includes an alkylsilyl group and an arylsilyl group. Examples of the silyl group may include trimethylsilyl, triethylsilyl, t-butyldimethylsilyl, propyldimethylsilyl, triphenylsilyl, diphenylsilyl, phenylsilyl, etc. However, an embodiment of the inventive concept is not limited thereto.

In the description, the boron group includes an alkyl boron group and an aryl boron group. Examples of the boron group include a trimethylboron group, a triethylboron group, a t-butyldimethylboron group, a triphenylboron group, a diphenylboron group, a phenylboron group, etc., but the present disclosure is not limited thereto.

In the description, the carbon number of the amine group is not specifically limited, but may be 1 to 30. The amine group may include an alkyl amine group and an aryl amine group. Examples of the amine group include a methylamine group, a dimethylamine group, a phenylamine group, a naphthylamine group, a 9-methyl-anthracenylamine group, a triphenylamine group, etc., but the present disclosure is not limited thereto In the description, the hydrocarbon ring refers to an optional functional group or substituent derived from an aliphatic hydrocarbon ring. The hydrocarbon ring may be a saturated hydrocarbon ring of 5 to 20 carbon atoms to form a ring.

In the description, the heterocyclic group may include one or more selected from B, O, N, P, Si and S as heteroatom(s). If the heterocyclic group includes two or more heteroatoms, the two or more heteroatoms may be the same or different. The heterocyclic group may be monocyclic heterocyclic group or polycyclic heterocyclic group, and has the concept including (e.g., may include) a heteroaryl group. The carbon number to form a ring of the heterocyclic group may be 2 to 30, 2 to 20, or 2 to 10.

The fused polycyclic compound of an embodiment may be represented by the following Formula 1:

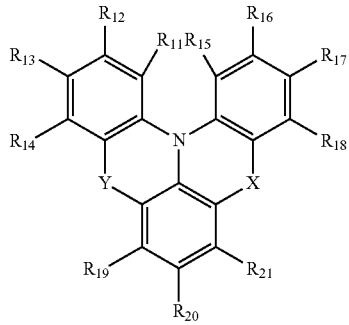

Formula 1

In Formula 1, one selected from X and Y is $BR_a$ or $P(\!=\!O)R_b$, and the other one selected from X and Y is $SiR_cR_d$. For example, in the fused polycyclic compound of an embodiment, represented by Formula 1, any one selected from X and Y may be $BR_a$, and the other one may be $SiR_cR_d$, or any one selected from X and Y may be $P(\!=\!O)R_b$, and the other one may be $SiR_cR_d$. That is, the fused polycyclic compound of an embodiment may necessarily include Si as a heteroatom.

In Formula 1, $R_a$ to $R_d$ may be each independently a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_a$ to $R_d$ may (optionally) be combined with an adjacent group to form a ring.

For example, in Formula 1, each of $R_a$ and $R_b$ may be a substituted or unsubstituted aryl group of 6 to 60 carbon atoms to form a ring. In one embodiment, each of $R_a$ and $R_b$ may be an aryl group of 6 to 60 carbon atoms to form a ring, which is substituted with an alkyl group or an aryl group, or an aryl group of 6 to 60 carbon atoms to form a ring, which is unsubstituted. In Formula 1, each of $R_a$ and $R_b$ may be a substituted or unsubstituted phenyl group.

In Formula 1, $R_c$ and $R_d$ may be the same. For example, in Formula 1, $R_c$ and $R_d$ may each independently be a substituted or unsubstituted phenyl group. In one embodiment, $R_c$ and $R_d$ may each be an unsubstituted phenyl group.

In addition, in Formula 1, $R_{11}$ to $R_{21}$ may be each independently a hydrogen atom, a deuterium atom, a halogen atom, a boron group, a phosphine oxide group, a cyano group, a substituted or unsubstituted amine group, a substituted or unsubstituted silyl group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_a$ to $R_d$ may (optionally) be combined with an adjacent group to form a ring (i.e., $R_{11}$ to $R_{21}$ may be each independently optionally combined with an adjacent group to form a ring).

For example, in Formula 1, $R_{11}$ to $R_{21}$ may be each independently a hydrogen atom, an aryl amine group, a substituted or unsubstituted aryl group of 6 to 30 carbon atoms to form a ring, or a substituted or unsubstituted heteroaryl group of 2 to 30 carbon atoms to form a ring, and any of $R_{11}$ to $R_{21}$ may (optionally) be combined with an adjacent group to form a hydrocarbon ring or a heterocycle.

In Formula 1, $R_{11}$ to $R_{21}$ may be an electron donor substituent represented by an aryl amine group, etc., an electron acceptor substituent represented by a heteroaryl group including N (nitrogen atom) as a ring-forming element, an aryl group substituted with an aryl group, or an unsubstituted aryl group.

The fused polycyclic compound of an embodiment necessarily includes Si as a ring-forming heteroatom which forms a corresponding fused ring in a core and may show bulkiness and improved rigidity when compared with the related art DABNA series polycyclic compound which includes N and B as heteroatoms to form a ring. In addition, the fused polycyclic compound of an embodiment shows multiple resonance by a plurality of aromatic rings forming the fused ring, and may separate (e.g., easily separate) HOMO and LUMO states in one molecule, and thus, may be suitably utilized as a delayed fluorescence emission material. In addition, the fused polycyclic compound of an embodiment includes Si as a ring-forming heteroatom and shows increased rigidity when compared with the related art DANBA series polycyclic compound, and accordingly, may decrease a T value (delayed emission time) and show an increased reverse inter system crossing (RISC) rate and improved effect of life (e.g., improved lifespan). In addition, because the fused polycyclic compound of an embodiment has a high lowest triplet excitation energy level (T1 level), when utilized as a delayed fluorescence emission material, the emission efficiency of an organic electroluminescence device may be further improved.

The fused polycyclic compound represented by Formula 1 may be represented by any one from among the following Formula 1-1 to Formula 1-3:

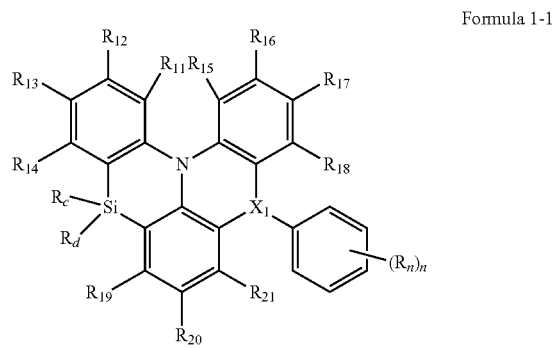

Formula 1-1

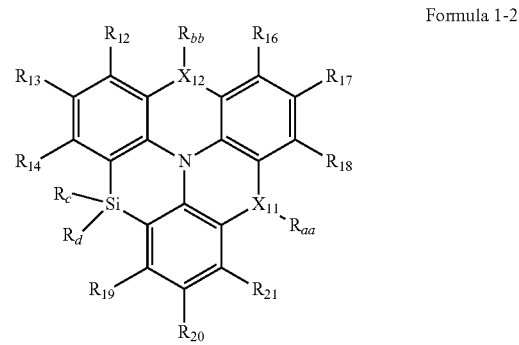

Formula 1-2

Formula 1-3

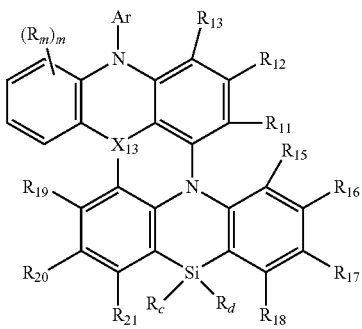

In Formula 1-1, $X_1$ may be B or P(=O). In Formula 1-1, $R_n$ may be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and may (optionally) be combined with an adjacent group to form a ring (i.e., $R_n$ may optionally combine with an adjacent group to form a ring).

n may be an integer of 0 to 5. Also, in Formula 1-1, when n is 0, a phenyl group combined with $X_1$ may be an unsubstituted one. In addition, when n is 5 and all $R_n$s are hydrogen atoms, a phenyl group combined with $X_1$ may be an unsubstituted one. In Formula 1-1, when n is an integer of 2 or more, a plurality of $R_n$s may be the same or at least one from among the plurality of $R_n$s may be different.

In Formula 1-1, when $X_1$ is B, a phenyl group combined with $X_1$ may be a substituted or unsubstituted one. For example, $R_n$ may be a hydrogen atom or a methyl group. In addition, in Formula 1-1, when $X_1$ is P(O=), a phenyl group combined with $X_1$ may be an unsubstituted one. For example, in Formula 1-1, when $X_1$ is P(=O), n may be 0.

In Formula 1-2, $X_{11}$ and $X_{12}$ may be each independently B or P(=O). For example, $X_{11}$ and $X_{12}$ may be the same. In one embodiment, both $X_{11}$ and $X_{12}$ may be B or both $X_{11}$ and $X_{12}$ may be P(=O).

In Formula 1-2, $R_{aa}$ and $R_{bb}$ may be each independently a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{aa}$ and $R_{bb}$ may (optionally) be combined with an adjacent group to form a ring (i.e., $R_{aa}$ and $R_{bb}$ may be each independently optionally combined with an adjacent group to form a ring).

For example, $R_{aa}$ and $R_{bb}$ may be each independently a substituted or unsubstituted aryl group of 6 to 30 carbon atoms to form a ring. In one embodiment, $R_{aa}$ and $R_{bb}$ may be each independently a substituted or unsubstituted phenyl group. In Formula 1-2, when $X_{11}$ and $X_{12}$ are each B, $R_{aa}$ and $R_{bb}$ may be each independently a substituted or unsubstituted phenyl group, and when $X_{11}$ and $X_{12}$ are each P(=O), $R_{aa}$ and $R_{bb}$ may be each independently an unsubstituted phenyl group.

In Formula 1-3, $X_{13}$ may be B or P(=O). In Formula 1-3, $R_m$ may be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and may (optionally) be combined with an adjacent group to form a ring (i.e., $R_m$ may combine with an adjacent group to form a ring).

m may be an integer of 0 to 4. In Formula 1-3, when m is an integer of 2 or more, a plurality of $R_m$s may be the same or at least one from among the plurality of $R_m$s may be different.

For example, in Formula 1-3, $R_m$ may be a substituted or unsubstituted arylamine group, a substituted or unsubstituted aryl group of 6 to 30 carbon atoms to form a ring, a substituted or unsubstituted heteroaryl group of 2 to 30 carbon atoms to form a ring, and may (optionally) be combined with an adjacent group to form a substituted or unsubstituted fluorenyl group.

In Formula 1-3, Ar may be a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring. For example, Ar may be a substituted or unsubstituted aryl group of 6 to 30 carbon atoms to form a ring.

Also, in Formula 1-1 to Formula 1-3, the same explanation as in Formula 1 may be applied to $R_1$ to $R_{21}$, $R_c$, and $R_d$.

The fused polycyclic compound of an embodiment may be any one selected from the compounds represented in Compound Group 1 below. The organic electroluminescence device 10 of an embodiment may include at least one fused polycyclic compound selected from the compounds represented in Compound Group 1 in an emission layer EML.

Compound Group 1

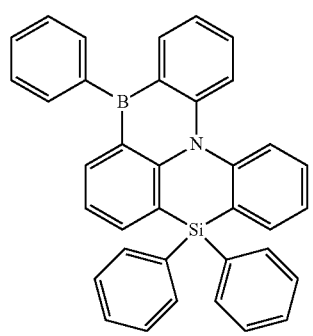

1

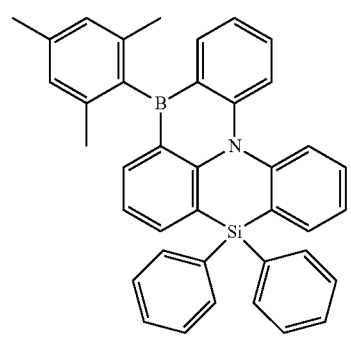

2

3
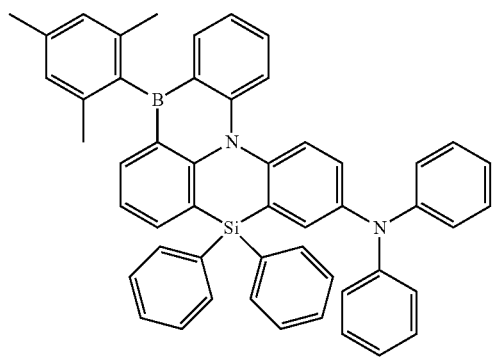
4
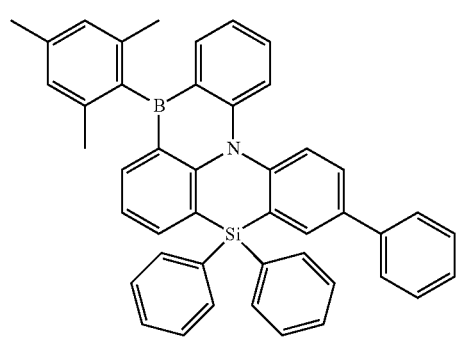
5
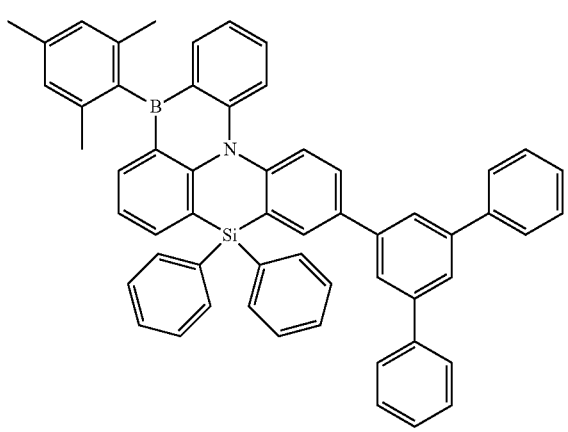
6
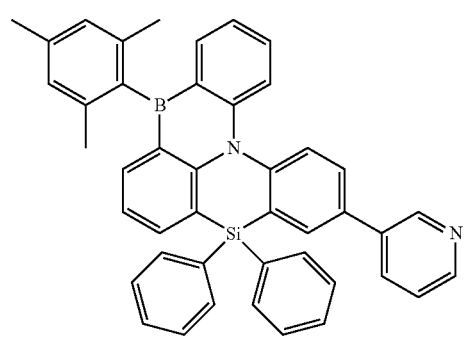
7
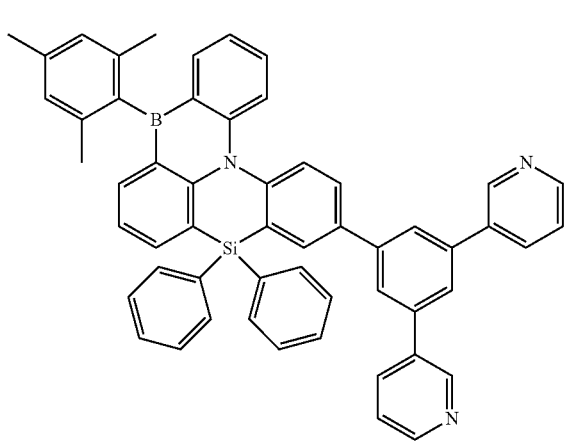
8
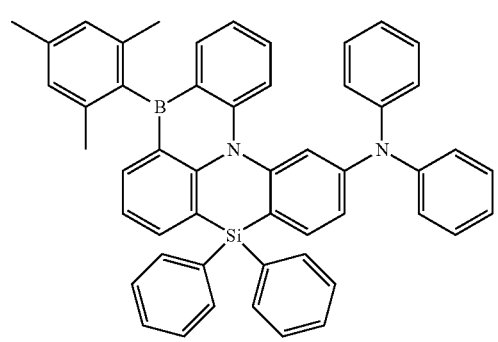
9
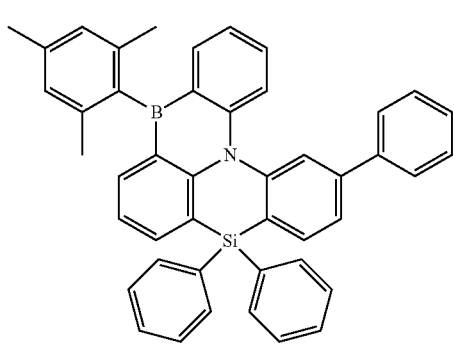
10
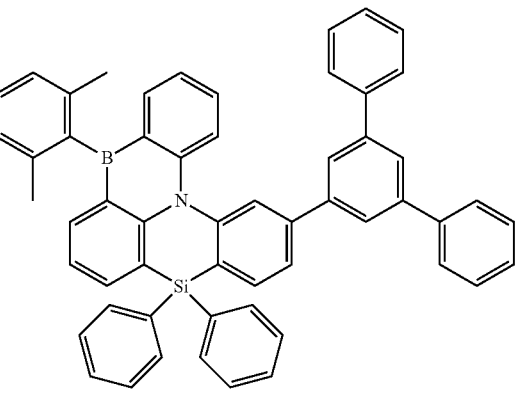

17
-continued
11
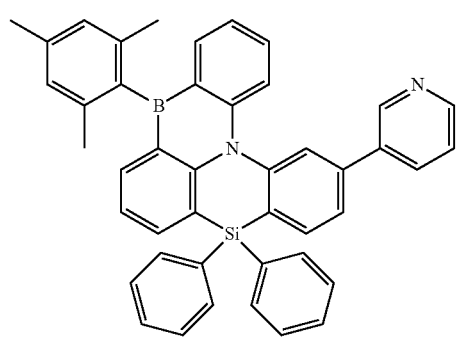
12
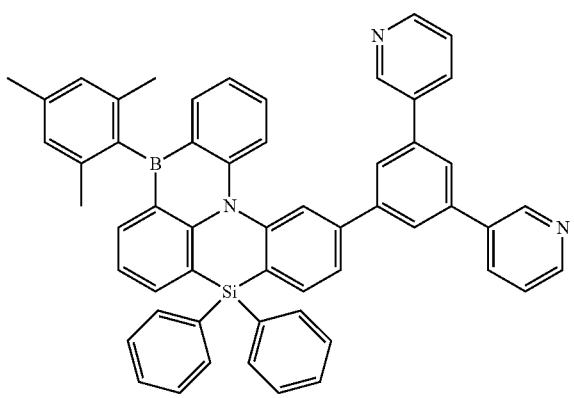
13
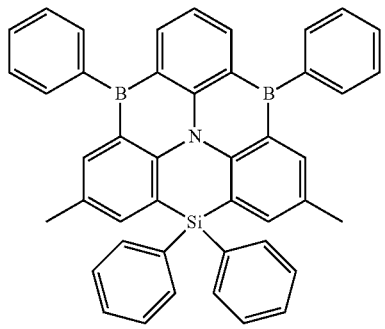
14
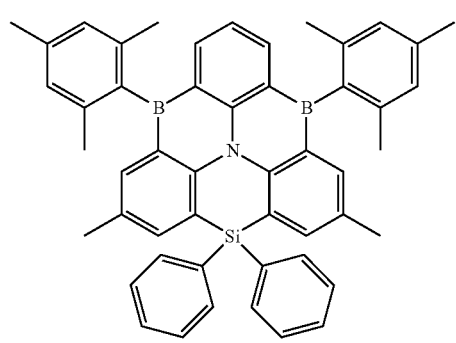
18
-continued
15
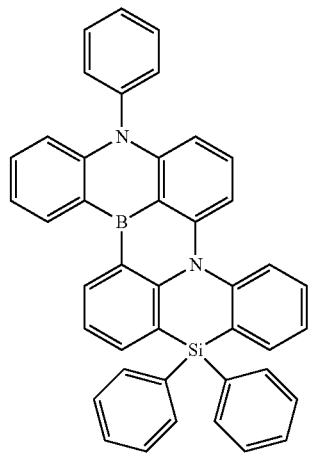
16
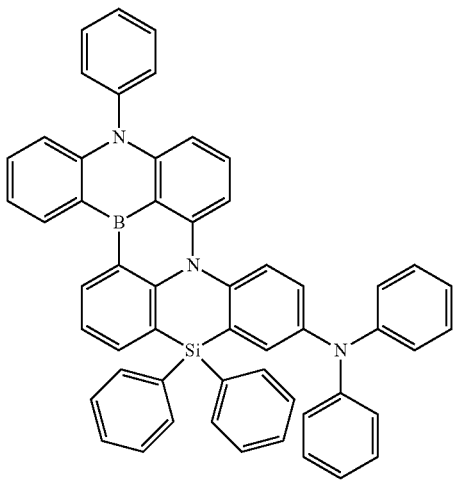
17
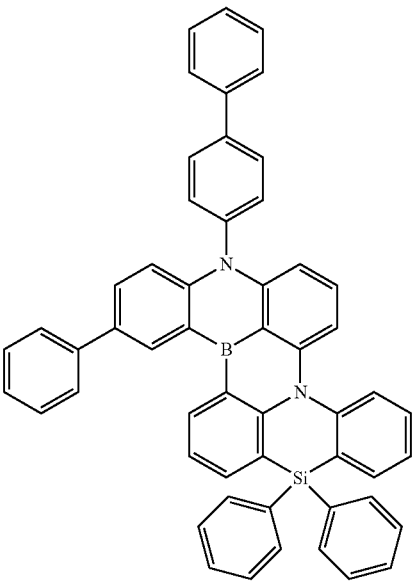

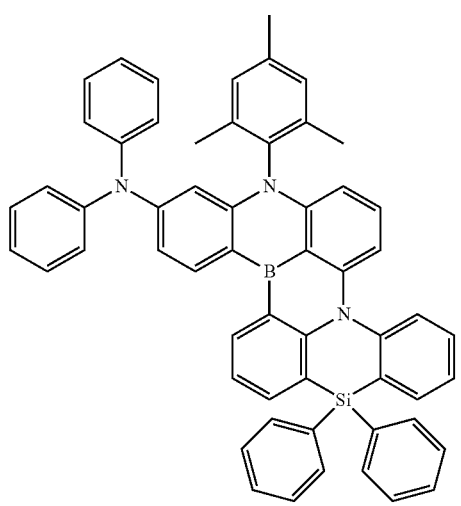
18
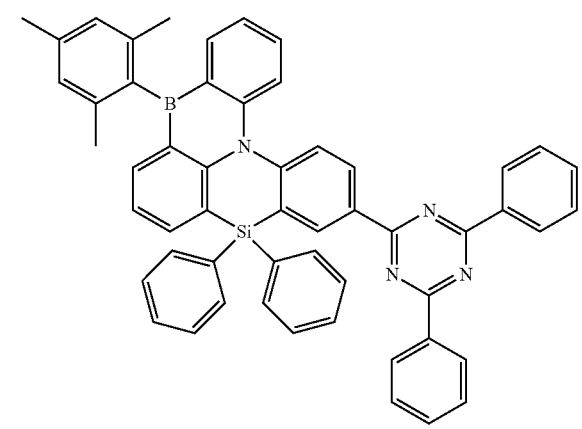
21
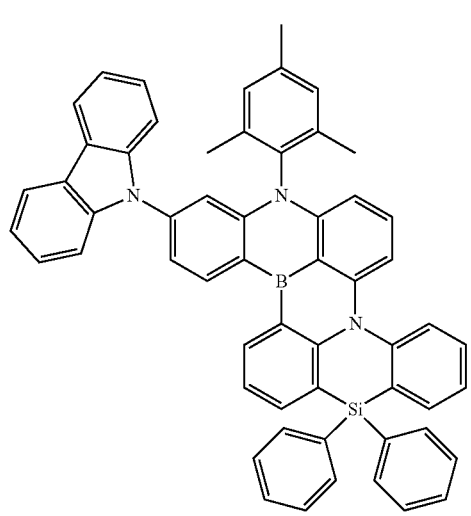
19
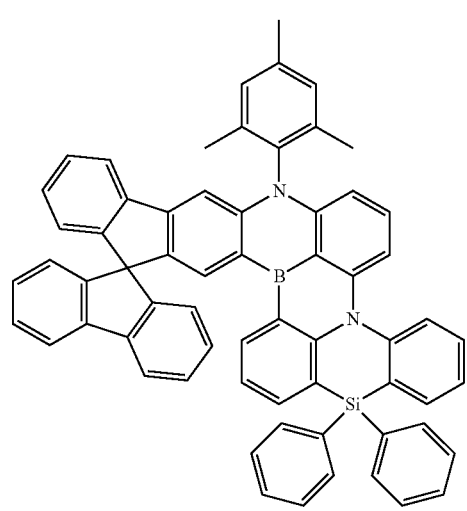
20

25
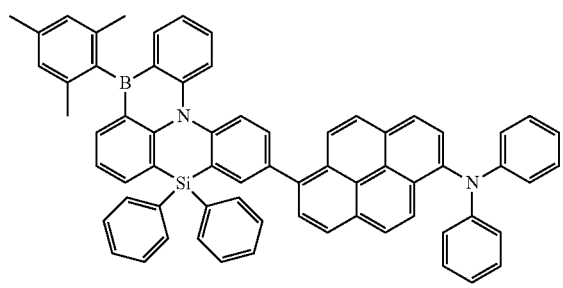
26
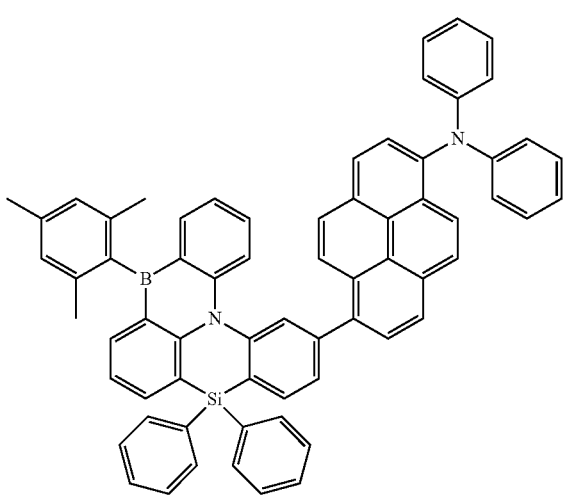
27
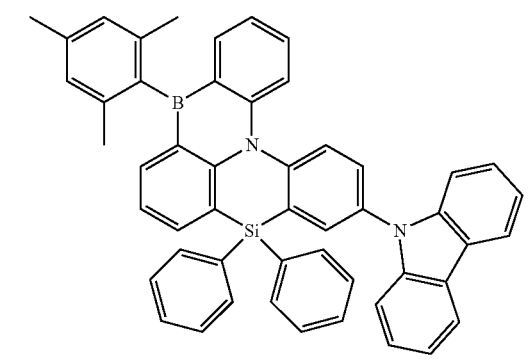
28
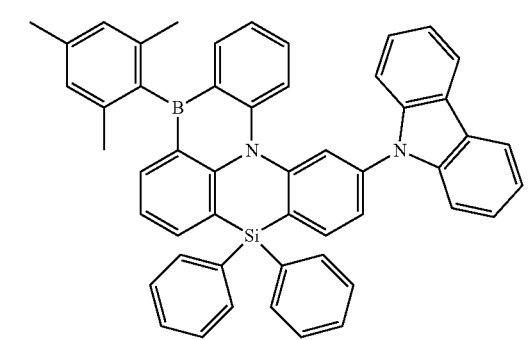
29
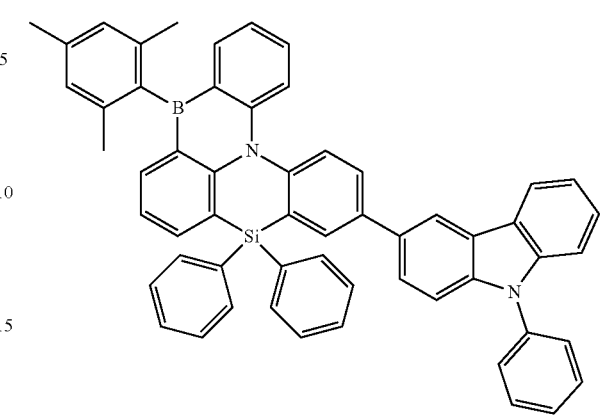
30
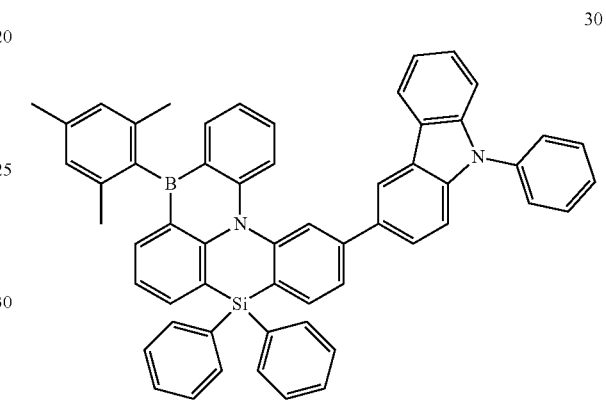
31
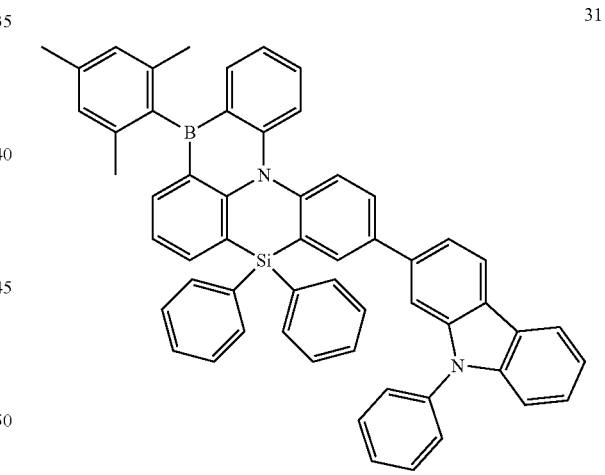
32
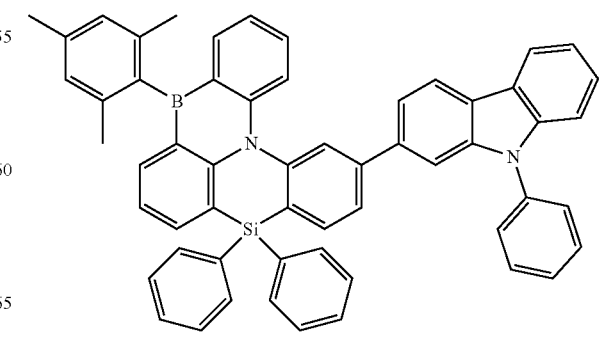

33
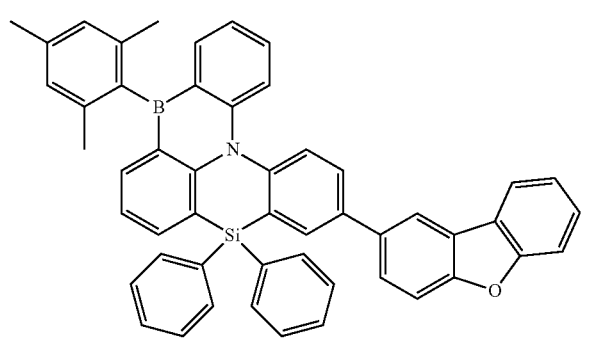
34
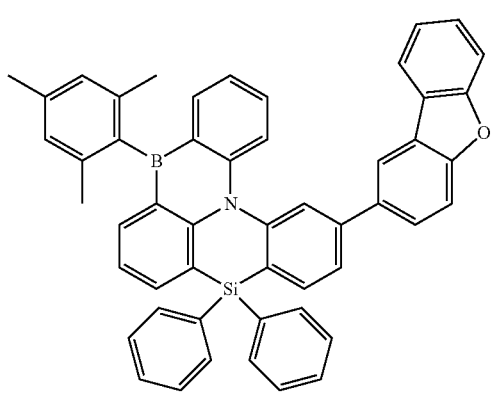
35
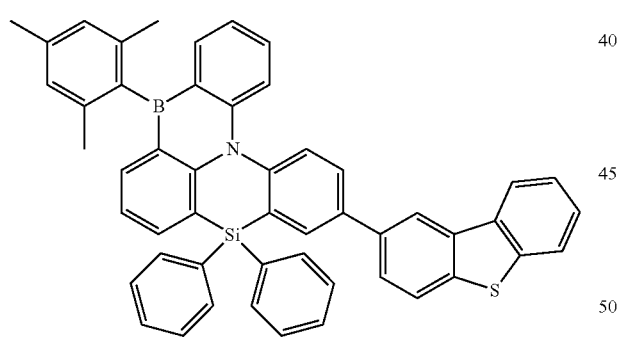
36
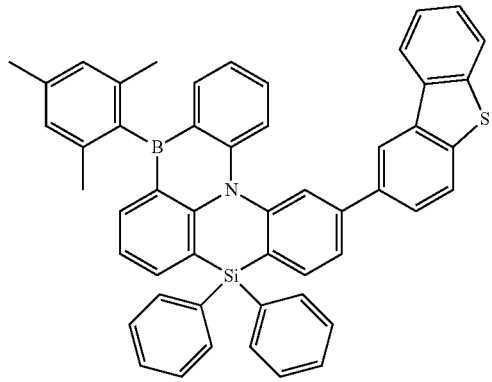
37
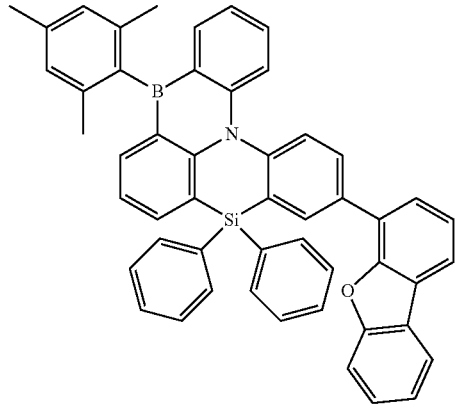
38
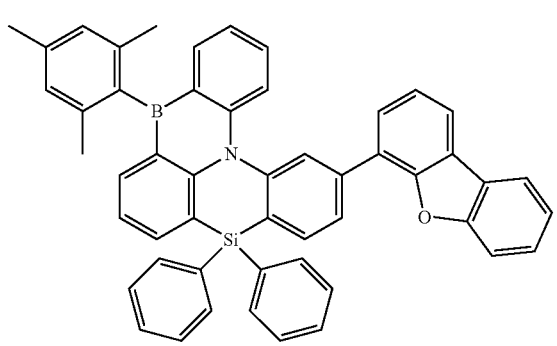
39
40
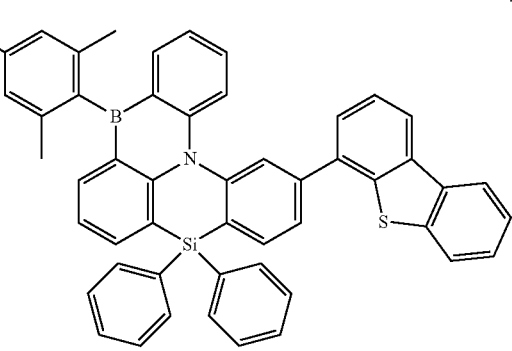

41
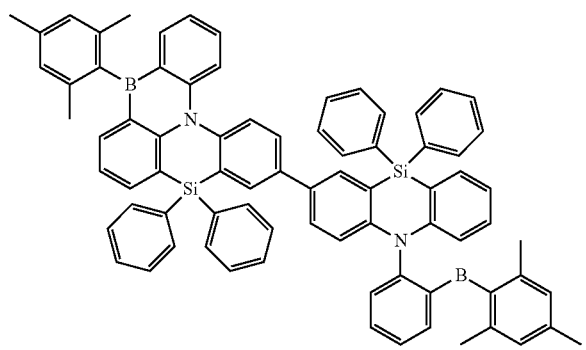
45
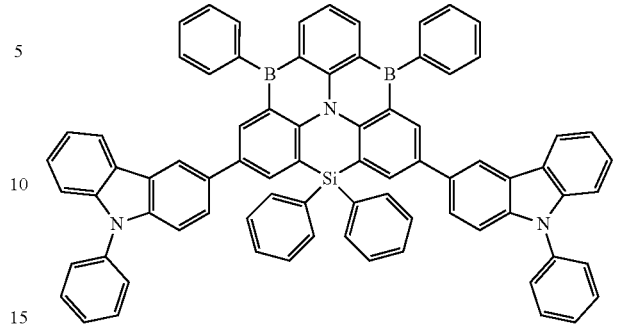
42
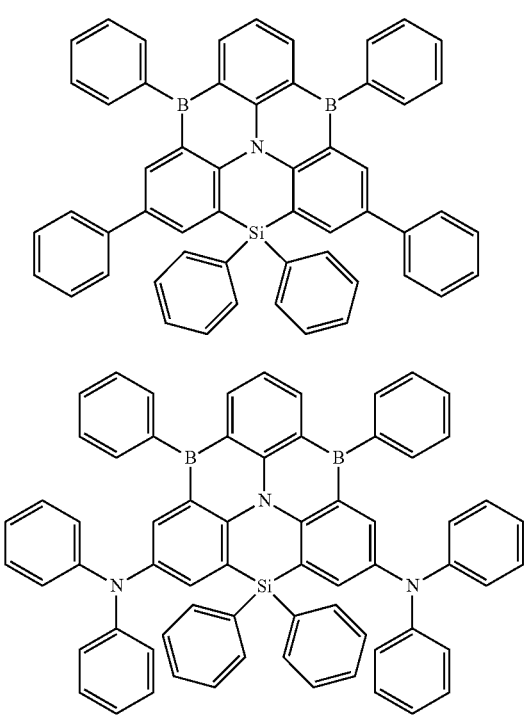
46
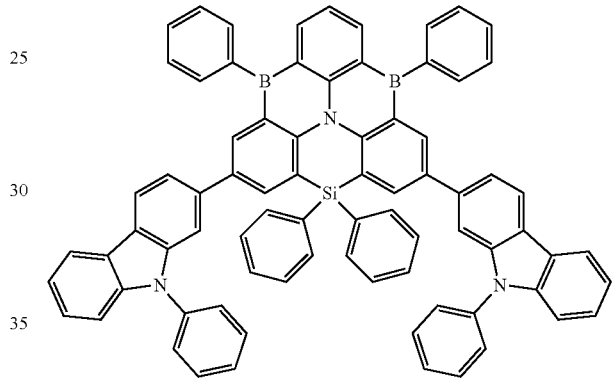
43
44
47
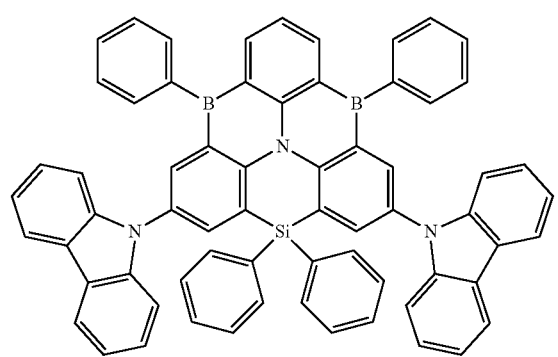
48
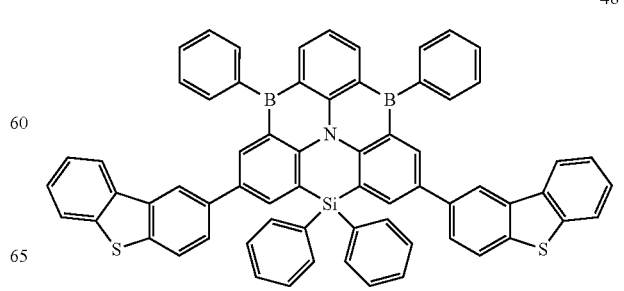

49
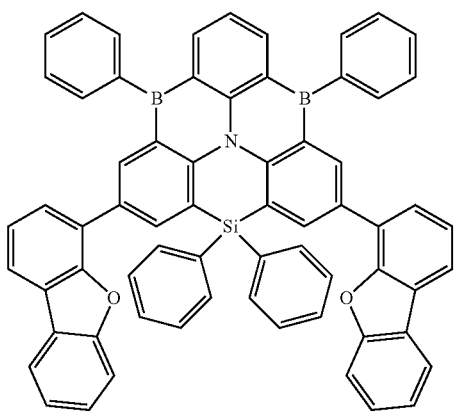
50
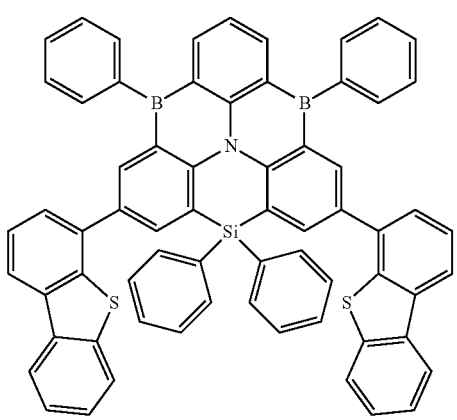
51
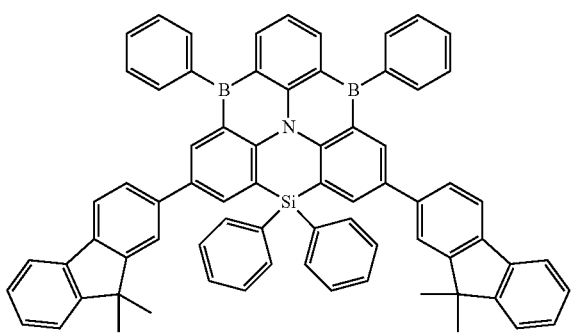
52
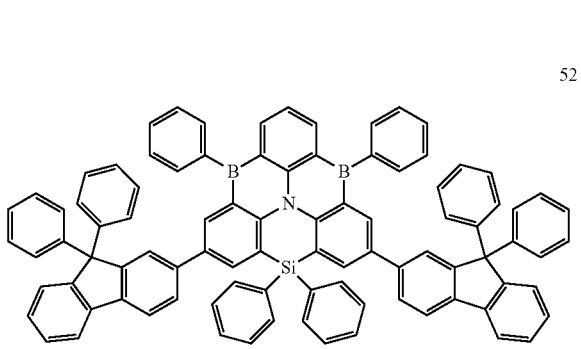
53
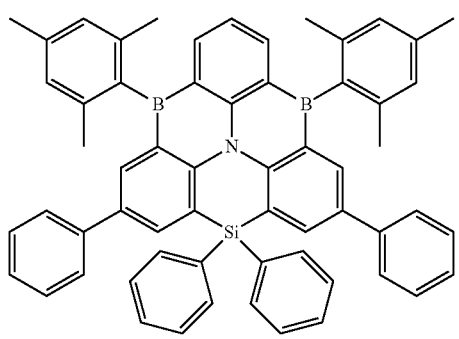
54
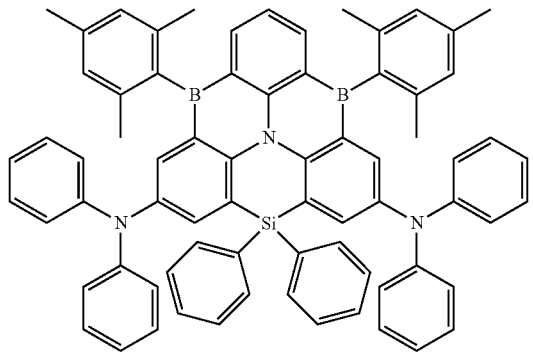
55
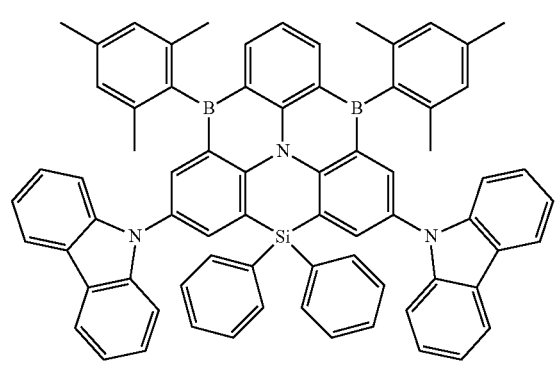
56
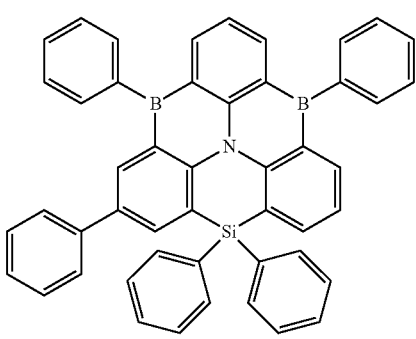

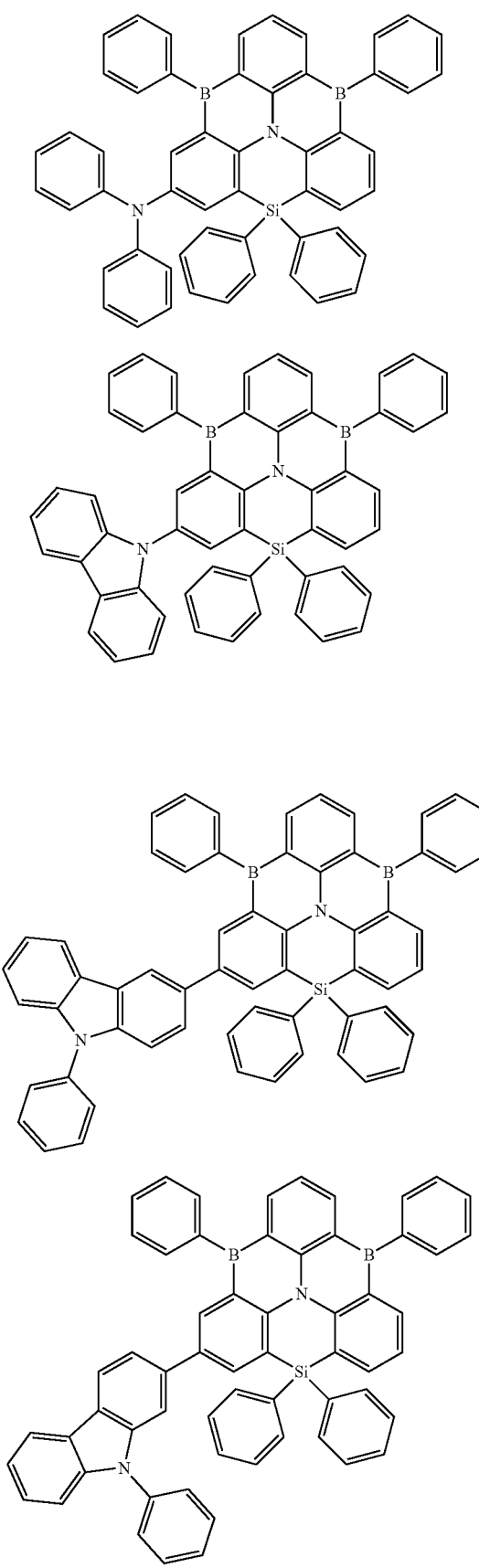
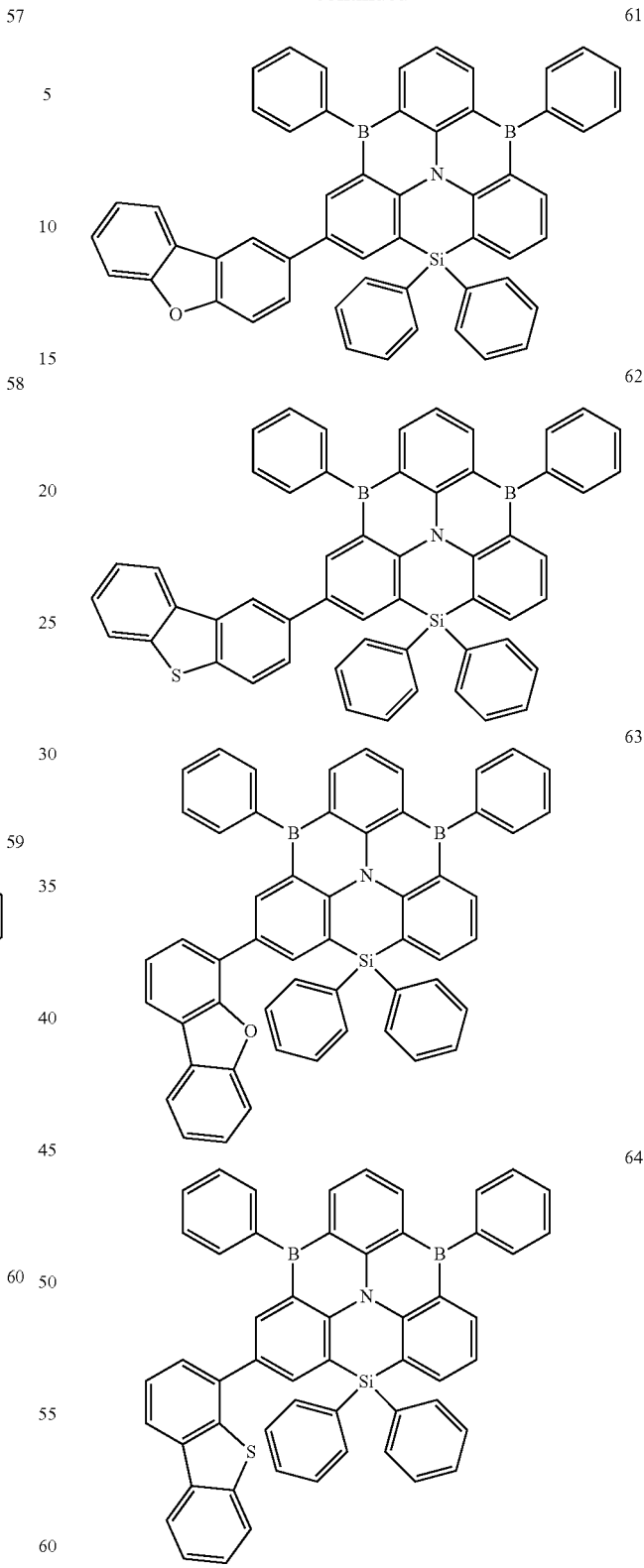
The fused polycyclic compound of an embodiment, represented by Formula 1 may be a thermally activated delayed fluorescence emission material. In addition, the fused polycyclic compound of an embodiment, represented by Formula 1 may be a thermally activated delayed fluorescence dopant having a difference ($\Delta E_{ST}$) between the lowest triplet excitation energy level (T1 level) and the lowest singlet excitation energy level (S1 level) of about 0.2 eV or less. For example, $\Delta E_{ST}$ of the fused polycyclic compound of an embodiment, represented by Formula 1 may be about 0.01 eV or less.

The fused polycyclic compound of an embodiment, represented by Formula 1 may be a light-emitting material having a light-emitting central wavelength in a wavelength region of about 430 nm to about 490 nm. For example, the fused polycyclic compound of an embodiment, represented by Formula 1 may be a blue thermally activated delayed fluorescence (TADF) dopant. However, an embodiment of the inventive concept is not limited thereto, and in case of utilizing the fused polycyclic compound of an embodiment as the light-emitting material, the fused polycyclic compound may be utilized as a dopant material emitting light in various suitable wavelength regions, such as a red emitting dopant and/or a green emitting dopant.

In the organic electroluminescence device 10 of an embodiment, the emission layer EML may emit delayed fluorescence. For example, the emission layer EML may emit thermally activated delayed fluorescence (TADF).

In addition, the organic electroluminescence device 10 may emit blue light. For example, the emission layer EML of the organic electroluminescence device 10 of an embodiment may emit blue light in a region of about 490 nm or more. However, an embodiment of the inventive concept is not limited thereto, and the emission layer EML may emit green light or red light.

Also, in one embodiment, the organic electroluminescence device 10 of an embodiment may include a plurality of emission layers. The plurality of emission layers may be laminated one by one and provided. For example, the organic electroluminescence device 10 including a plurality of emission layers may emit white light. The organic electroluminescence device including the plurality of emission layers may be an organic electroluminescence device having a tandem structure. When the organic electroluminescence device 10 includes a plurality of emission layers, at least one emission layer EML may include the fused polycyclic compound of an embodiment.

In an embodiment, the emission layer EML includes a host and a dopant, and may include the fused polycyclic compound of an embodiment as a dopant. For example, in the organic electroluminescence device 10 of an embodiment, the emission layer EML may include a host for emitting delayed fluorescence and a dopant for emitting delayed fluorescence, and may include the fused polycyclic compound as a dopant for emitting delayed fluorescence. The emission layer EML may include at least one selected from the fused polycyclic compounds represented in Compound Group 1 as a thermally activated delayed fluorescence dopant.

In an embodiment, the emission layer EML may be a delayed fluorescence emission layer, and the emission layer EML may include a suitable (e.g., known) host material and the above-described fused polycyclic compound. For example, in an embodiment, the fused polycyclic compound may be utilized as a TADF dopant.

Also, in an embodiment, the emission layer EML may include a suitable (e.g., known) host material. For example, in an embodiment, the emission layer EML may include as a host material, tris(8-hydroxyquinolinato)aluminum (Alq3), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazol-2-yl)benzene (TPBi), 3-tert-butyl-9,10-di(naphth-2-yl)anthracene (TBADN), distyrylarylene (DSA), 4,4'-bis(9-carbazolyl)-2,2"-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), 2,8-bis(diphenylphosphoryl)dibenzo[b,d]furan (PPF), 3,3'-bis(N-carbazolyl)-1,1'-biphenyl (mCBP), 1,3-bis(N-carbazolyl)benzene (mCP), etc. However, an embodiment of the inventive concept is not limited thereto. Any suitable (e.g., known) host materials to emit delayed fluorescence other than the suggested host materials may be included.

In addition, in the organic electroluminescence device 10 of an embodiment, the emission layer EML may further include a suitable (e.g., known) dopant material. In an embodiment, the emission layer EML may include as a dopant, styryl derivatives (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi), perylene and the derivatives thereof (for example, 2,5,8,11-tetra-t-butylperylene (TBP)), pyrene and the derivatives thereof (for example, 1,1-dipyrene, 1,4-dipyrenylbenzene, 1,4-bis(N,N-diphenylamino)pyrene), etc.

In addition, in an embodiment, the emission layer EML may include two dopant materials having different lowest triplet excitation energy levels (T1 levels) from each other. In the organic electroluminescence device 10 of an embodiment, the emission layer EML may include a host having the first lowest triplet excitation energy level, a first dopant having the second lowest triplet excitation energy level which is lower than the first lowest triplet excitation energy level, and a second dopant having the third lowest triplet excitation energy level which is lower than the second lowest triplet excitation energy level. In an embodiment, the emission layer EML may include the above-described fused polycyclic compound as the first dopant.

In the organic electroluminescence device 10 of an embodiment, which includes the host, the first dopant and the second dopant in the emission layer EML, the first dopant may be a delayed fluorescence dopant, and the second dopant may be a fluorescence dopant. In addition, in the organic electroluminescence device 10 of an embodiment, the fused polycyclic compound represented by Formula 1 may play the role of an assistant dopant.

For example, when the emission layer EML of the organic electroluminescence device 10 of an embodiment includes a plurality of dopants, the emission layer EML may include the polycyclic compound of an embodiment as the first dopant, and the above-described suitable (e.g., known) dopant material as the second dopant. For example, when the emission layer EML emits blue light, the emission layer EML may further include, as the second dopant, any one selected from the group consisting of spiro-DPVBi, spiro-6P, distyryl-benzene (DSB), distyryl-arylene (DSA), a polyfluorene (PFO)-based polymer and a poly(p-phenylene vinylene)-based polymer. In addition, the second dopant may utilize a metal complex and/or an organometallic complex such as $(4,6-F_2ppy)_2Irpic$, perylene and the derivatives thereof, etc. Meanwhile, in the organic electroluminescence device 10 of an embodiment, including the fused polycyclic compound of an embodiment as the first dopant of the emission layer EML, the emission layer EML may emit green light or red light, and in this case, the second dopant material utilized may be the above-described suitable (e.g., known) dopant, a suitable (e.g., known) green fluorescence dopant, or a suitable (e.g., known) red fluorescence dopant.

In the organic electroluminescence device 10 of an embodiment, the emission layer EML may be a phosphorescence emission layer. For example, the fused polycyclic compound according to an embodiment may be included in the emission layer EML as a phosphorescence host material.

In the organic electroluminescence device 10 of an embodiment, as shown in FIGS. 1 to 3, the electron transport region ETR is provided on the emission layer EML. The electron transport region ETR may include a hole blocking layer HBL, an electron transport layer ETL and/or an electron injection layer EIL. However, an embodiment of the inventive concept is not limited thereto.

The electron transport region ETR may have a single layer formed utilizing a single material, a single layer formed utilizing a plurality of different materials, or a multilayer structure having a plurality of layers formed utilizing a plurality of different materials.

For example, the electron transport region ETR may have a single layer structure of an electron injection layer EIL or an electron transport layer ETL, or a single layer structure formed utilizing an electron injection material and an electron transport material. Further, the electron transport region ETR may have a single layer structure having a plurality of different materials, or a structure laminated from the emission layer EML of electron transport layer ETL/electron injection layer EIL, or hole blocking layer HBL/electron transport layer ETL/electron injection layer EIL, but the present disclosure is not limited thereto. The thickness of the electron transport region ETR may be, for example, from about 1,000 Å to about 1,500 Å.

The electron transport region ETR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

If the electron transport region ETR includes an electron transport layer ETL, the electron transport region ETR may include an anthracene-based compound. The electron transport region may include, for example, tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq2), 9,10-di(naphthalen-2-yl)anthracene (ADN), diphenyl(4-(triphenylsilyl)phenyl)phosphine oxide (TSPO1), bis[2-(diphenylphosphino)phenyl]ether oxide (DPEPO), or a mixture thereof, but the present disclosure is not limited thereto. The thickness of the electron transport layer ETL may be from about 100 Å to about 1,000 Å and may be, for example, from about 150 Å to about 500 Å. When the thickness of the electron transport layer ETL satisfies the above-described ranges, satisfactory electron transport properties may be obtained without substantial increase of a driving voltage.

If the electron transport region ETR includes the electron injection layer EIL, the electron transport region ETR may include, for example, LiF, 8-hydroxyquinolinato-lithium (LiQ), $Li_2O$, BaO, NaCl, CsF, a metal in lanthanoides (such as Yb), and/or a metal halide (such as RbCl, and/or RbI). However, an embodiment of the inventive concept is not limited thereto. The electron injection layer EIL may also be formed utilizing a mixture material of an electron injection material and an insulating organo metal salt. The organo metal salt may be a material having an energy band gap of about 4 eV or more. In one embodiment, the organo metal salt may include, for example, metal acetates, metal benzoates, metal acetoacetates, metal acetylacetonates, and/or metal stearates. The thickness of the electron injection layer EIL may be from about 1 Å to about 500 Å, or from about 3 Å to about 300 Å. If the thickness of the electron injection layer EIL satisfies the above described ranges, satisfactory electron injection properties may be obtained without inducing substantial increase of a driving voltage.

The electron transport region ETR may include a hole blocking layer HBL as described above. The hole blocking layer HBL may include, for example, 2,9-dimethyl-4,7-diphenyl-1,10-phenanthroline (BCP), and/or 4,7-diphenyl-1,10-phenanthroline (Bphen). However, an embodiment of the inventive concept is not limited thereto.

The second electrode EL2 is provided on the electron transport region ETR. The second electrode EL2 may be a common electrode or a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed utilizing the above-described materials and a transparent conductive layer formed utilizing ITO, IZO, ZnO, ITZO, etc.

In one embodiment, the second electrode EL2 may be connected with an auxiliary electrode. If the second electrode EL2 is connected with the auxiliary electrode, the resistance of the second electrode EL2 may decrease.

Also, on the second electrode EL2 of the organic electroluminescence device 10 of an embodiment, a capping layer CPL may be further disposed. The capping layer CPL may include, for example, α-NPD, NPB, TPD, m-MTDATA, Alq3, CuPc, N4,N4,N4',N4'-tetra(biphenyl-4-yl)biphenyl-4,4'-diamine (TPD15), 4,4',4''-tris(carbazol-9-yl)triphenylamine (TCTA), N, N'-bis(naphthalene-1-yl), etc.

The organic electroluminescence device 10 according to an embodiment of the inventive concept includes the fused polycyclic compound of an embodiment in the emission layer EML disposed between the first electrode EL1 and the second electrode EL2, thereby showing high emission efficiency properties. In addition, the fused polycyclic compound according to an embodiment may be a thermally activated delayed fluorescence dopant, and the emission layer EML may include the fused polycyclic compound of an embodiment to emit thermally activated delayed fluorescence. Accordingly, high emission efficiency properties may be achieved.

In addition, the fused polycyclic compound of an embodiment may be included in an organic layer other than the emission layer EML as a material for the organic electroluminescence device 10. For example, the organic electroluminescence device 10 according to an embodiment of the inventive concept may include the fused polycyclic compound in at least one of the organic layers disposed between the first electrode EL1 and the second electrode EL2, or in the capping layer CPL disposed on the second electrode EL2.

The fused polycyclic compound of an embodiment necessarily includes Si as a ring-forming heteroatom which forms a fused ring, and has relatively high lowest triplet excitation energy level (T1 level) when compared with the related art DABNA series compound including only N or B as the ring-forming heteroatom, and accordingly, if utilized as a material for an organic electroluminescence device, the efficiency of the organic electroluminescence device may be further improved.

Hereinafter, the fused polycyclic compound according to an embodiment and the organic electroluminescence device of an embodiment of the inventive concept will be explained referring to embodiments and comparative embodiments. The following embodiments are only illustrations to assist the understanding of the inventive concept, and the scope of the inventive concept is not limited thereto.

EXAMPLES

1. Synthesis of Fused Polycyclic Compounds

First, the synthetic method of the fused polycyclic compounds according to exemplary embodiments will be particularly explained referring to the synthetic methods of Compound 2, Compound 5, Compound 14, Compound 15, and Compound 18. In addition, the synthetic methods of the fused polycyclic compounds explained below are only embodiments, and the synthetic method of the fused polycyclic compound according to an embodiment of the inventive concept is not limited thereto.

(1) Synthesis of Compound 2

Fused Polycyclic Compound 2 according to an embodiment may be synthesized, for example, by Steps [1-1] to [1-6] below.

[1-1] Preparation of bis(2-bromophenyl)amine

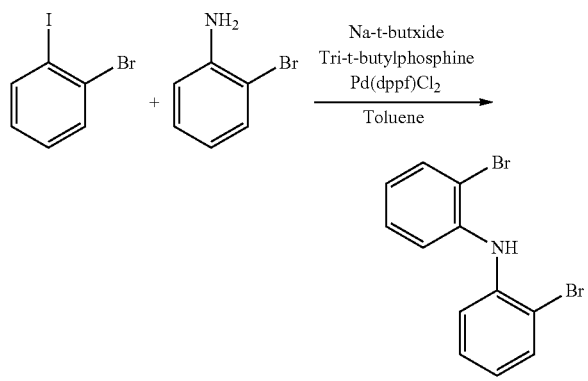

In a well-dried, 500 ml, three-neck round-bottom flask, 2-bromoanilne (15 g, 0.087 mol) and 1-bromo-2-iodobenzene (29.6 g, 0.105 mol) were dissolved in 200 ml of toluene, and then, sodium tert-butoxide (16.76 g, 0.174 mol), Pd(dppf)Cl₂ (12.76 g, 0.017 mol), and Tri-t-butylphosphine (7.98 g, 0.009 mol) were added thereto, followed by refluxing and stirring for about 12 hours. After finishing the reaction, solvents were removed, and extraction utilizing methylene chloride was carried out three times. An extracted organic layer was dried with MgSO₄, and solvents were removed utilizing a rotary evaporator. Then, the crude product thus obtained was separated by column chromatography utilizing n-hexane as the solvent to obtain 18.3 g (yield=64%) of a compound (colorless oil).

[1-2] Preparation of N,N-bis(2-bromophenyl)-N-(4-methoxybenzyl)amine

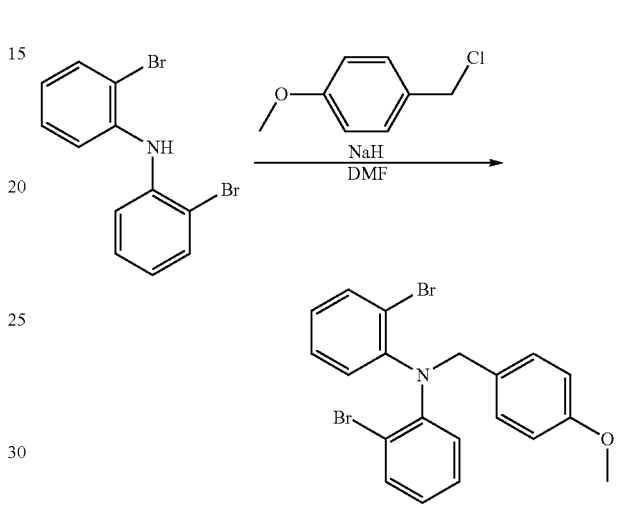

Under a nitrogen atmosphere, to a well-dried, 500 ml, three-neck round-bottom flask, bis(2-bromophenylamine) (39 g, 119.2 mmol), NaH (3.43 g, 143.1 mol) and 250 ml of DMF were put (e.g., added), and stirred at room temperature (about 25° C.) for about 1 hour. Then, 1-(chloromethyl)-4-methoxybenzene (20.54 g, 131.2 mol) was added thereto dropwise, followed by stirring at room temperature for about 14 hours. After finishing the reaction, 500 ml of distilled water was added dropwise to the reaction product, and a precipitated solid was filtered and separated. The solid thus filtered was re-dissolved in methylene chloride and extracted three times. The extracted organic layer was dried with MgSO₄, and solvents were removed utilizing a rotary evaporator. The crude product was separated by column chromatography utilizing a methylene dichloride (MC)/hexane (hex)=3:1 solvent to obtain 46.8 g (yield=87%) of a compound.

[1-3] Preparation of 5-(4-methoxybenzyl)-10,10-diphenyl-5,10-dihydrodibenzo[b,e][1,4]azasiline

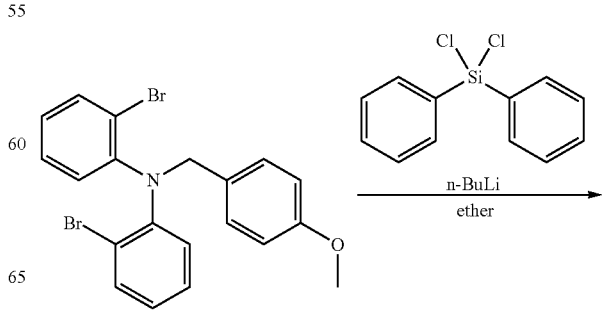

-continued

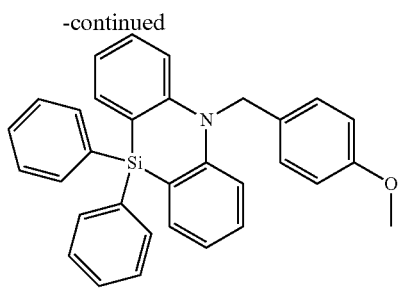

To a well-dried, 150 ml, three-neck round-bottom flask, 2-bromo-N-(2-bromophenyl)-N-(4-methoxybenzyl)aniline (9.00 g, 20.1 mmol) and 60 ml of ether were put (e.g., added) and stirred. The reaction temperature was cooled to about 0° C., and 2.5 M n-BuLi/hex (17.7 ml, 44.2 mmol) was added thereto dropwise. After stirring for about 30 minutes while maintaining the reaction temperature, dichlorodiphenylsilane (5.6 g, 22.1 mmol) dissolved in 20 ml of ether was added thereto dropwise, followed by stirring at room temperature for about 4 hours. After finishing the reaction, solvents were removed, and extraction utilizing ethyl acetate was carried out three times. The extracted organic layer was dried with MgSO$_4$, and solvents were removed utilizing a rotary evaporator. The crude product thus obtained was separated by column chromatography utilizing a methylene dichloride/hexane (3/1) solvent to obtain 7.8 g (yield=75%) of a compound.

[1-4] Preparation of 10,10-diphenyl-5,10-dihydrodibenzo[b,e][1,4]azasiline

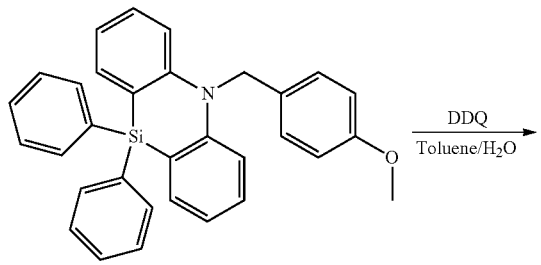

To a well-dried, 150 ml, three-neck round-bottom flask, 5-(4-methoxybenzyl)-10,10-diphenyl-5,10-dihydrodibenzo[b,e][1,4]azasiline (37 g, 78.8 mmol), DDQ (19.67 g, 86.6 mmol), 370 ml of toluene and 37 ml of H$_2$O were added, and stirred at about 80° C. for about 14 hours. After finishing the reaction, solvents were removed, and extraction utilizing ethyl acetate was carried out three times. The extracted organic layer was dried with MgSO$_4$, and solvents were removed utilizing a rotary evaporator. The crude product thus obtained was separated by column chromatography utilizing a hexane/ethyl acetate (EA) (7/1) solvent to obtain 7.5 g (yield=27%) of a compound.

[1-5] Preparation of 5-(2-bromophenyl)-10,10-diphenyl-5,10-dihydrodibenzo[b,e][1,4]azasiline

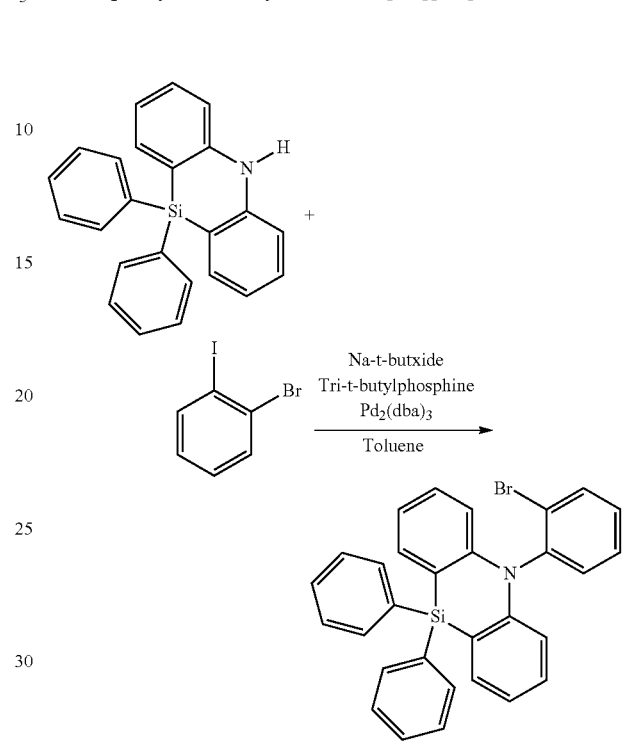

In a well-dried, 250 ml, three-neck round-bottom flask, 10,10-diphenyl-5,10-dihydrodibenzo[b,e][1,4]azasiline (5 g, 0.014 mol) and 1-bromo-2-iodobenzene (4.05 g, 0.014 mol) were dissolved in 130 ml of toluene, and then, sodium tert-butoxide (2.75 g, 0.029 mol), tri-t-butylphosphine (0.29 g, 0.0014 mol), and Pd$_2$(dba)$_3$ (0.65 g, 0.0007 mol) were added thereto followed by refluxing and stirring for about 12 hours. After finishing the reaction, solvents were removed, and extraction utilizing methylene chloride was carried out three times. The extracted organic layer was dried with MgSO$_4$, and solvents were removed utilizing a rotary evaporator. The crude product thus obtained was separated by column chromatography utilizing a MC/hexane solvent to obtain 4 g (yield=55%) of a compound.

[1-6] Preparation of Compound 2

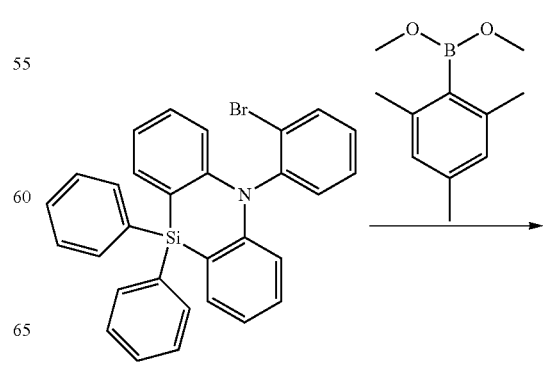

-continued

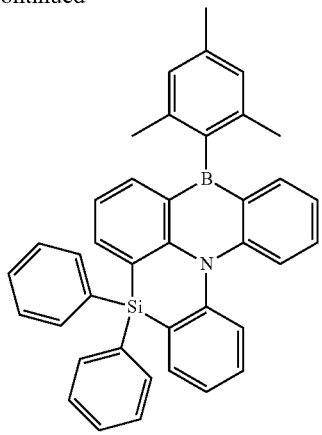

5-(2-bromophenyl)-10,10-diphenyl-5,10-dihydrodibenzo[b,e][1,4]azasiline (1 eq) was dissolved in THF and cooled to about −78° C., and then, n-BuLi (2.2 eq) was slowly added thereto. After stirring for about 2 hours at a low temperature, a solution obtained by diluting dimethyl phenylboronate (2.0 eq) in THF was added to a reaction vessel. After stirring at about −78° C. further for about 1 hour, stirring at room temperature was performed for about 2 hours. Then, the reaction mixture was refluxed and stirred at about 80° C. for about 24 hours and then was poured into a NH₄Cl aqueous solution to finish the reaction. The reaction product was extracted utilizing distilled water and EA three times, dried with MgSO₄, and dried under a reduced pressure. The organic layer thus obtained was separated by column chromatography (MC/hex) to obtain Compound 2 (yield: 15%).

(2) Synthesis of Compound 15

Fused Polycyclic Compound 15 according to an embodiment may be synthesized, for example, by Steps [2-1] to [2-3] below.

[2-1] Preparation of 3-bromo-2-chloro-N,N-diphenylaniline

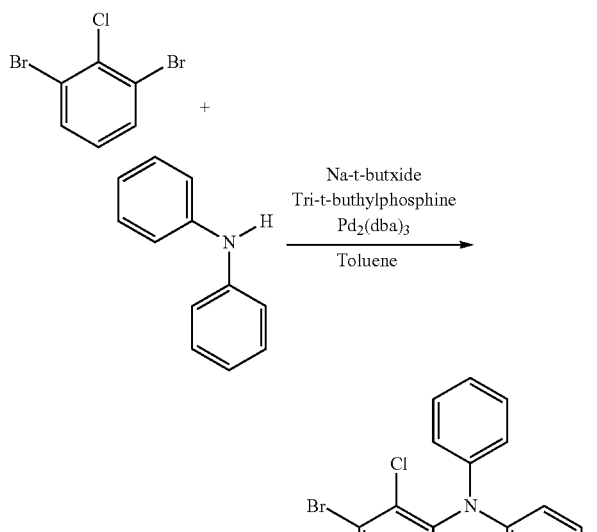

In a well-dried, 250 ml, three-neck round-bottom flask, 1,3-dibromo-2-chlorobenzene (10 g, 0.037 mol) and diphenylamine (6.3 g, 0.037 mol) were dissolved in 130 ml of toluene, and then, sodium tert-butoxide (10.11 g, 0.074 mol), tri-t-butylphosphine (0.75 g, 0.004 mol), and Pd₂(dba)₃ (1.7 g, 0.002 mol) were added thereto, followed by refluxing and stirring for about 12 hours. After finishing the reaction, solvents were removed, and extraction utilizing methylene chloride was carried out three times. The extracted organic layer was dried with MgSO₄, and solvents were removed utilizing a rotary evaporator. Then, the crude product thus obtained was separated by column chromatography utilizing a MC/n-hexane solvent to obtain 5 g (yield=38%) of 3-bromo-2-chloro-N,N-diphenylaniline. [2-2] Preparation of 2-chloro-3-(10,10-diphenyldibenzo[b,e][1,4]azasilin-5(10H)-yl)-N,N-diphenylaniline

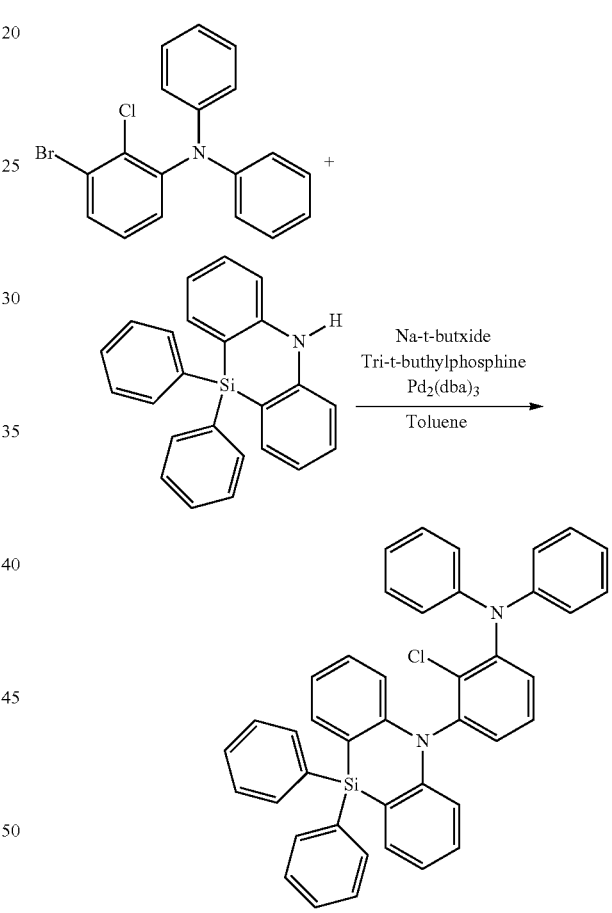

In a well-dried, 250 ml, three-neck round-bottom flask, 3-bromo-2-chloro-N,N-diphenylaniline (5 g, 0.014 mol) and 10,10-diphenyl-5,10-dihydrodibenzo[b,e][1,4]azasiline (4.87 g, 0.014 mol) were dissolved in 70 ml of toluene, and then, sodium tert-butoxide (2.7 g, 0.028 mol), tri-t-butylphosphine (0.3 g, 0.001 mol), and Pd₂(dba)₃ (0.64 g, 0.0007 mol) were added thereto followed by refluxing and stirring for about 12 hours. After finishing the reaction, solvents were removed, and extraction utilizing methylene chloride was carried out three times. The extracted organic layer was dried with MgSO₄, and solvents were removed utilizing a rotary evaporator. The crude product was separated by column chromatography utilizing a MC/hexane solvent to obtain 5 g (yield=57%) of 3-bromo-2-chloro-N,N-diphenylaniline.

[2-3] Preparation of Compound 15

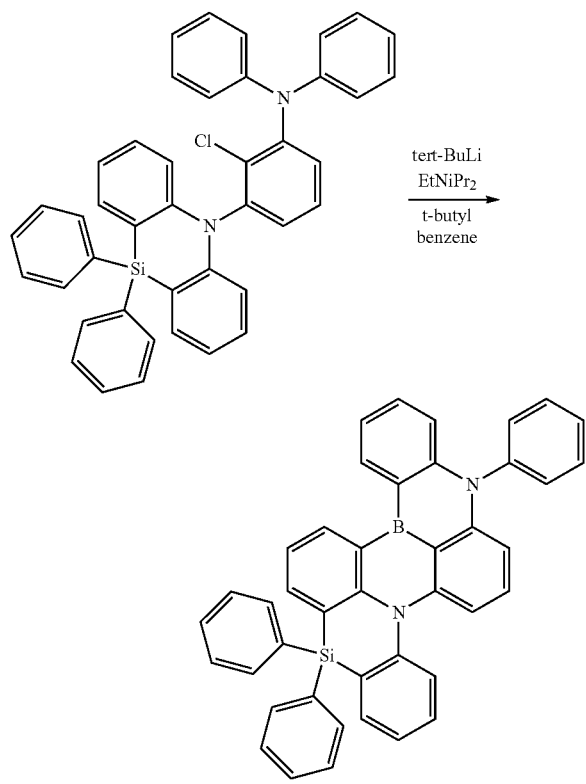

To a flask including 2-chloro-3-(10,10-diphenyldibenzo[b,e][1,4]azasilin-5(10H)-yl)-N,N-diphenylaniline and tert-butylbenzene (150 ml), 1.7 M tert-butyllithium pentane solution (27.6 ml) was added under a nitrogen atmosphere at about −30° C. After finishing dropwise addition, the temperature was increased to about 60° C. and stirring was performed for about 2 hours. Then, a component having a boiling point lower than that of tert-butylbenzene was removed by distillation under a reduced pressure. The temperature was cooled to about −30° C., boron tribromide (5.1 ml) was added thereto, followed by elevating the temperature to room temperature and stirring for about 0.5 hours. After that, the temperature was cooled to about 0° C. and N,N-diisopropylethylamine (15.6 ml) was added thereto. Stirring was performed until heat is cooled, and the temperature was elevated to about 120° C. and heating and stirring were performed for about 3 hours. The reaction solution was cooled to room temperature, extracted with cooled sodium acetate aqueous solution, and separated utilizing a column. A solid obtained by removing solvents by distilling under a reduced pressure was dissolved in toluene and recrystallized by adding hexane to obtain Compound 15 (6.0 g).

2. Manufacture and Evaluation of Organic Electroluminescence Device Including Fused Polycyclic Compound
(Manufacture of Organic Electroluminescence Device)

An organic electroluminescence device of an embodiment including the fused polycyclic compound of an embodiment in an emission layer was manufactured by a method described below. Organic electroluminescence devices of Examples 1 to 5 were each manufactured utilizing the fused polycyclic compounds of Compound 2, Compound 5, Compound 14, Compound 15, and Compound 18 as respective dopant materials for an emission layer. The organic electroluminescence device of Comparative Example 1 was manufactured utilizing Comparative Compound C1 as a dopant material in an emission layer.

On a glass substrate, ITO with a thickness of about 1,200 Å was patterned and washed with isopropyl alcohol and ultra-pure water, washed utilizing ultrasonic waves, exposed to UV for about 30 minutes and treated with ozone. Then, NPD was deposited to a thickness of about 300 Å to form a hole injection layer, and TCTA was deposited to a thickness of about 200 Å and CzSi was deposited to a thickness of about 100 Å to form a hole transport layer.

On the hole transport layer, DPEPO and the respective fused polycyclic compound of an embodiment of the inventive concept or Comparative Compound C1 were co-deposited in a ratio of 90:10 to form an emission layer with a thickness of about 200 Å. That is, the emission layer formed by co-deposition, was formed by mixing Compound 2, Compound 5, Compound 14, Compound 15 and Compound 18 respectively with DPEPO and depositing the mixture in Example 1 to Example 5, or by mixing Comparative Compound C1 with DPEPO and depositing the mixture in Comparative Example 1.

On the emission layer, an electron transport layer was formed utilizing DPEPO to a thickness of about 200 Å, and then, an electron injection layer was formed by depositing TPBi to a thickness of about 300 Å and LiF to a thickness of about 10 Å in the stated order. Then, a second electrode was formed utilizing aluminum (Al) to a thickness of about 3,000 Å on the electron injection layer.

Compounds utilized in Example 1 to Example 5 and Comparative Example 1 are listed in Table 1 below.

TABLE 1

| Compound 2 | 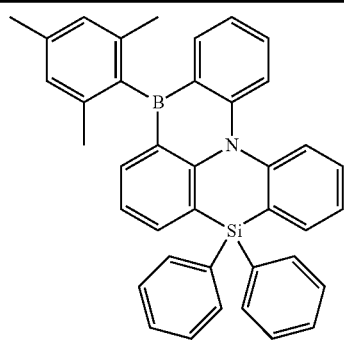 |
|---|---|

TABLE 1-continued
Compound 5
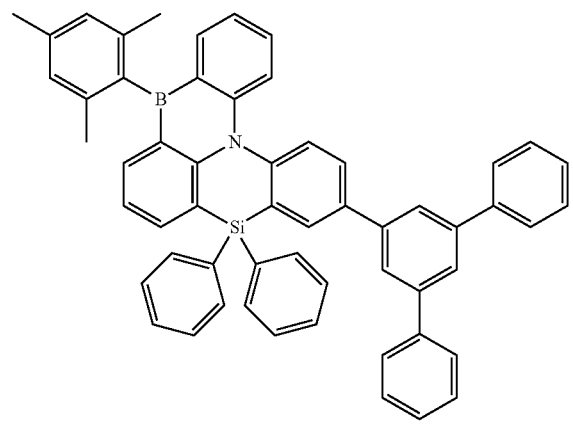
5
Compound 14
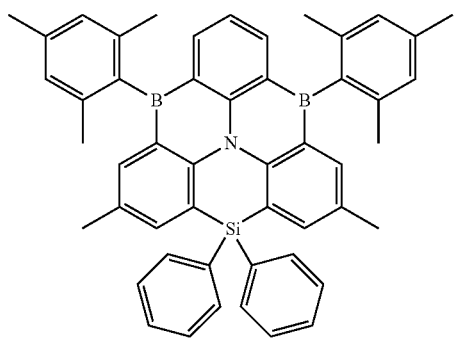
14
Compound 15
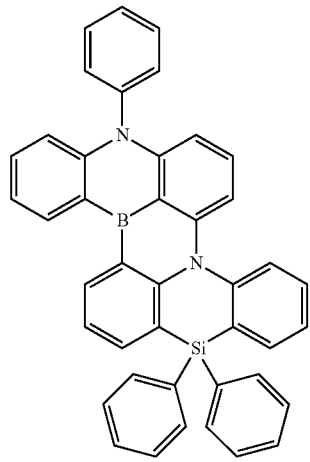
15

TABLE 1-continued
Compound 18
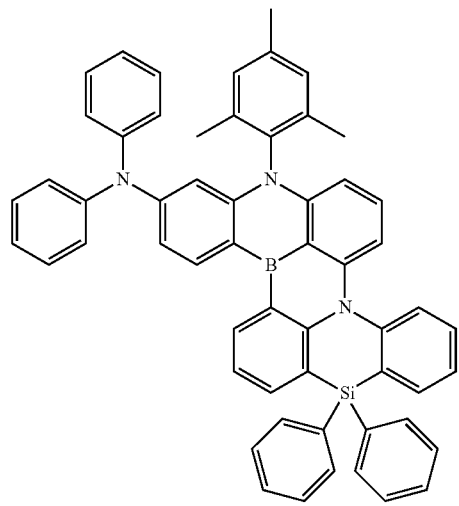
18
Comparative Compound C1
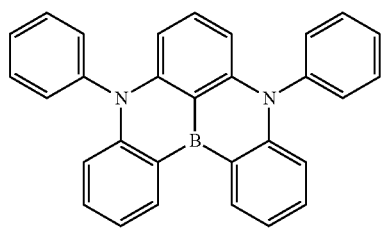
C1
In addition, other compounds utilized for the manufacture of the organic electroluminescence devices of the Examples and the Comparative Example 1 are shown below.
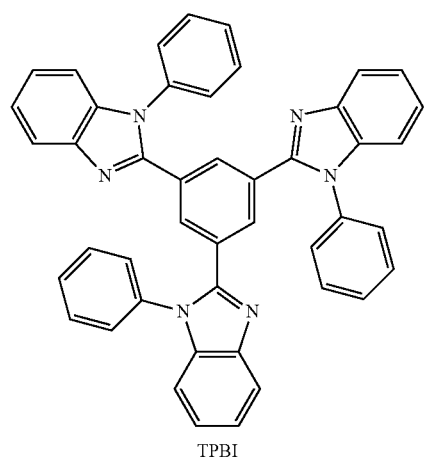
TPBI
-continued
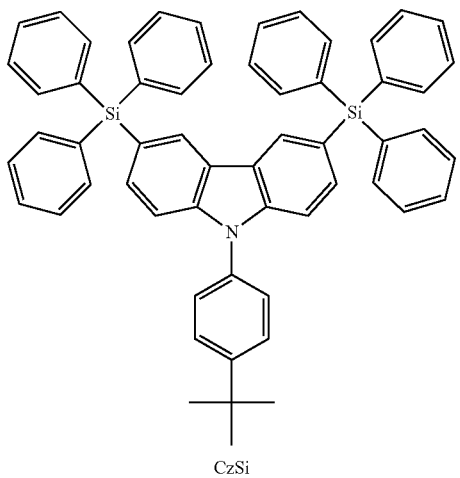
CzSi

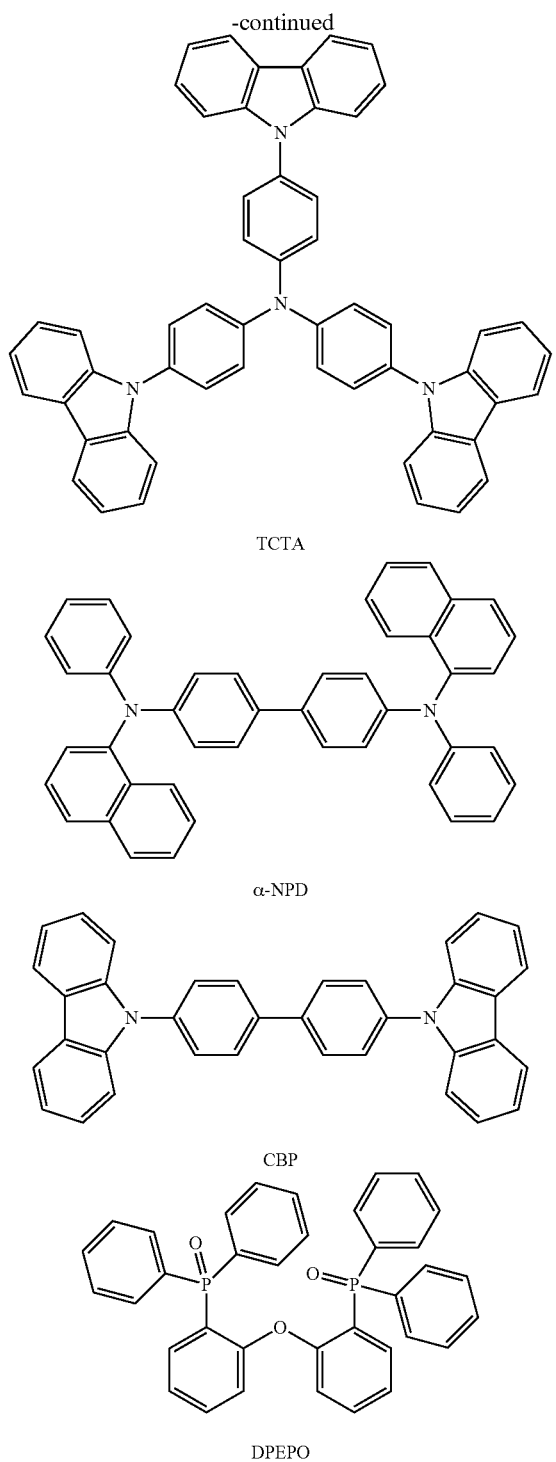

TCTA

α-NPD

CBP

DPEPO (Evaluation of Properties of Organic Electroluminescence Device)

In Table 2, the evaluation results on the organic electroluminescence devices of Example 1 to Example 5 and Comparative Example 1 are shown. In Table 2, the driving voltage, emission efficiency and external quantum efficiency (EQE) of the organic electroluminescence devices thus manufactured are compared and shown.

In the evaluation results of the properties on the Examples and the Comparative Example, as shown in Table 2, a voltage and current density were measured utilizing a source meter (Keithley Instrument Co., SMU 236). The emission efficiency represents a current efficiency value with respect to current density of 10 mA/cm$^2$.

TABLE 2

| Device manufacturing example | Emission layer dopant material | Driving voltage (V) | Emission efficiency (cd/A) | EQE (%) |
|---|---|---|---|---|
| Example 1 | Compound 2 | 5.5 | 16.8 | 20.4 |
| Example 2 | Compound 5 | 5.0 | 24.2 | 248 |
| Example 3 | Compound 14 | 4.9 | 22.6 | 231 |
| Example 4 | Compound 15 | 5.1 | 20.5 | 22.3 |
| Example 5 | Compound 18 | 5.3 | 18.9 | 22.9 |
| Comparative Example | Comparative Compound C1 | 5.5 | 13.3 | 15 |

Referring to the results in Table 2, the organic electroluminescence devices according to the Examples utilizing the fused polycyclic compound according to an embodiment of the inventive concept as a material for an emission layer, were found to show similar driving voltage values and relatively higher emission efficiency and external quantum efficiency when compared with the Comparative Example.

In case of the Example compounds, TADF properties were shown utilizing multiple resonance phenomenon by aromatic rings (which form a fused ring), and may have high rigidity and bulkiness by including Si as a ring-forming heteroatom (which forms the fused ring) when compared with the Comparative Compound C1. Accordingly, the organic electroluminescence devices of the Examples may show improved emission efficiency than the organic electroluminescence device of the Comparative Example.

The fused polycyclic compound of an embodiment includes a fused ring structure including Si as a ring-forming heteroatom, and has a high T1 level and a small $\Delta E_{ST}$ value, and thus, may be utilized as a delayed fluorescence emission material. In addition, the fused polycyclic compound of an embodiment may be utilized as the dopant material of an emission layer in an organic electroluminescence device to improve device efficiency. In addition, the fused polycyclic compound of an embodiment includes a fused ring structure including Si as a ring-forming heteroatom, and may show high rigidity and long life characteristics.

The organic electroluminescence device of an embodiment includes the fused polycyclic compound of an embodiment and may show improved emission efficiency. In addition, the organic electroluminescence device of an embodiment includes the fused polycyclic compound of an embodiment as a material for an emission layer, and may accomplish high emission efficiency in a blue light wavelength region.

The organic electroluminescence device according to an embodiment may show improved device characteristics with a decreased driving voltage and high efficiency.

The fused polycyclic compound of an embodiment may be included in an emission layer of an organic electroluminescence device and may contribute to increasing the efficiency of the organic electroluminescence device.

Expressions such as "at least one of" or "at least one selected from" when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration. As used herein, the term "substantially," "about," and similar terms are used as terms of approximation and not as terms of degree, and are intended to account for the inherent deviations in measured or calculated values that would be recognized by those of ordinary skill in the art. Moreover, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, or 35 U.S.C. § 112(a), and 35 U.S.C. § 132(a).

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed, and equivalents thereof.

What is claimed is:

1. An organic electroluminescence device, comprising:
a first electrode;
a second electrode opposite to the first electrode; and
a plurality of organic layers between the first electrode and the second electrode,
wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, or a compound of two or more selected from them, a mixture of two or more selected from them, or oxides thereof,
wherein at least one organic layer from among the plurality of organic layers comprises the fused polycyclic compound

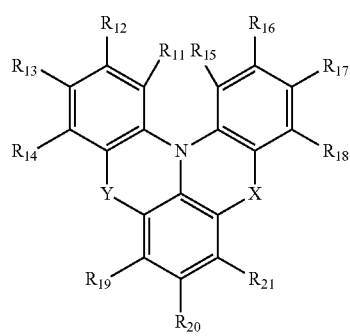

Formula 1 wherein in Formula 1,
one selected from X and Y is $BR_a$ or $P(=O)R_b$, and an other one selected from X and Y is $SiR_cR_d$, $R_a$ to $R_d$ are each independently a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_a$ to $R_d$ are optionally combined with an adjacent group to form a ring, and $R_{11}$ to $R_{21}$ are each independently a hydrogen atom, a deuterium atom, a halogen atom, a boron group, a phosphine oxide group, a cyano group, a substituted or unsubstituted amine group, a substituted or unsubstituted silyl group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{11}$ to $R_{21}$ are optionally combined with an adjacent group to form a ring, with the proviso that when the fused polycyclic compound is represented by Formula 1-3 and $X_{13}$ of Formula 1-3 is B, then $R_{17}$ of Formula 1-3 is a substituted or unsubstituted amine group, or one of $R_m$ in a number of m is a carbazole group, or two adjacent $R_m$s are combined to form a spiro structure in Formula 1-3:

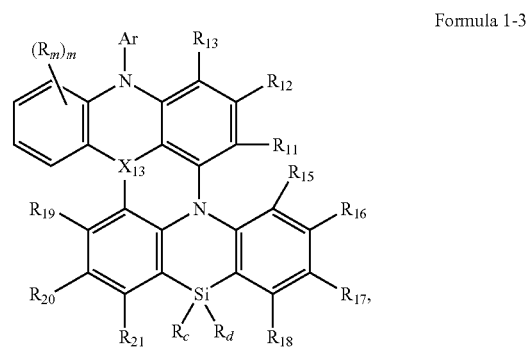

Formula 1-3 wherein in Formula 1-3, $R_{11}$ to $R_{13}$, $R_{15}$ to $R_{21}$, $R_c$, and $R_d$ are the same as respectively defined in association with Formula 1, $R_m$ is a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, or optionally combined with an adjacent group to form a ring, m is an integer of 0 to 4, and Ar is a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring.

2. The organic electroluminescence device of claim 1, wherein
the plurality of organic layers comprises:
a hole transport region on the first electrode;
an emission layer on the hole transport region; and
an electron transport region on the emission layer, and the emission layer comprises the fused polycyclic compound represented by Formula 1.

3. The organic electroluminescence device of claim 2, wherein the emission layer is to emit delayed fluorescence.

4. The organic electroluminescence device of claim 2, wherein
the emission layer is a delayed fluorescence emission layer comprising a host and a dopant, and
the dopant comprises the fused polycyclic compound represented by Formula 1.

5. The organic electroluminescence device of claim 2, wherein the emission layer comprises:
a host having a first lowest triplet excitation energy level;
a first dopant having a second lowest triplet excitation energy level lower than the first lowest triplet excitation energy level; and
a second dopant having a third lowest triplet excitation energy level lower than the second lowest triplet excitation energy level, and
the first dopant comprises the fused polycyclic compound represented by Formula 1.

6. The organic electroluminescence device of claim 5, wherein
the first dopant is a delayed fluorescence dopant, and
the second dopant is a fluorescence dopant.

7. The organic electroluminescence device of claim 1, wherein
the fused polycyclic compound represented by Formula 1 is represented by any one from among the following Formula 1-1 to Formula 1-3:

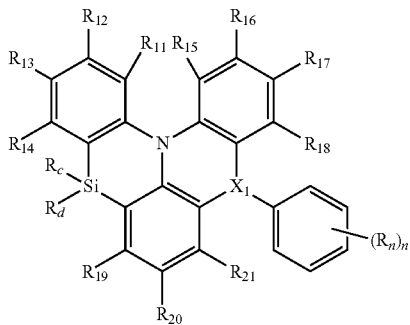

Formula 1-1

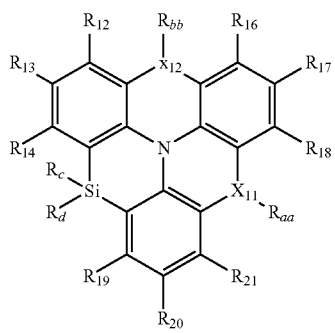

Formula 1-2

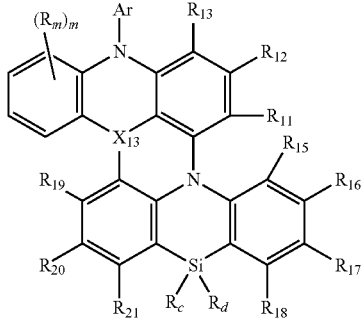

Formula 1-3 wherein in Formula 1-1 to Formula 1-3,
$R_1$ to $R_{21}$, $R_c$, and $R_d$ are the same as respectively defined in association with Formula 1,
$X_1$, $X_{11}$, $X_{12}$, and $X_{13}$ are each independently B or P(=O),
$R_n$ and $R_m$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_n$ and $R_m$ are optionally combined with an adjacent group to form a ring,
n is an integer of 0 to 5,
m is an integer of 0 to 4,
$R_{aa}$ and $R_{bb}$ are each independently a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{aa}$ and $R_{bb}$ are optionally combined with an adjacent group to form a ring, and
Ar is a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring,
with the proviso that when the fused polycyclic compound is represented by Formula 1-3 and $X_{13}$ of Formula 1-3 is B, then $R_{17}$ of Formula 1-3 is a substituted or unsubstituted amine group, or one of $R_m$ in a number of m is a carbazole group, or two adjacent $R_m$s are combined to form a spiro structure in Formula 1-3.

8. The organic electroluminescence device of claim 7, wherein $X_1$ in Formula 1-1 is P(=O), and n is 0.

9. The organic electroluminescence device of claim 7, wherein $X_{11}$ and $X_{12}$ in Formula 1-2 are the same.

10. The organic electroluminescence device of claim 7, wherein
in Formula 1-2, in case where $X_{11}$ and $X_{12}$ are each B, $R_{aa}$ and $R_{bb}$ are each independently a substituted or unsubstituted phenyl group, and
in case where $X_{11}$ and $X_{12}$ are each P(=O), $R_{aa}$ and $R_{bb}$ are each independently an unsubstituted phenyl group.

11. The organic electroluminescence device of claim 1, wherein $R_c$ and $R_d$ are each independently an unsubstituted phenyl group.

12. The organic electroluminescence device of claim 1, wherein the fused polycyclic compound represented by Formula 1 comprises at least one selected from compounds in the following Compound Group 1:
Compound Group 1
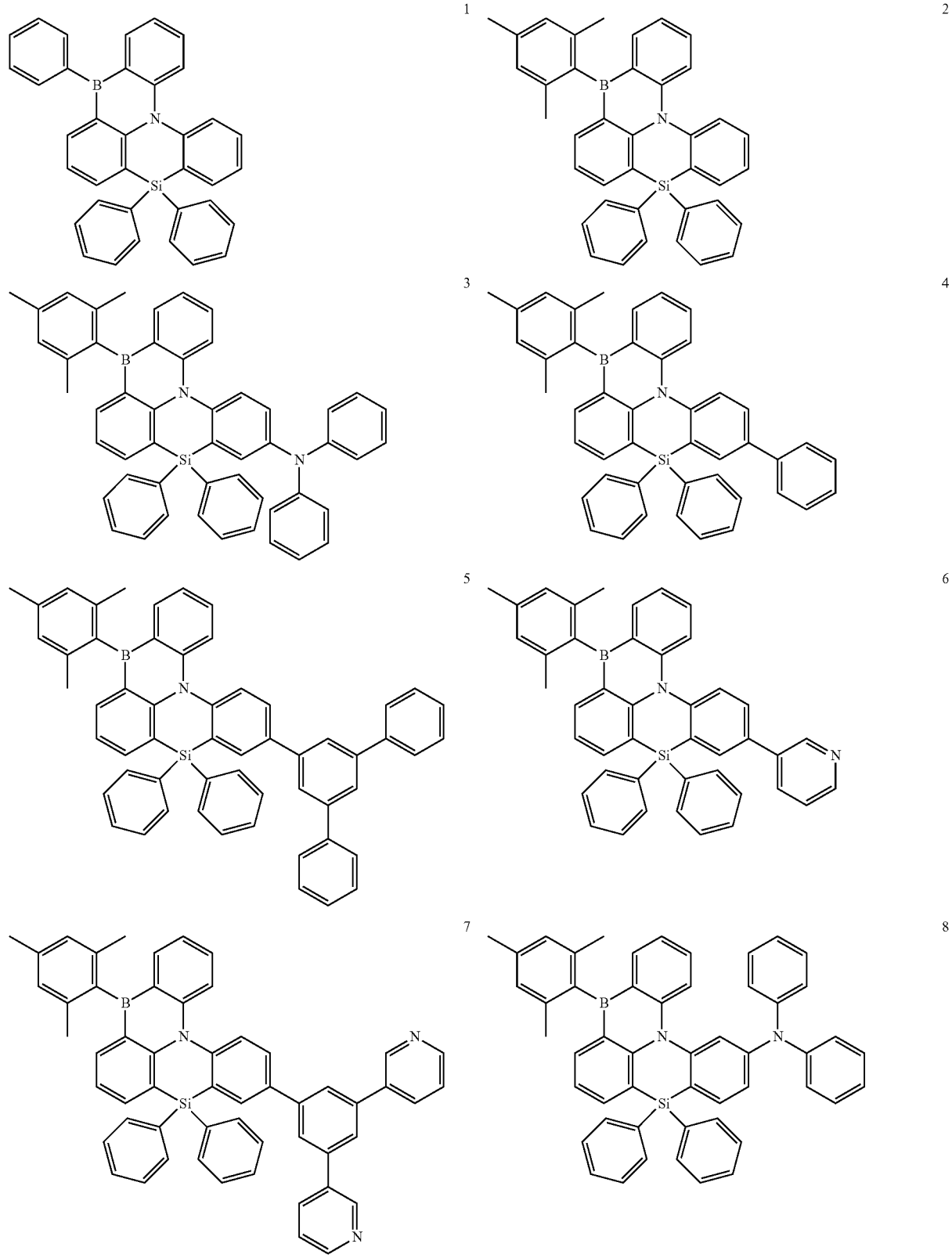

-continued
9
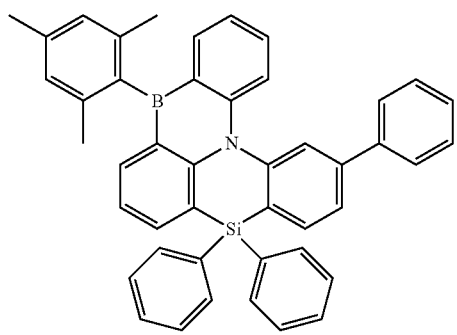
10
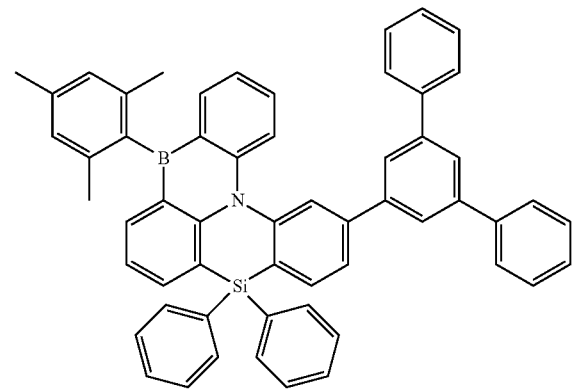
11
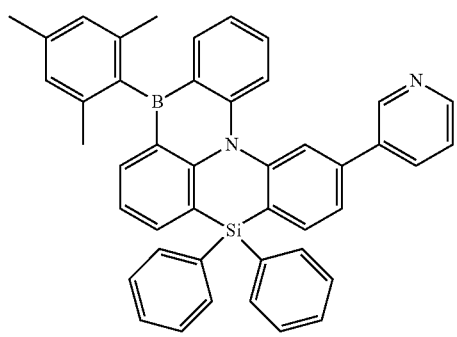
12
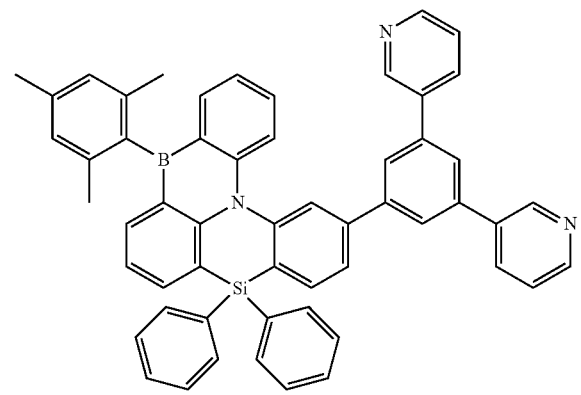
13
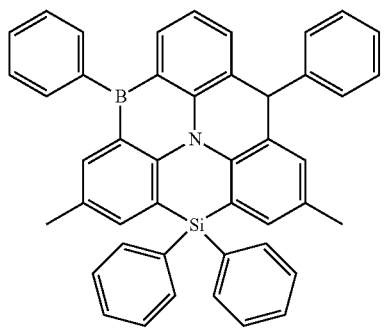
14
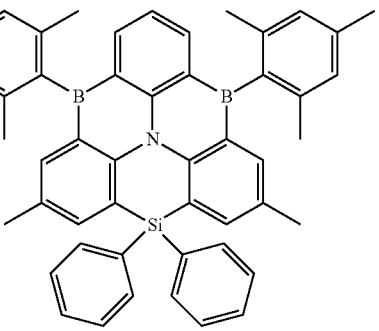
16
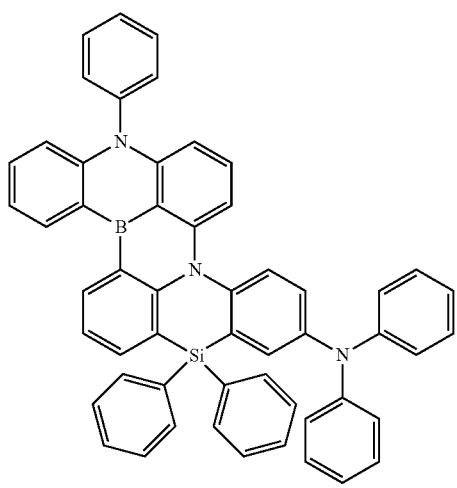
19
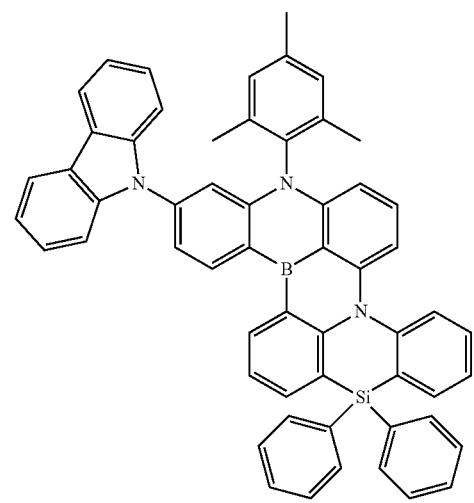

-continued
20
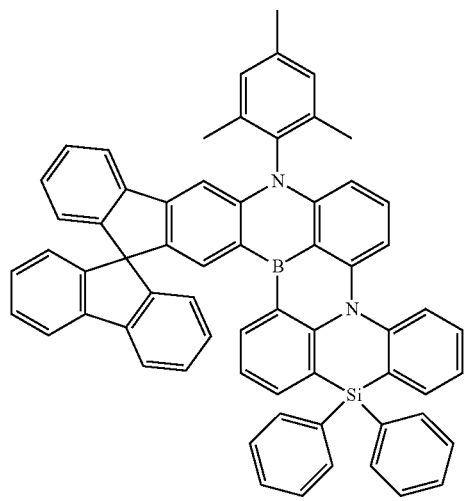
21
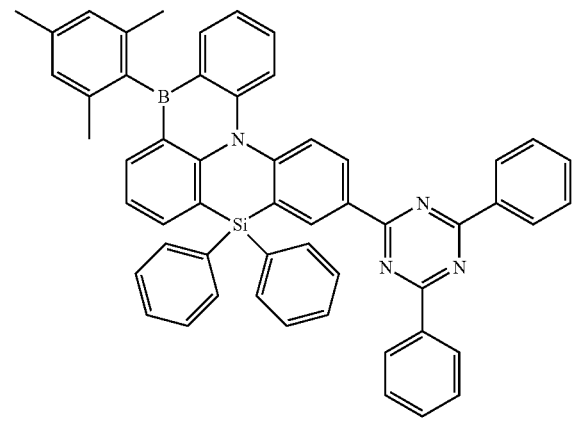
22
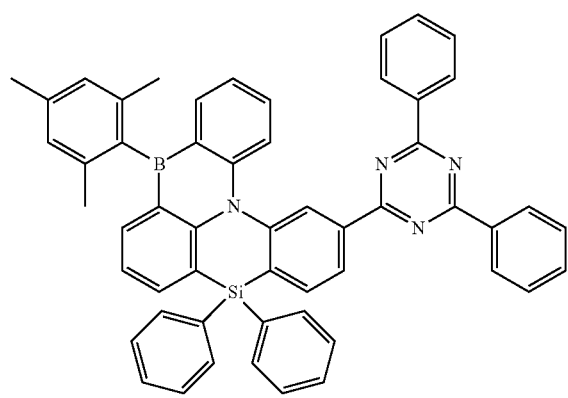
23
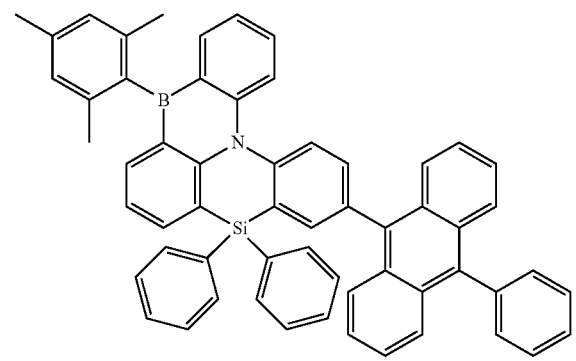
24
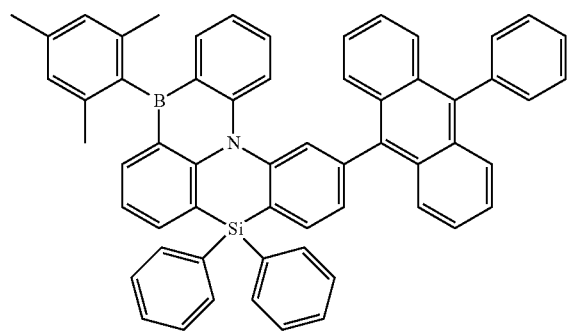
25
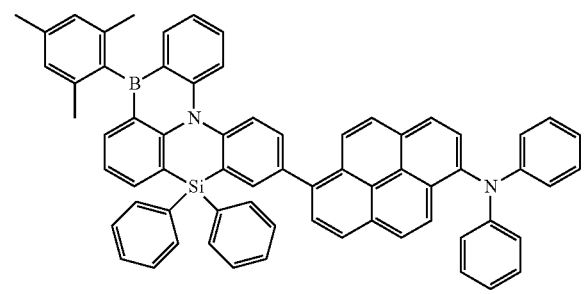

-continued
26
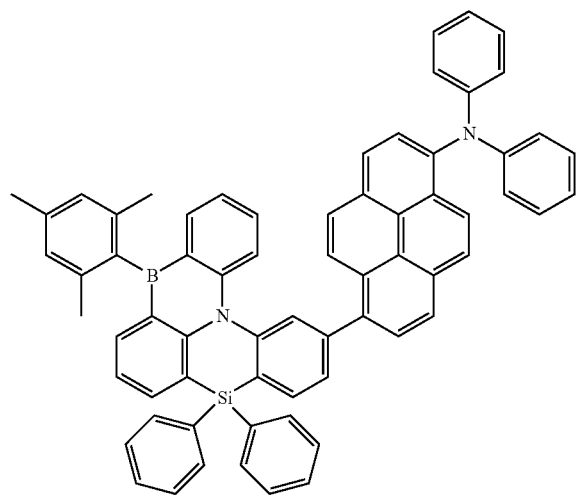
27
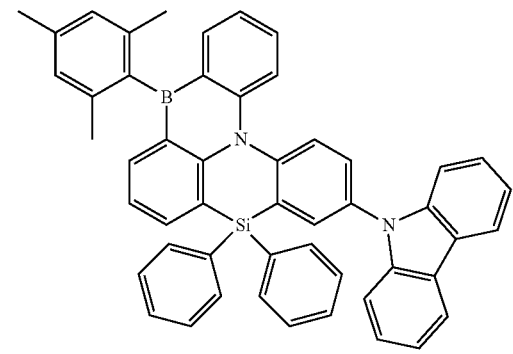
28
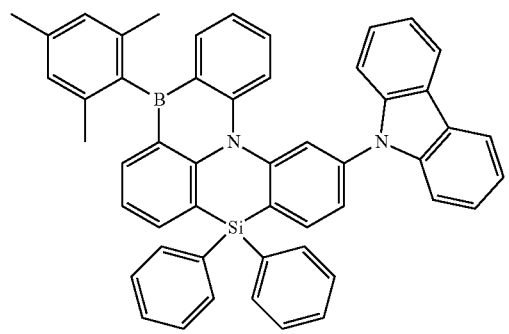
29
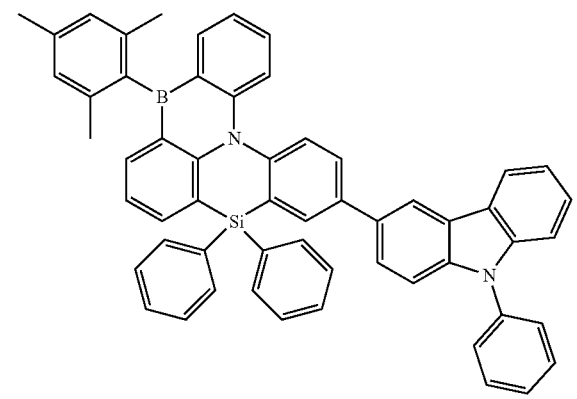
30
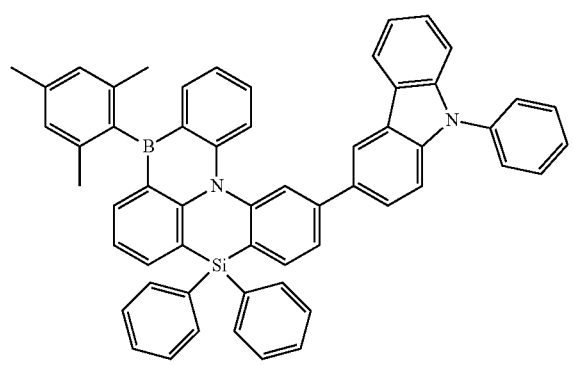
31
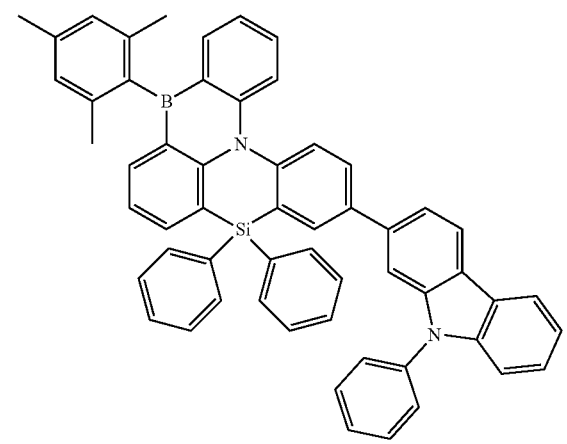

-continued
32
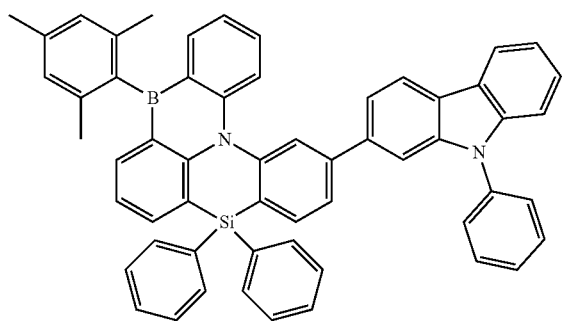
33
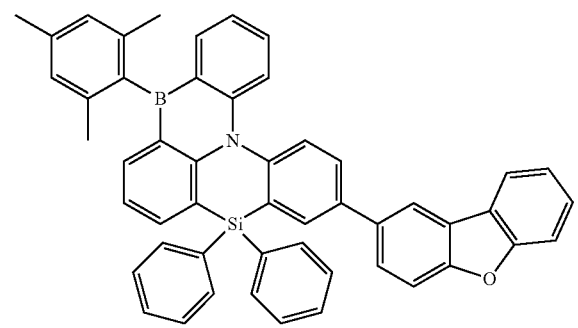
34
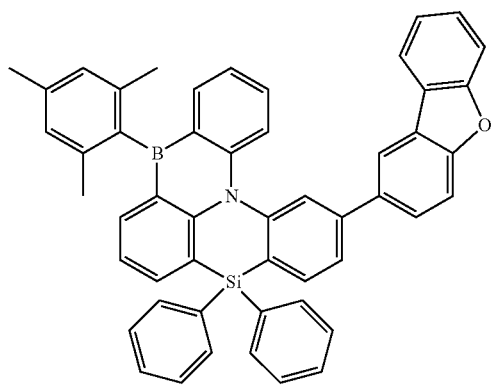
35
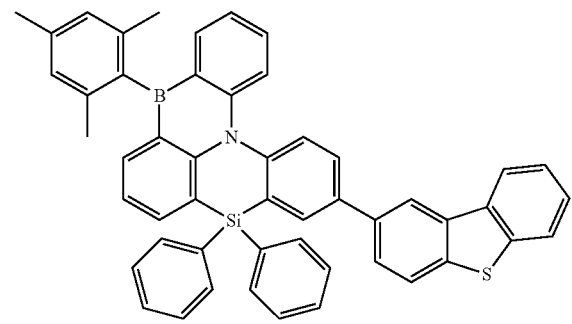
36
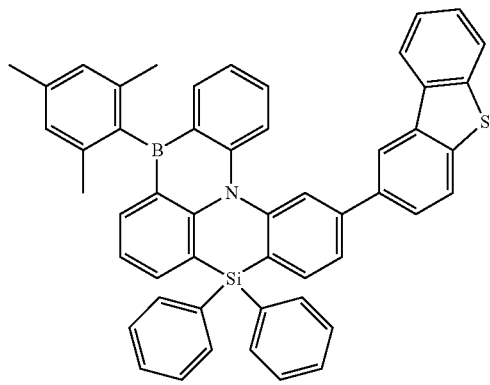
37
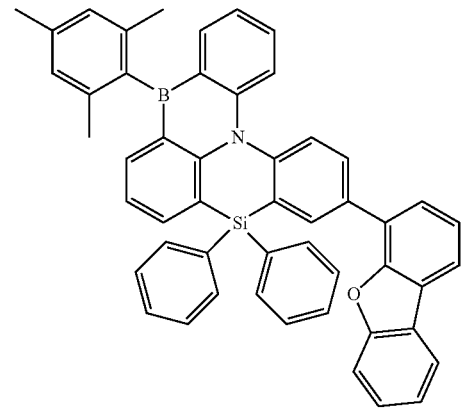
38
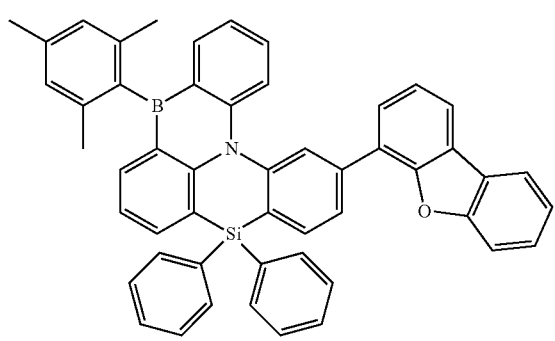
39
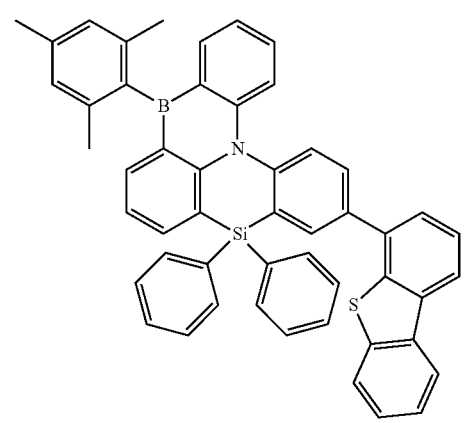

-continued
40
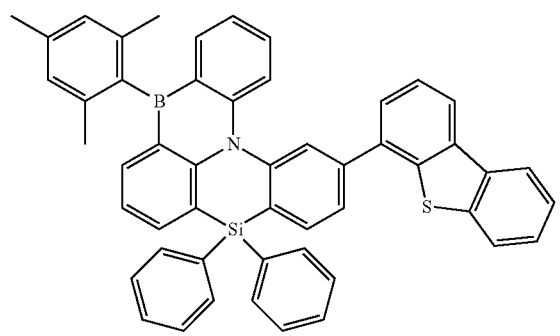
41
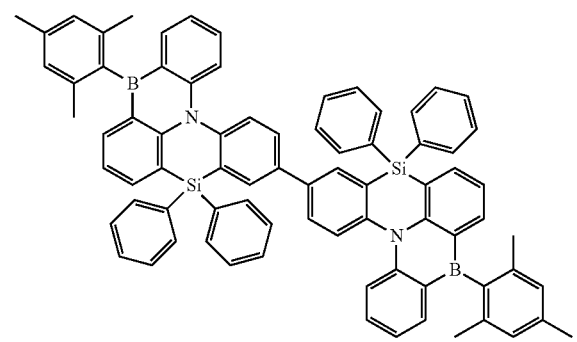
42
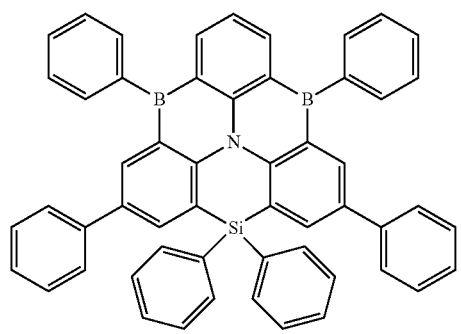
43
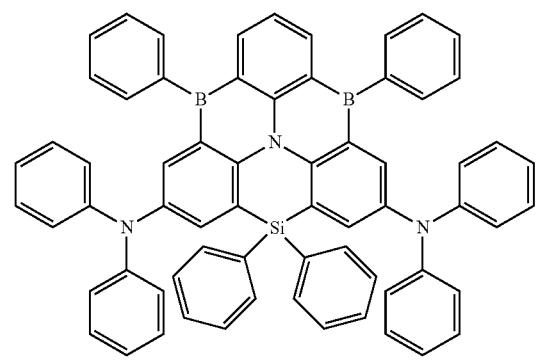
44
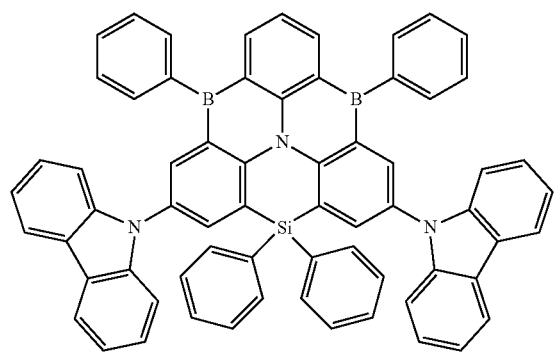
45
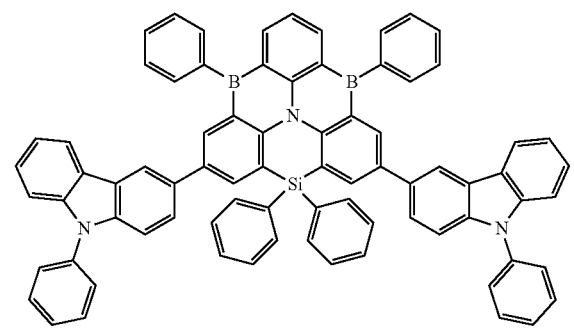
46
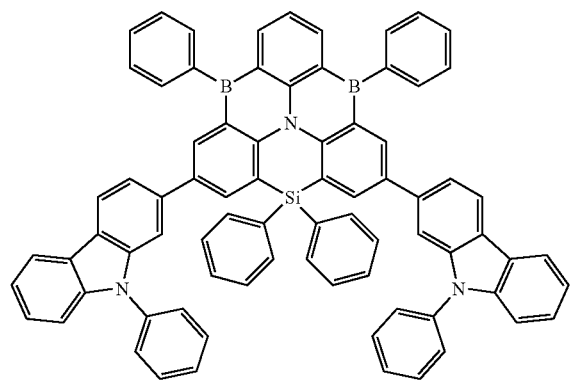
47
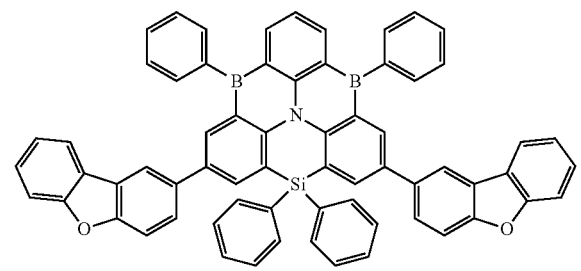

-continued
48
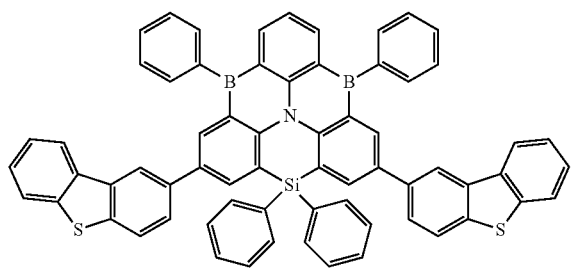
49
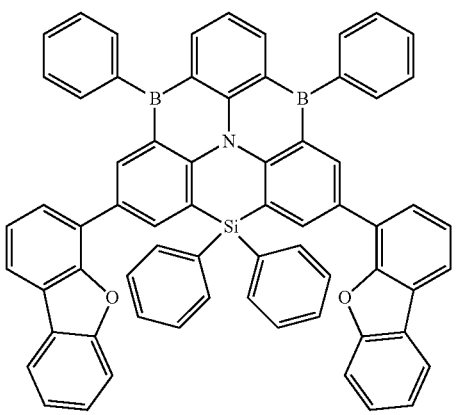
50
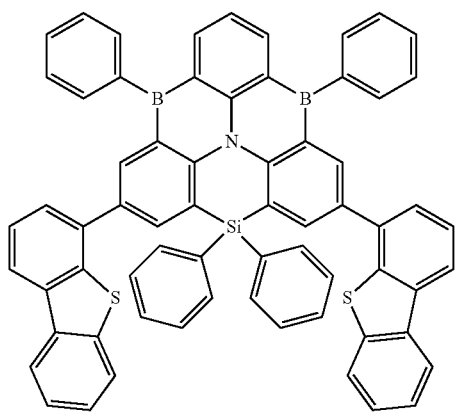
51
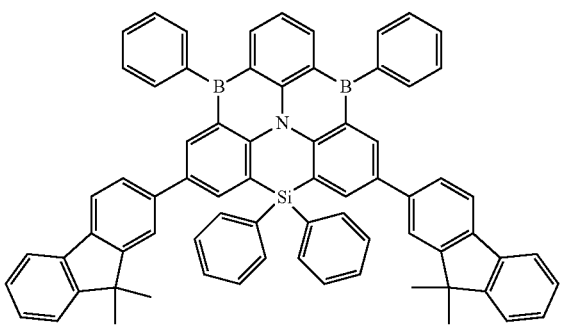
52
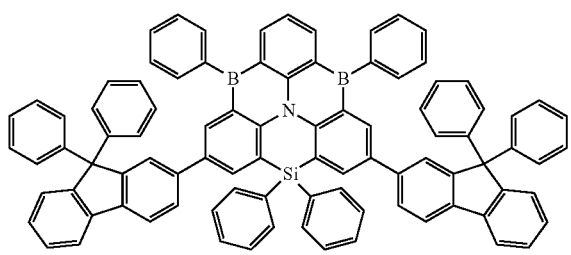
53
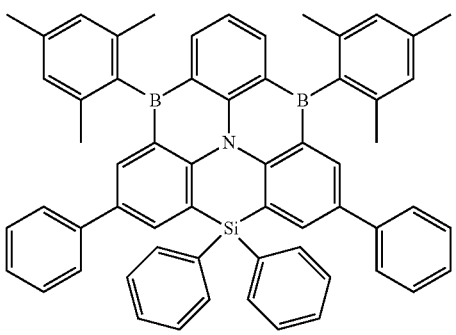
54
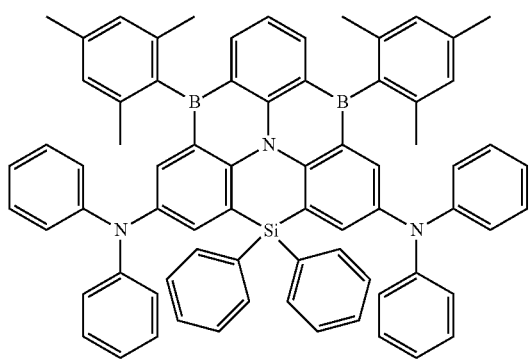
55
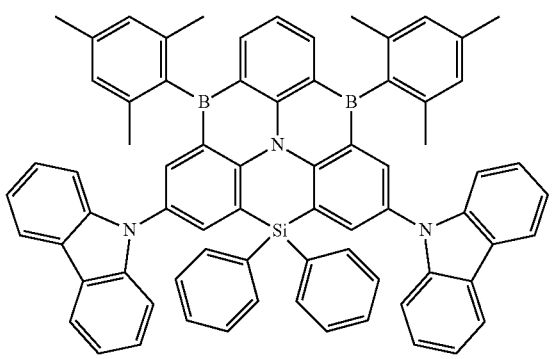

-continued
56
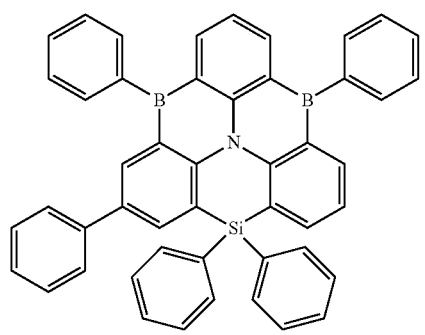
57
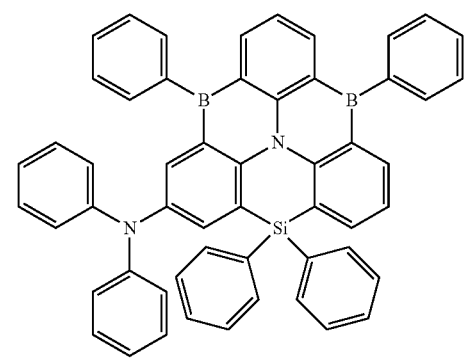
58
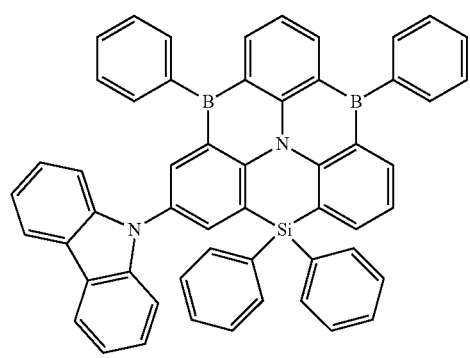
59
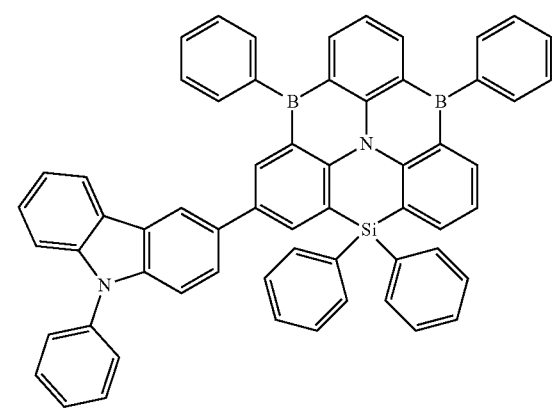
60
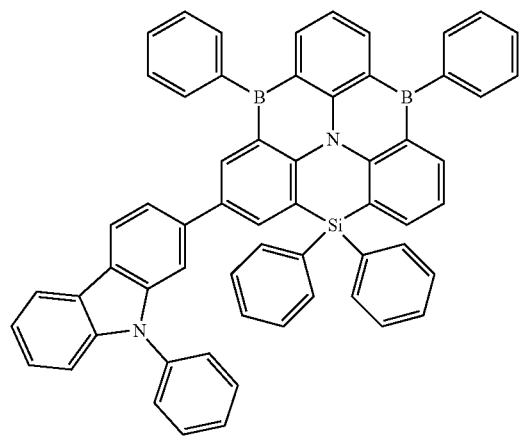
61
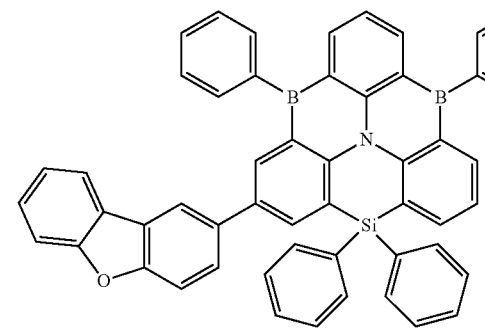
62
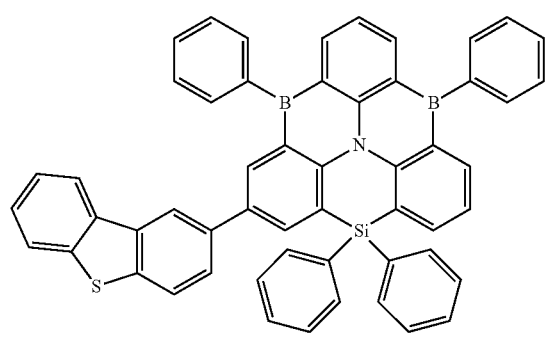
63
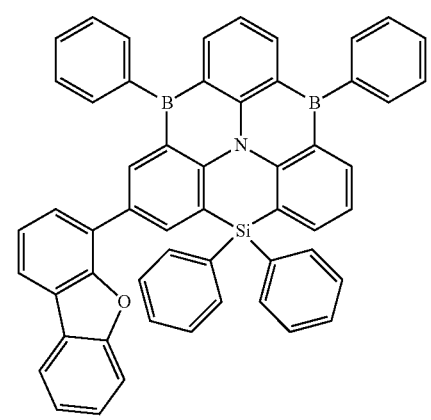

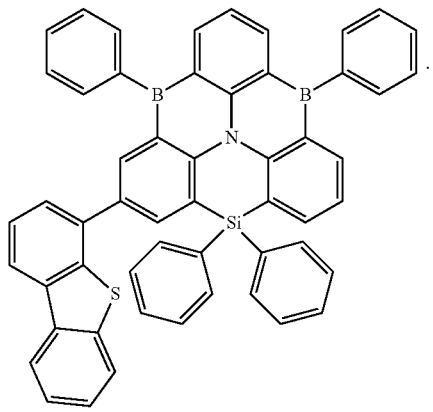

13. A fused polycyclic compound represented by the following Formula 1:

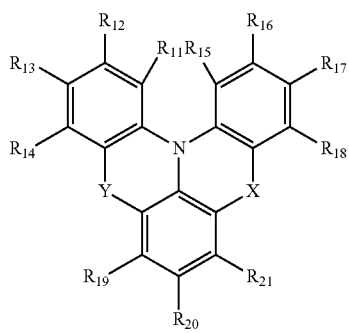

wherein in Formula 1, one selected from X and Y is $BR_a$ or $P(=O)R_b$, and an other one selected from X and Y is $SiR_cR_d$, $R_a$ to $R_d$ are each independently a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_a$ to $R_d$ are optionally combined with an adjacent group to form a ring, and $R_{11}$ to $R_{21}$ are each independently a hydrogen atom, a deuterium atom, a halogen atom, a boron group, a phosphine oxide group, a cyano group, a substituted or unsubstituted amine group, a substituted or unsubstituted silyl group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{11}$ to $R_{21}$ are optionally combined with an adjacent group to form a ring, with the proviso that when the fused polycyclic compound is represented by Formula 1-3 and $X_{13}$ of Formula 1-3 is B, then $R_{17}$ of Formula 1-3 is a substituted or unsubstituted amine group, or one of $R_m$ in a number of m is a carbazole group, or two adjacent $R_m$s are combined to form a spiro structure in Formula 1-3:

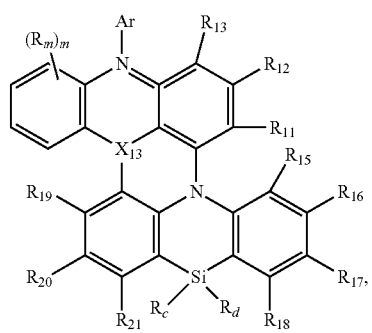

wherein in Formula 1-3, $R_{11}$ to $R_{13}$, $R_{15}$ to $R_{21}$, $R_c$, and $R_d$ are the same as respectively defined in association with Formula 1, $R_m$ is a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, or optionally combined with an adjacent group to form a ring, m is an integer of 0 to 4, and Ar is a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring.

14. The fused polycyclic compound of claim 13, wherein the fused polycyclic compound represented by Formula 1 has an absolute value of a difference between a lowest singlet excitation energy level (S1) and a lowest triplet excitation energy level (T1) of about 0.1 eV or less.

15. The fused polycyclic compound of claim 13, wherein the fused polycyclic compound represented by Formula 1 is represented by any one from among the following Formula 1-1 to Formula 1-3:

Formula 1-1

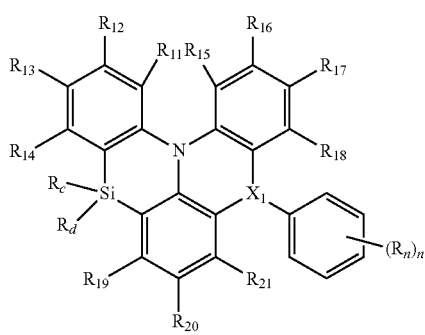

Formula 1-2

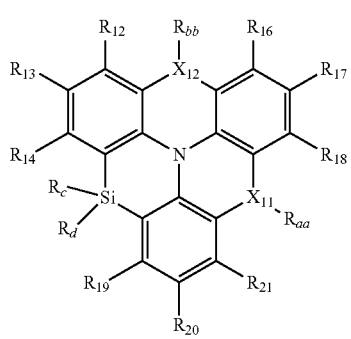

Formula 1-3

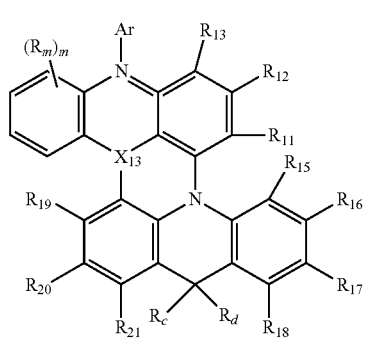

wherein in Formula 1-1 to Formula 1-3, $R_1$ to $R_{21}$, $R_c$, and $R_d$ are the same as respectively defined in association with Formula 1, $X_1$, $X_{11}$, $X_{12}$, and $X_{13}$ are each independently B or P(=O), $R_n$ and $R_m$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_n$ and $R_m$ are optionally combined with an adjacent group to form a ring, n is an integer of 0 to 5, m is an integer of 0 to 4, $R_{aa}$ and $R_{bb}$ are each independently a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{aa}$ and $R_{bb}$ are optionally combined with an adjacent group to form a ring, and Ar is a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, with the proviso that when the fused polycyclic compound is represented by Formula 1-3 and $X_{13}$ of Formula 1-3 is B, then $R_{17}$ of Formula 1-3 is a substituted or unsubstituted amine group, or one of $R_m$ in a number of m is a carbazole group, or two adjacent $R_m$s are combined to form a spiro structure in Formula 1-3.

16. The fused polycyclic compound of claim 15, wherein $X_1$ in Formula 1-1 is P(=O), and n is 0.

17. The fused polycyclic compound of claim 15, wherein $X_{11}$ and $X_{12}$ in Formula 2 are the same.

18. The fused polycyclic compound of claim 15, wherein in Formula 1-2, in case where $X_{11}$ and $X_{12}$ are each B, $R_{aa}$ and $R_{bb}$ are each independently a substituted or unsubstituted phenyl group, and in case where $X_{11}$ and $X_{12}$ are each P(=O), $R_{aa}$ and $R_{bb}$ are each independently an unsubstituted phenyl group.

19. The fused polycyclic compound of claim 13, wherein $R_c$ and $R_d$ are each independently an unsubstituted phenyl group.

20. The fused polycyclic compound of claim 13, wherein the fused polycyclic compound represented by Formula 1 is any one selected from compounds in the following Compound Group 1:

Compound Group 1

1

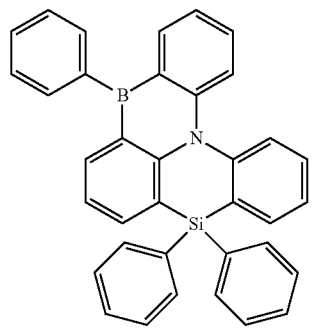

2

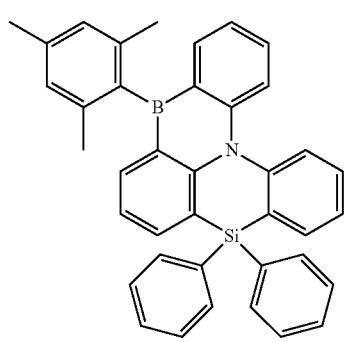

73
-continued
3
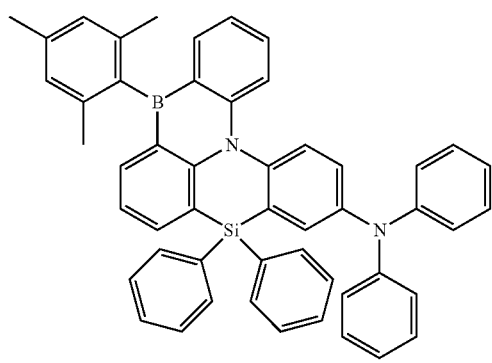
4
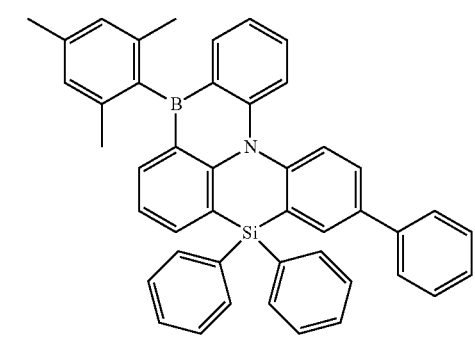
5
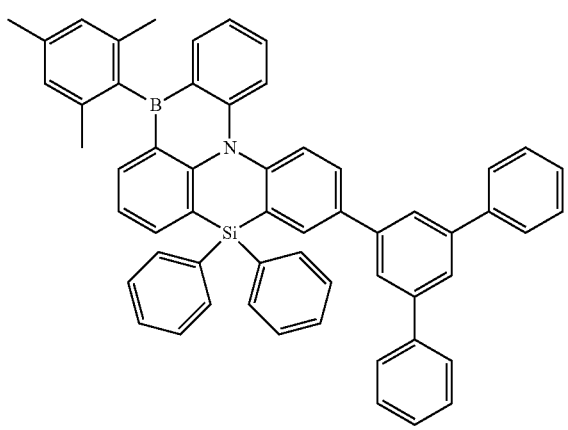
6
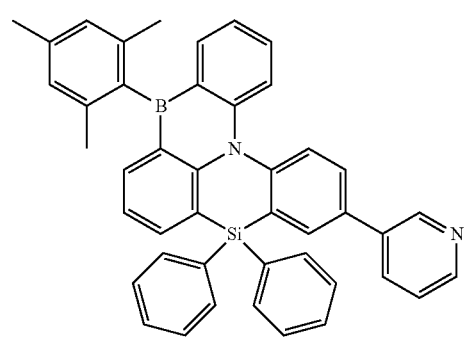
74
-continued
7
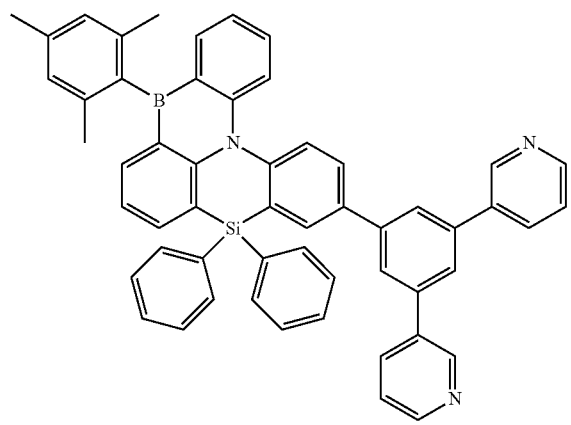
8
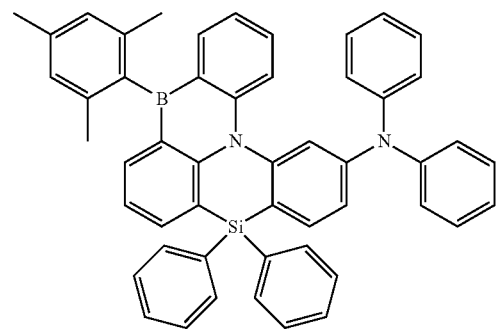
9
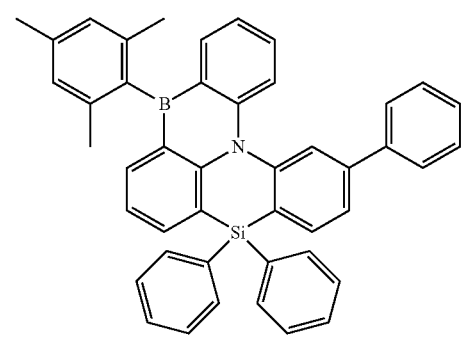
10
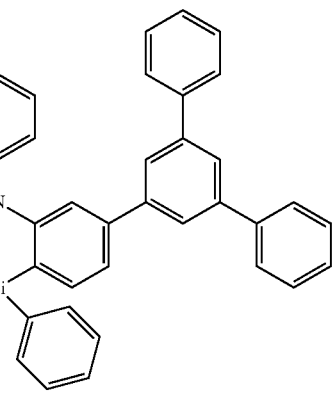

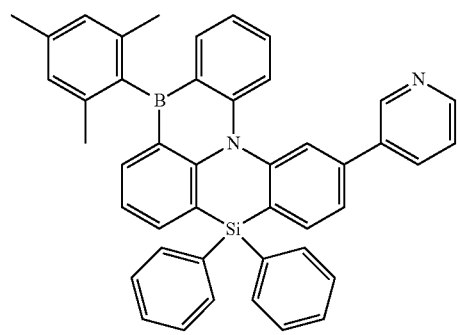
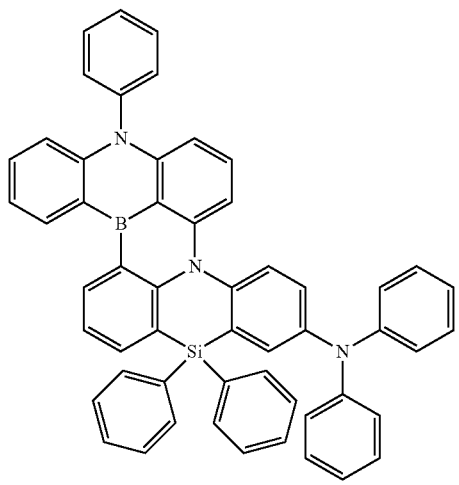
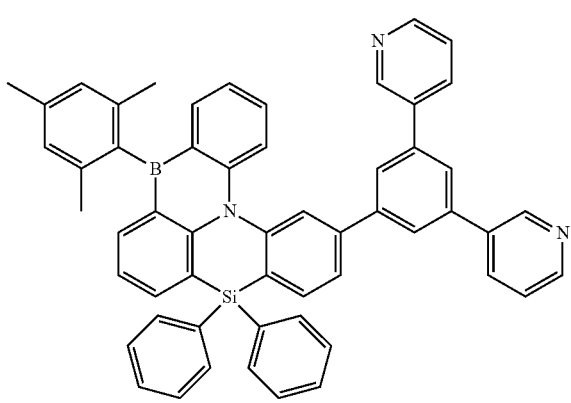
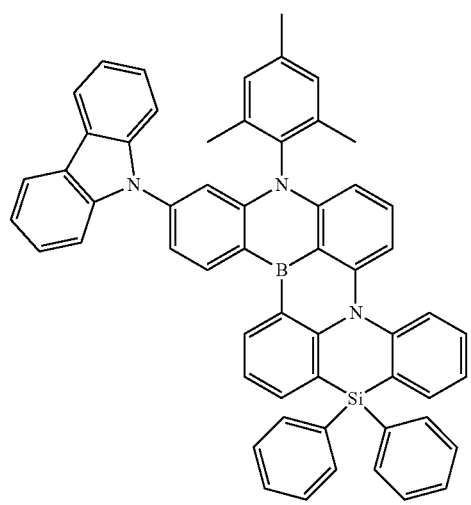
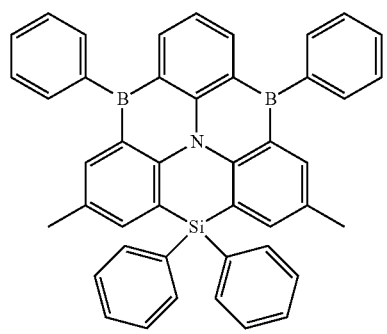
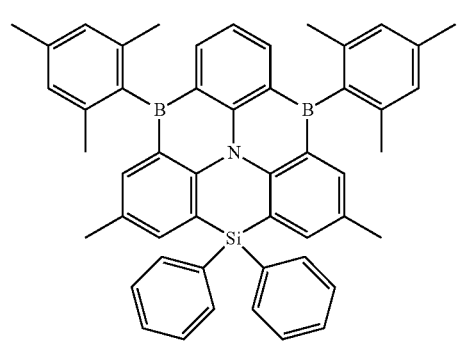
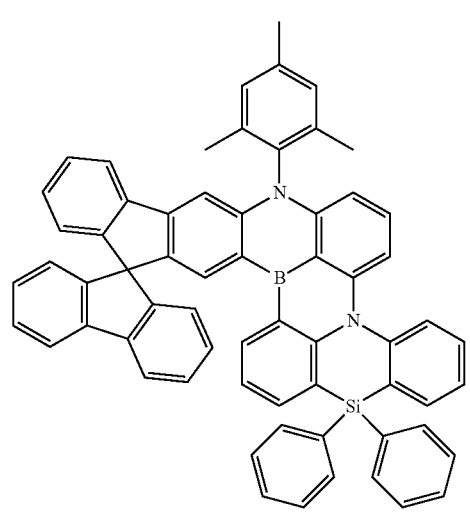

21
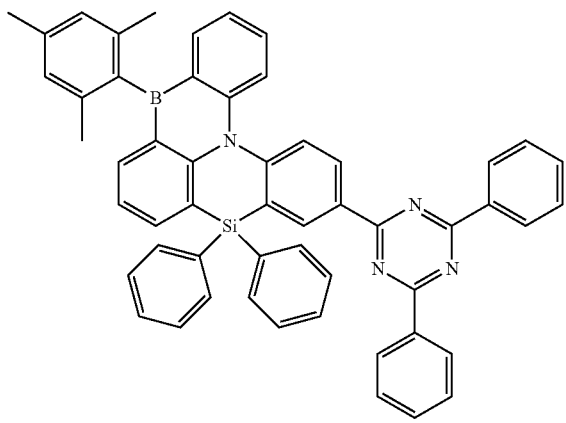
22
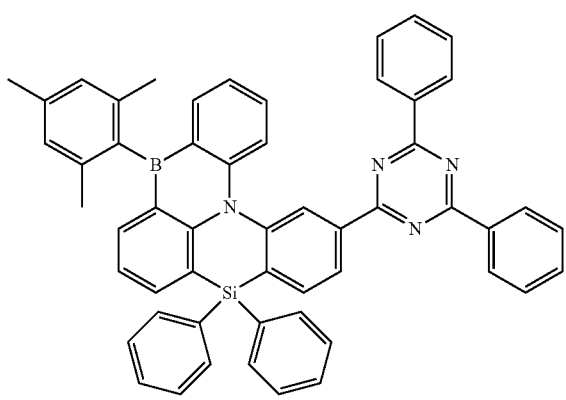
23
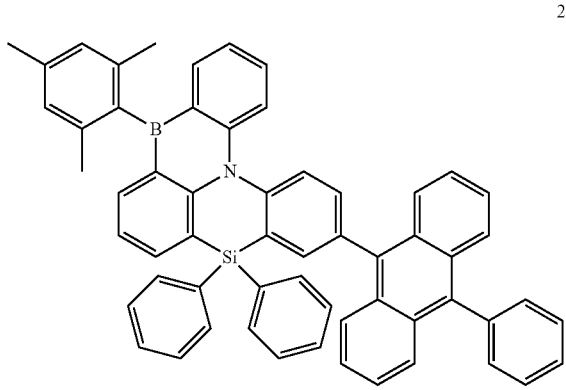
24
25
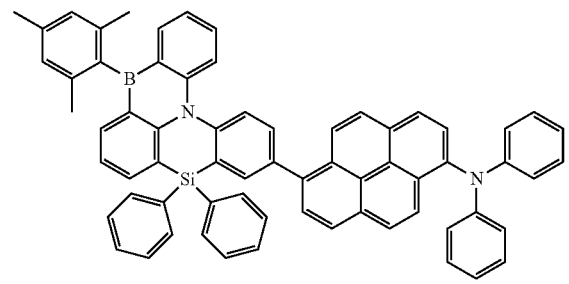
26
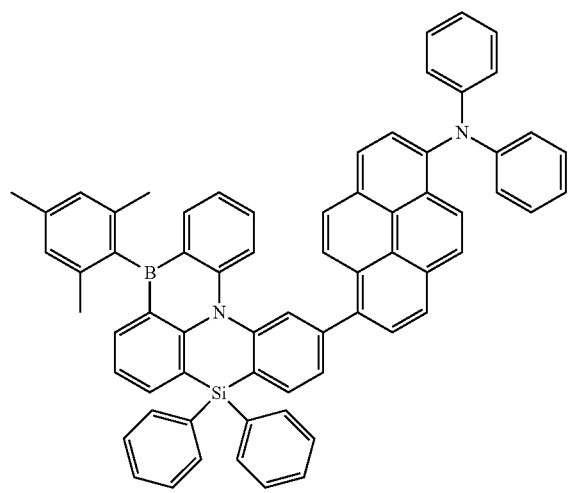
27
28
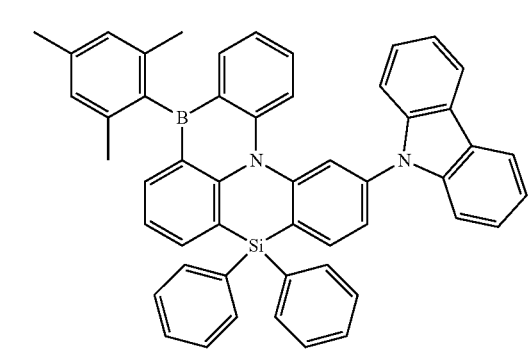

29
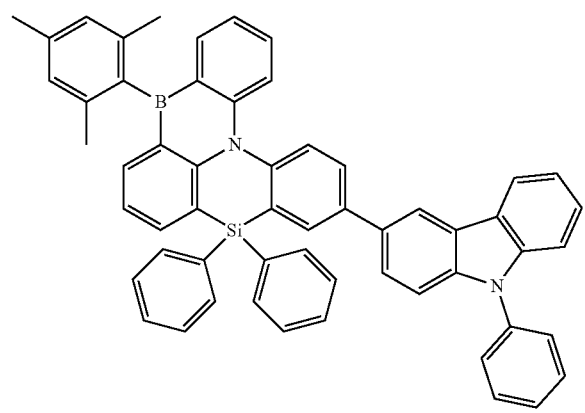
30
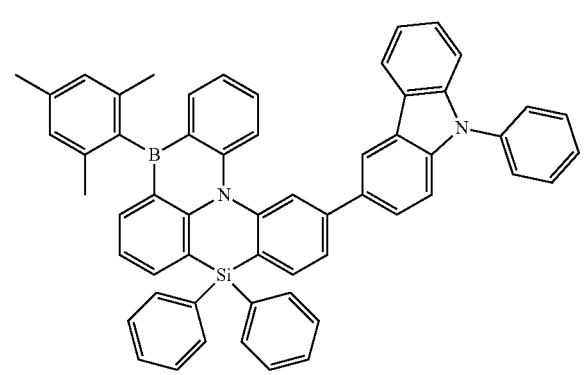
31
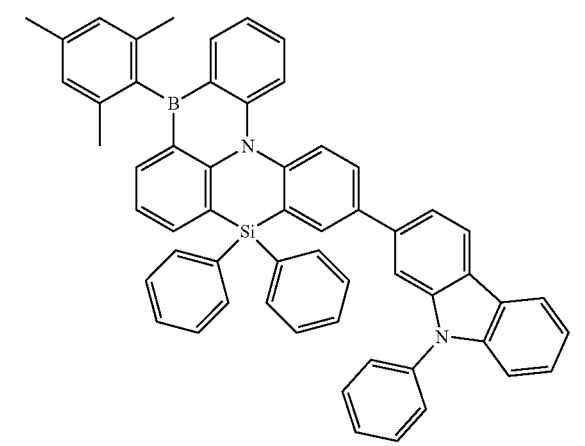
32
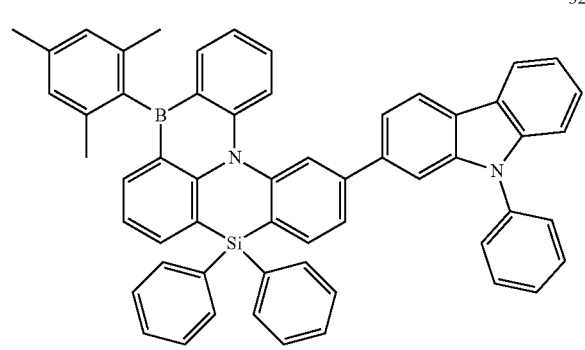
33
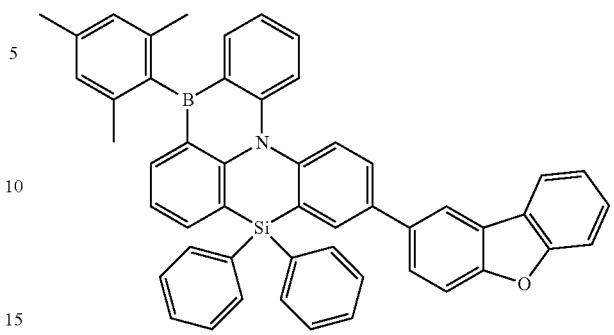
34
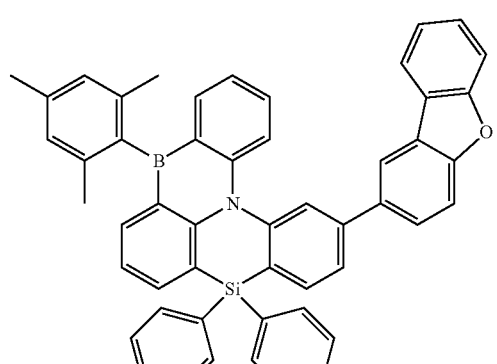
35
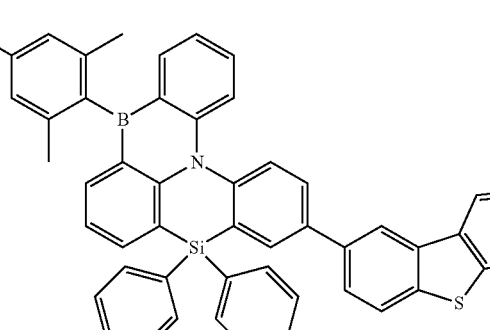
36
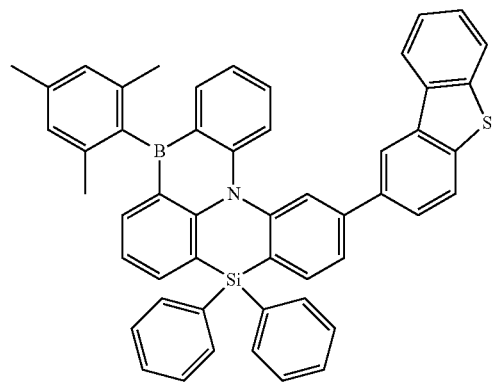

37
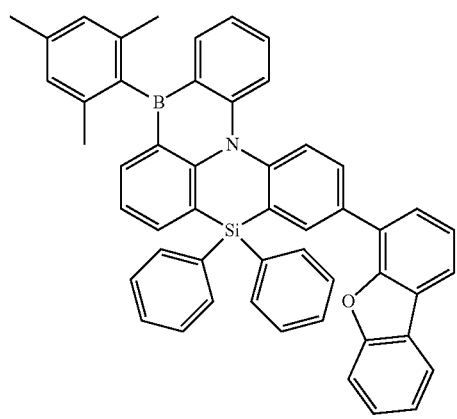
38
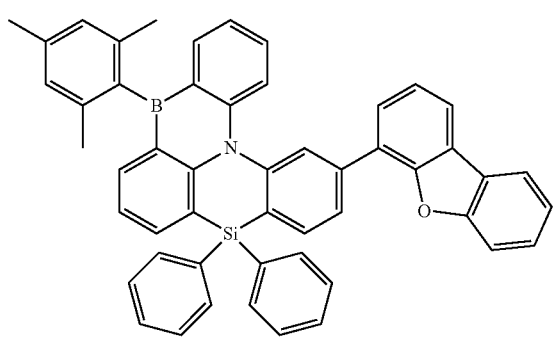
39
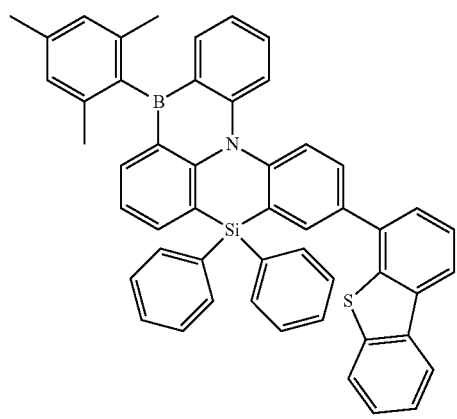
40
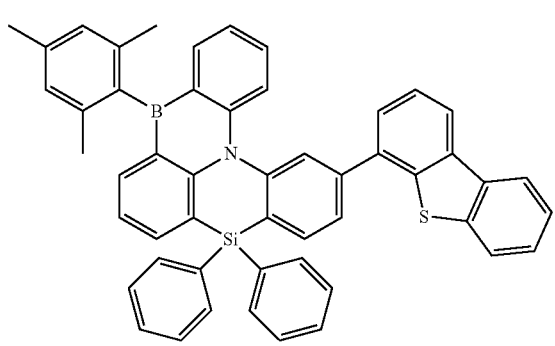
41
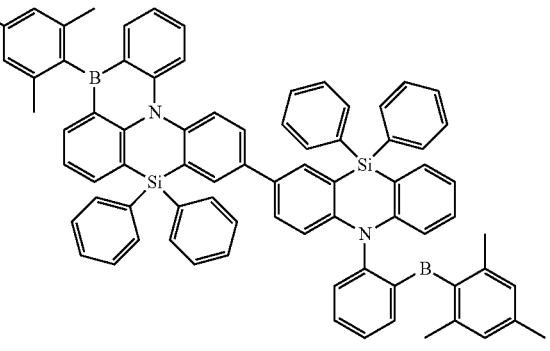
42
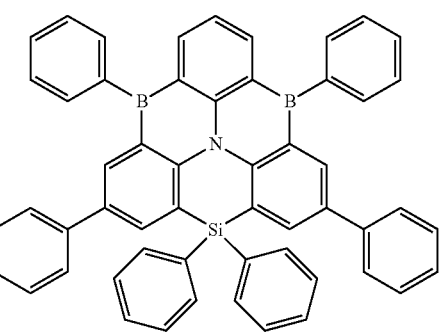
43
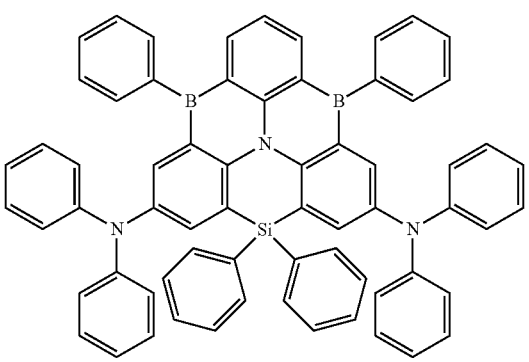
44
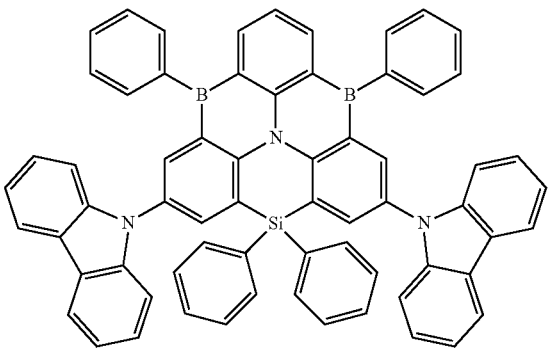

45
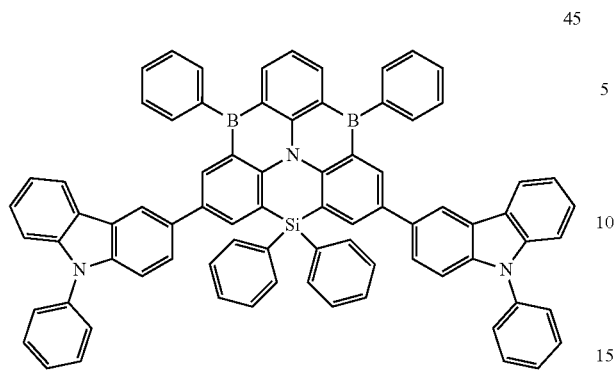
46
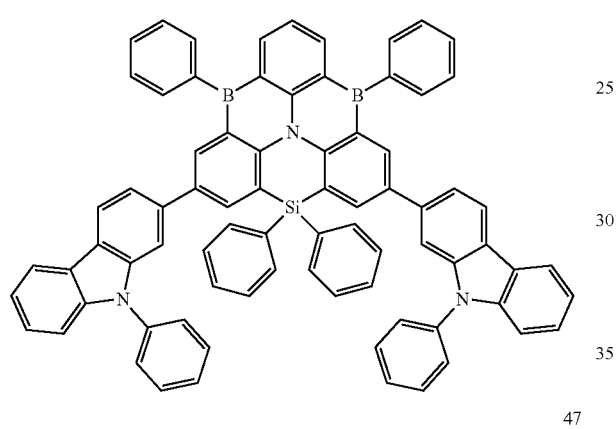
47
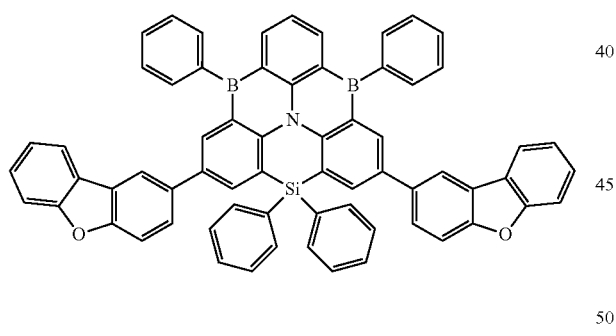
48
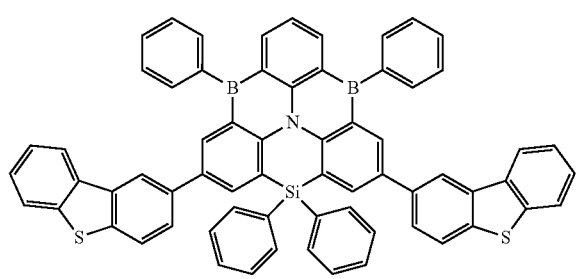
49
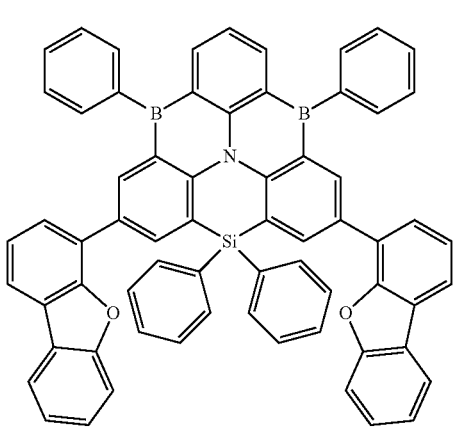
50
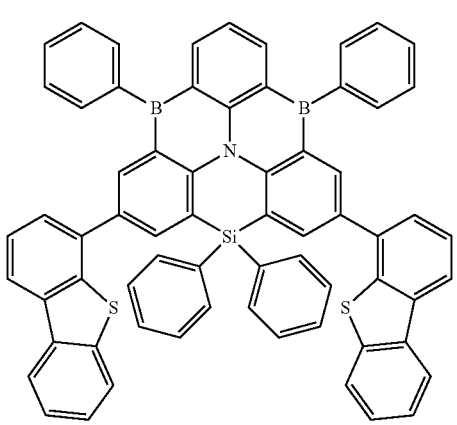
51
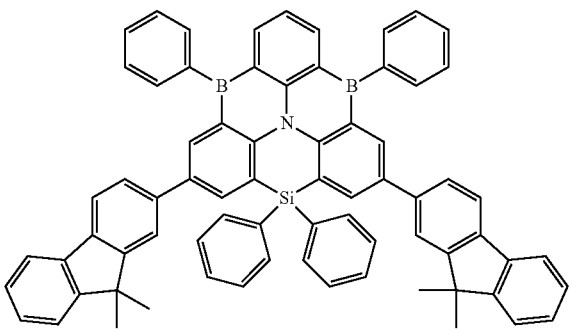
52
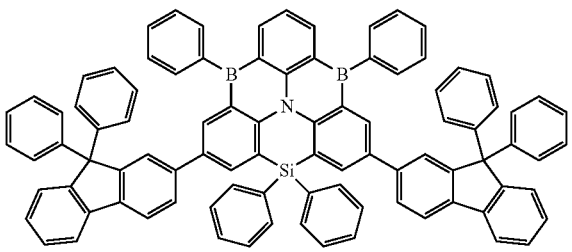

53
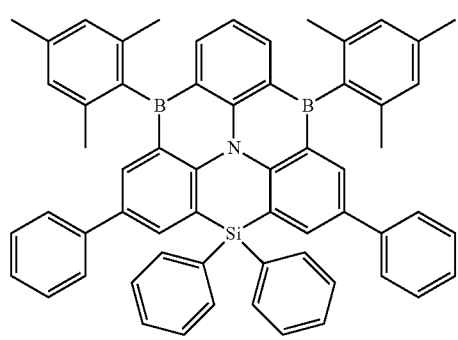
54
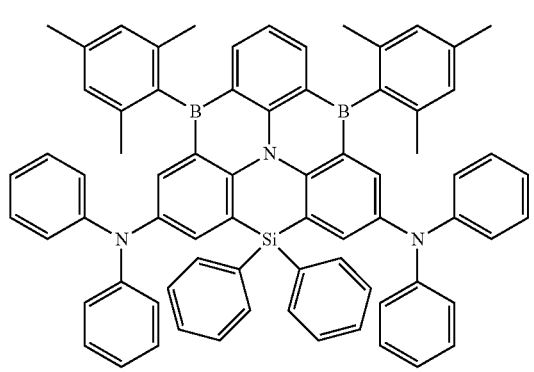
55
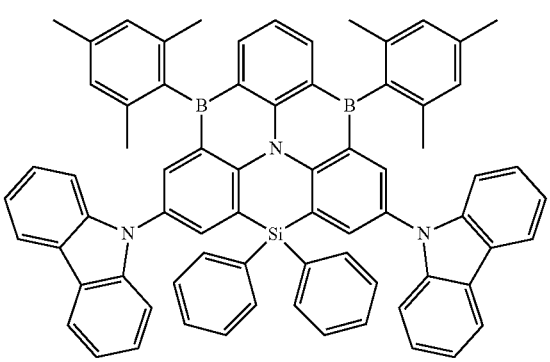
56
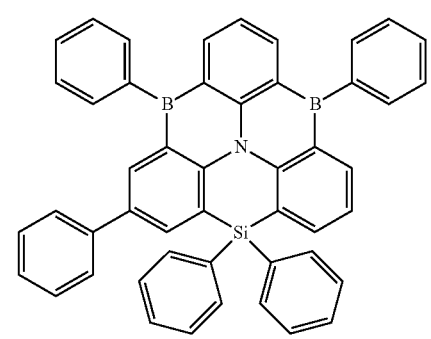
57
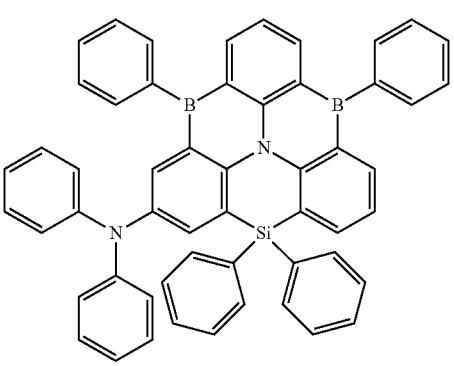
58
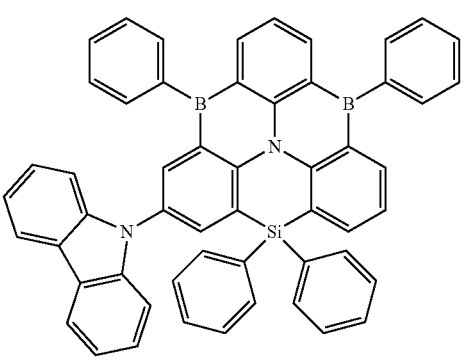
59
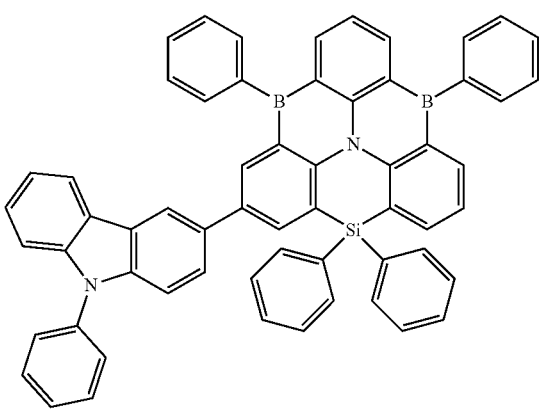
60
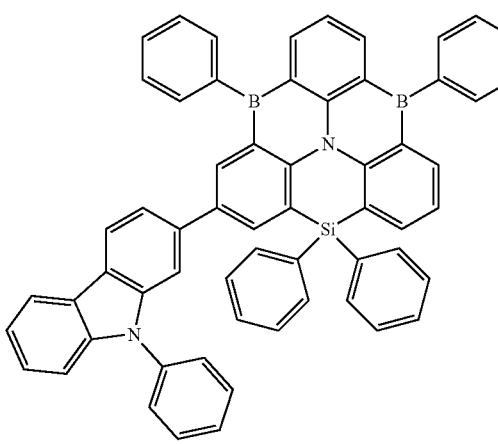

-continued
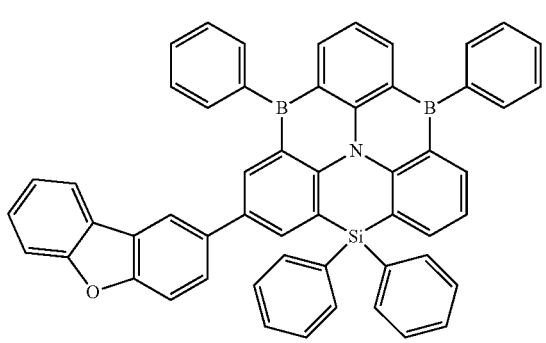
61
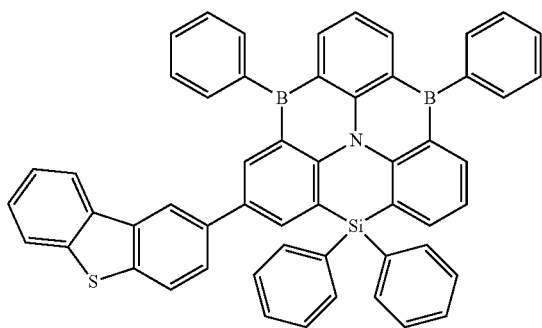
62
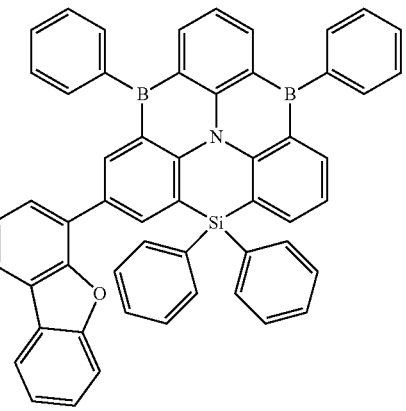
63
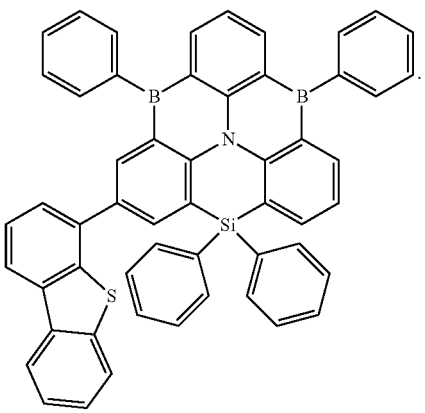
64
\* \* \* \* \*

UNITED STATES PATENT AND TRADEMARK OFFICE
CERTIFICATE OF CORRECTION

Page 1 of 4

PATENT NO. : 12,256,633 B2
APPLICATION NO. : 16/866785
DATED : March 18, 2025
INVENTOR(S) : Jang Yeol Baek et al.

It is certified that error appears in the above-identified patent and that said Letters Patent is hereby corrected as shown below:

In the Specification

In Column 1, Line 10, delete "10-2019-00651641," and insert -- 10-2019-0065164, --.

In the Claims

In Column 51, Lines 39-51, in Claim 7, Formula 1-1, delete

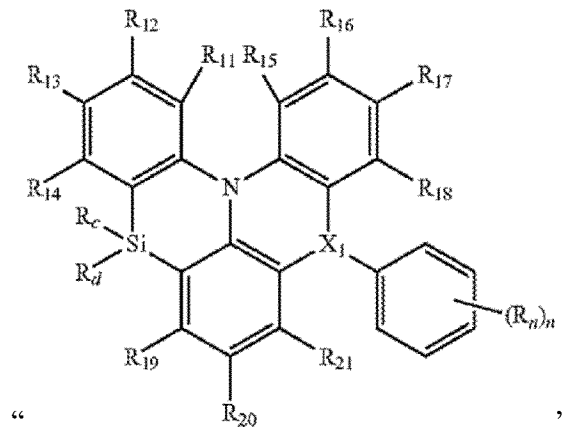

" and insert

Signed and Sealed this
Fifteenth Day of July, 2025

Coke Morgan Stewart
*Acting Director of the United States Patent and Trademark Office*

CERTIFICATE OF CORRECTION (continued)
U.S. Pat. No. 12,256,633 B2

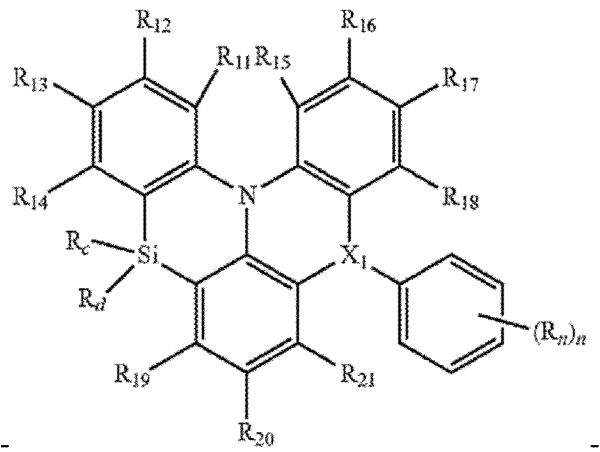

--

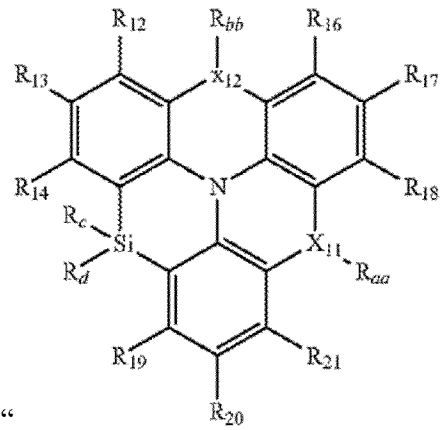

In Column 51, Lines 54-66, in Claim 7, Formula 1-2, delete " "

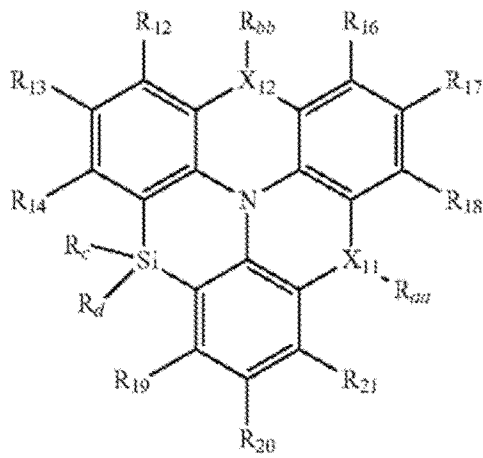

and insert -- --.

CERTIFICATE OF CORRECTION (continued)
U.S. Pat. No. 12,256,633 B2

In Columns 55, Line 7, in Claim 12, Compound 13, delete

" 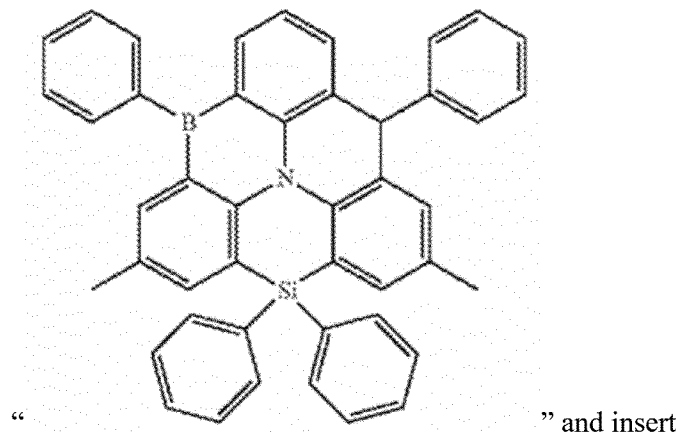 " and insert

-- 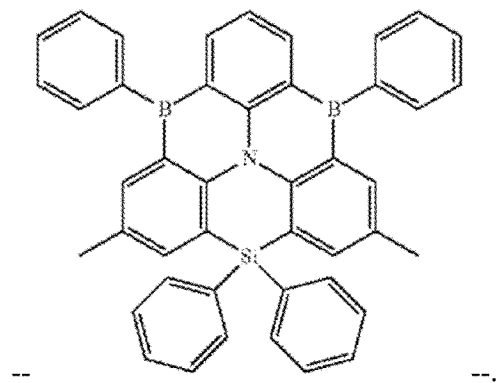 --.

In Columns 70, Lines 24-34, in Claim 13, Formula 1-3, delete

" 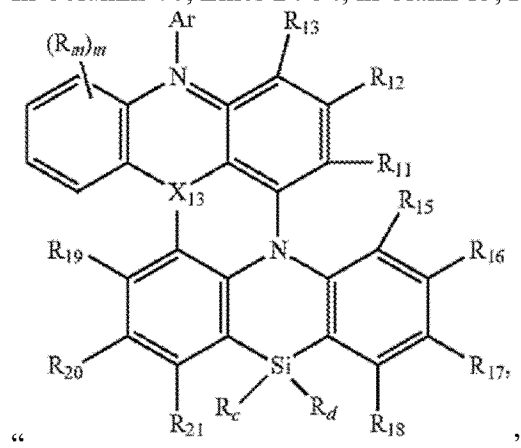 " and insert

CERTIFICATE OF CORRECTION (continued)
U.S. Pat. No. 12,256,633 B2

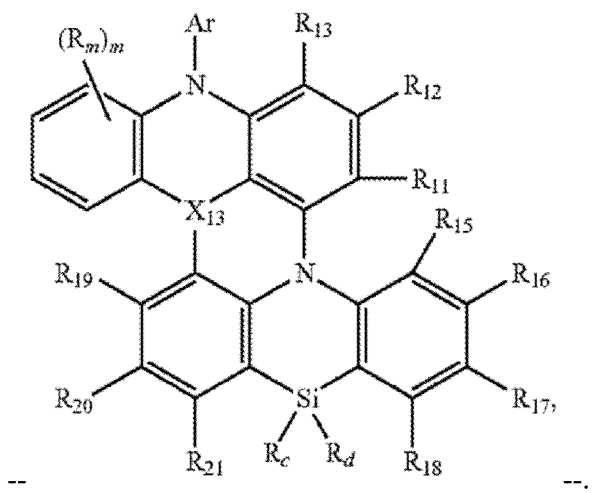

In Columns 71, Lines 28-40, in Claim 15, Formula 1-3, delete

" 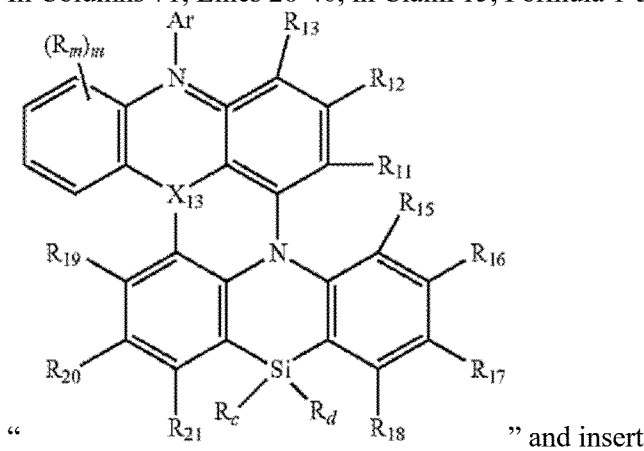 " and insert

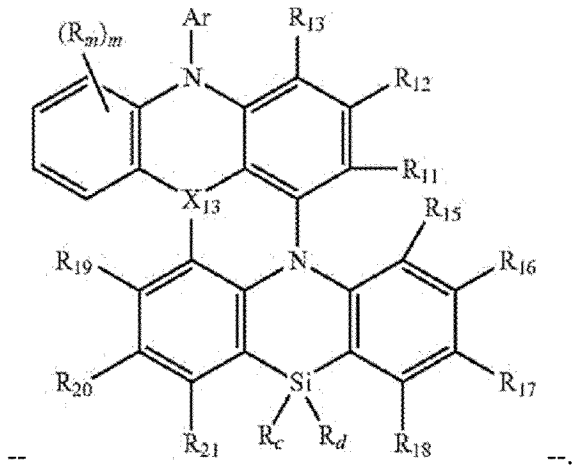

In Columns 72, Line 15, in Claim 16, delete "O." and insert -- 0. --.